(12) United States Patent
Mikado et al.

(10) Patent No.: US 8,093,502 B2
(45) Date of Patent: Jan. 10, 2012

(54) FLEX-RIGID WIRING BOARD AND MANUFACTURING METHOD THEREOF

(75) Inventors: Yukinobu Mikado, Gifu (JP); Katsumi Sagisaka, Gifu (JP); Katsuo Kawaguchi, Gifu (JP); Tetsuya Muraki, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 582 days.

(21) Appl. No.: 11/629,099

(22) PCT Filed: Jun. 9, 2005

(86) PCT No.: PCT/JP2005/010985
§ 371 (c)(1),
(2), (4) Date: Jan. 16, 2007

(87) PCT Pub. No.: WO2005/122656
PCT Pub. Date: Dec. 22, 2005

(65) Prior Publication Data
US 2008/0289859 A1    Nov. 27, 2008

(30) Foreign Application Priority Data

Jun. 10, 2004  (JP) .................................. 2004-172679

(51) Int. Cl.
*H05K 1/03* (2006.01)
(52) U.S. Cl. ........ 174/255; 174/254; 174/261; 174/262; 361/749; 361/751; 361/760; 29/829; 29/852; 428/447
(58) Field of Classification Search .................. 174/255, 174/250, 254, 261, 266, 262; 361/749, 751, 361/760; 29/840, 829, 852; 428/447
See application file for complete search history.

(56) References Cited

U.S. PATENT DOCUMENTS

| | | | |
|---|---|---|---|
| 4,716,259 A * | 12/1987 | Tokura et al. ................. | 174/254 |
| 4,728,349 A * | 3/1988 | Oshitari .......................... | 55/487 |
| 4,954,480 A | 9/1990 | Imanaka et al. | |
| 4,958,050 A * | 9/1990 | Oku et al. ..................... | 174/261 |

(Continued)

FOREIGN PATENT DOCUMENTS

CN    88102545 A    11/1988

(Continued)

*Primary Examiner* — Xiaoliang Chen
(74) *Attorney, Agent, or Firm* — Oblon, Spivak, McClelland, Maier & Neustadt, L.L.P.

(57) ABSTRACT

A flex-rigid printed wiring board is proposed which includes rigid substrates each formed from an insulative base material and a conductor circuit provided on the insulative base material, and a bendably flexible substrate formed from an insulative base material, conductor circuit provided on the insulative base material and a cover lay to cover the conductor circuit, the rigid and flexible substrates being connected to each other. As the insulative base material of the flexible substrate, there is adopted a bendable base material formed by impregnating a glass cloth with a resin and drying it. An conductor circuit is formed on one side of the flexible substrate while a dummy pattern is formed on the other side near a portion thereof where the flexible substrate is to be bent. Thus, the proposed flex-rigid printed wiring board is excellent in connection reliability, permitting to prevent the base material from being easily deformed near the bending portion, conductor circuit from being broken and the flexible substrate from being waved. The similar effect can also be attained with the wiring patterns of the conductor circuit on the flexible substrate being formed wide or curved in the width direction at the bending portion.

26 Claims, 14 Drawing Sheets

U.S. PATENT DOCUMENTS

| | | | | |
|---|---|---|---|---|
| 5,183,969 A * | 2/1993 | Odashima | | 174/88 R |
| 5,185,415 A * | 2/1993 | Kawabata et al. | | 526/265 |
| 5,398,163 A | 3/1995 | Sano | | |
| 5,427,641 A * | 6/1995 | Muramatsu et al. | | 156/252 |
| 5,428,190 A * | 6/1995 | Stopperan | | 174/261 |
| 5,468,575 A * | 11/1995 | Holland et al. | | 429/56 |
| 5,600,103 A | 2/1997 | Odaira et al. | | |
| 5,612,840 A * | 3/1997 | Hiraoka et al. | | 360/245.9 |
| 5,688,074 A * | 11/1997 | Schiwek | | 405/63 |
| 5,719,749 A | 2/1998 | Stopperan | | |
| 5,728,632 A * | 3/1998 | Sugie | | 442/43 |
| 5,742,370 A * | 4/1998 | Kim et al. | | 349/124 |
| 5,838,519 A | 11/1998 | Takizawa et al. | | |
| 5,886,858 A * | 3/1999 | Yanagihara | | 360/264.2 |
| 5,924,873 A | 7/1999 | Barcley et al. | | |
| 6,010,334 A * | 1/2000 | Mifune et al. | | 431/344 |
| 6,091,475 A * | 7/2000 | Ogino et al. | | 349/149 |
| 6,227,844 B1 * | 5/2001 | Mifune et al. | | 431/325 |
| 6,326,555 B1 | 12/2001 | McCormack et al. | | |
| 6,329,610 B1 | 12/2001 | Takubo et al. | | |
| 6,350,365 B1 | 2/2002 | Koyama et al. | | |
| 6,353,189 B1 * | 3/2002 | Shimada et al. | | 174/255 |
| 6,395,993 B1 | 5/2002 | Nakamura et al. | | |
| 6,449,836 B1 | 9/2002 | Miyake et al. | | |
| 6,570,098 B2 | 5/2003 | Shimizu et al. | | |
| 6,703,566 B1 | 3/2004 | Shiraishi et al. | | |
| 6,759,600 B2 | 7/2004 | Koyama et al. | | |
| 6,774,968 B2 * | 8/2004 | Hagiwara | | 349/139 |
| 6,832,860 B2 * | 12/2004 | Yoon et al. | | 385/88 |
| 6,859,053 B1 * | 2/2005 | Sato et al. | | 324/754 |
| 6,888,606 B2 * | 5/2005 | Hinata et al. | | 349/149 |
| 6,911,605 B2 * | 6/2005 | Okada et al. | | 174/256 |
| 6,981,317 B1 * | 1/2006 | Nishida | | 29/840 |
| 7,088,417 B2 * | 8/2006 | Kamijima et al. | | 349/152 |
| 7,378,596 B2 | 5/2008 | Kawaguchi et al. | | |
| 7,415,761 B2 * | 8/2008 | Hirose et al. | | 29/852 |
| 2002/0024302 A1 | 2/2002 | Wu et al. | | |
| 2002/0106521 A1* | 8/2002 | Hashimoto et al. | | 428/447 |
| 2003/0111742 A1* | 6/2003 | Iwasaki et al. | | 257/787 |
| 2003/0116345 A1 | 6/2003 | Shimzu et al. | | |
| 2003/0142946 A1* | 7/2003 | Saito et al. | | 385/137 |
| 2003/0222260 A1* | 12/2003 | Tone et al. | | 257/48 |
| 2004/0174487 A1* | 9/2004 | Yamazaki et al. | | 349/150 |
| 2005/0161250 A1* | 7/2005 | Hiramoto | | 174/250 |
| 2005/0243528 A1* | 11/2005 | Murayama | | 361/760 |
| 2006/0169485 A1* | 8/2006 | Kawaguchi et al. | | 174/254 |
| 2006/0180344 A1* | 8/2006 | Ito et al. | | 174/262 |
| 2007/0012475 A1* | 1/2007 | Kawaguchi et al. | | 174/255 |

FOREIGN PATENT DOCUMENTS

| | | |
|---|---|---|
| CN | 1287285 A | 3/2001 |
| CN | 1325262 A | 12/2001 |
| CN | 1325262 A | 12/2001 |
| CN | 1426858 A | 7/2003 |
| DE | 100 37 183 A1 | 2/2001 |
| EP | 0 632 683 A2 | 1/1995 |
| EP | 0823833 | 2/1998 |
| JP | 59-03567 | 1/1984 |
| JP | 59 145058 | 9/1984 |
| JP | 60-124056 | 8/1985 |
| JP | 03-161996 | 7/1991 |
| JP | 3-109368 | 11/1991 |
| JP | 5 90756 | 4/1993 |
| JP | 5-41171 | 6/1993 |
| JP | 05-226801 | 9/1993 |
| JP | 05-275130 | 10/1993 |
| JP | 6 45364 | 6/1994 |
| JP | 6-314862 | 11/1994 |
| JP | 7-38222 | 2/1995 |
| JP | 07-092920 | 4/1995 |
| JP | 7-106728 | 4/1995 |
| JP | 7-170076 | 7/1995 |
| JP | 7-183663 | 7/1995 |
| JP | 8 125342 | 5/1996 |
| JP | 8-335759 | 12/1996 |
| JP | 10-200256 | 7/1998 |
| JP | 10-256688 | 9/1998 |
| JP | 11-54927 | 2/1999 |
| JP | 2000-133944 | 5/2000 |
| JP | 2001-77501 | 3/2001 |
| JP | 2001-102734 | 4/2001 |
| JP | 2001-111209 | 4/2001 |
| JP | 2001-251053 | 9/2001 |
| JP | 2001 267695 | 9/2001 |
| JP | 2001 284747 | 10/2001 |
| JP | 2001 339126 | 12/2001 |
| JP | 2002-064271 | 2/2002 |
| JP | 2003-110240 | 4/2003 |
| JP | 2003-200236 | 7/2003 |
| JP | 2003 238709 | 8/2003 |
| JP | 2004-63908 | 2/2004 |
| JP | 2004-140384 | 5/2004 |
| WO | WO 2004/093508 A1 | 10/2004 |

* cited by examiner

Flex-rigid Wiring Board
Rigid Substrate  Conductor Circuit Pattern  Rigid Substrate
Flexible Substrate  Bending Portion Conductor Circuit Patern
Dummy Pattern (Solid)

Conductor Circuit Pattern
Dummy Pattern
Rigid Substrate  Bending Portion

Fig.3(a)  Rectangular Openings
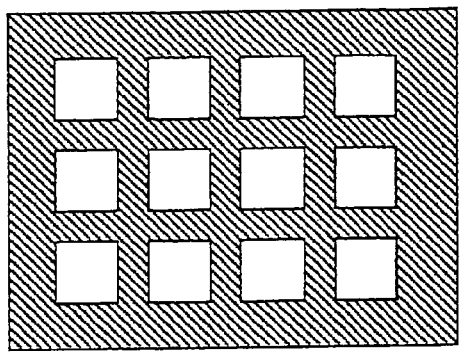
Fig.3(b)  Circular Openings
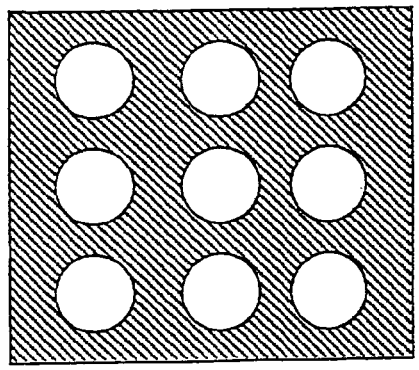
Fig.3(c)  Recrtangular Openings Rounded at the Angular Corners
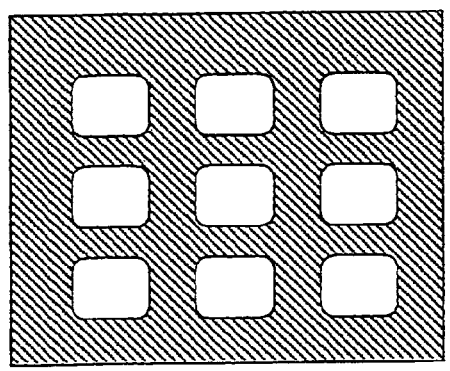
Fig.3(d)  Staggered Rectangular Openings
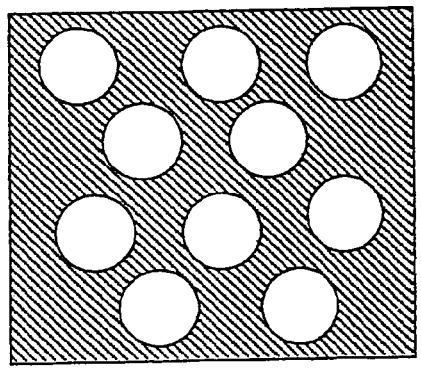
Fig.3(e)  Combinations of a Large and Small Circular Openings
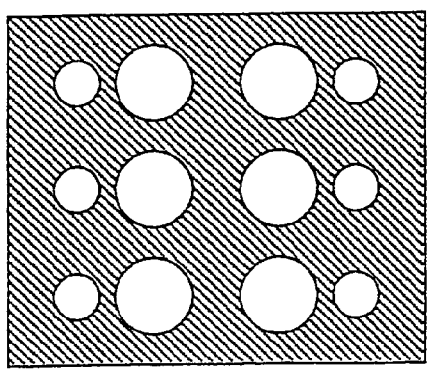

Fig.9(a) Curved Pattern
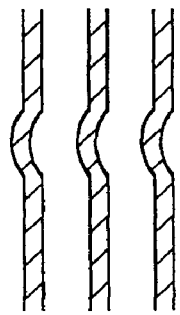
Fig.9(b) Extended Pattern (1)
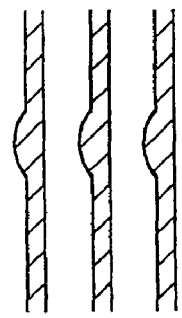
Fig.9(c) Extended Pattern (2)
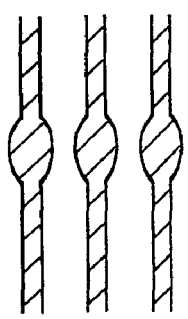
Fig.9(d) Extended Pattern (3)
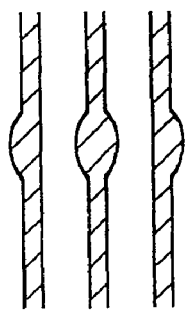
Fig.10(a)
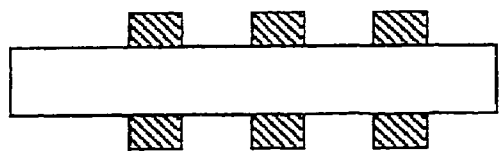
Fig.10(b)
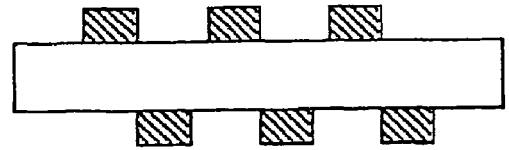

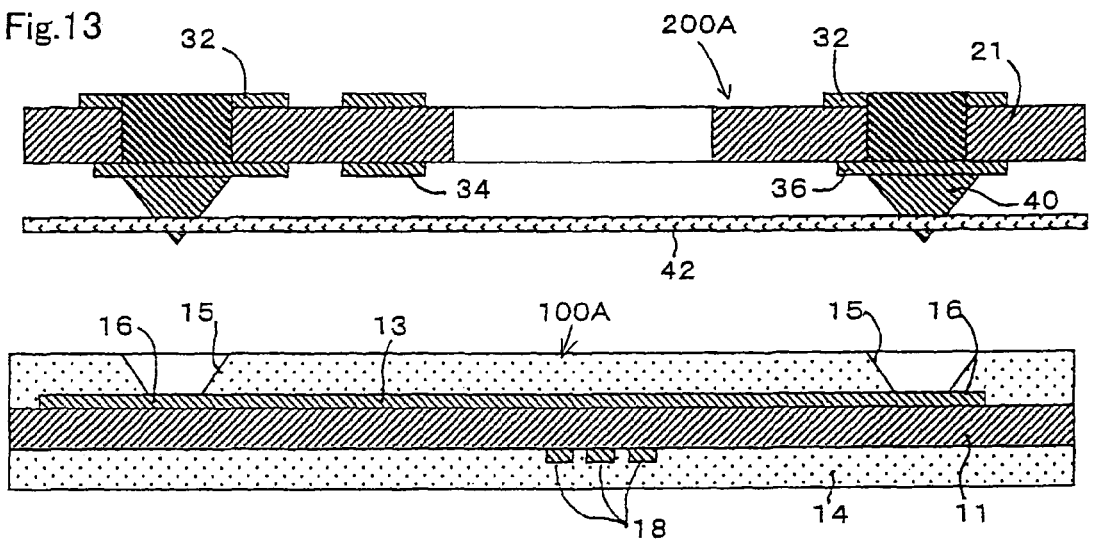
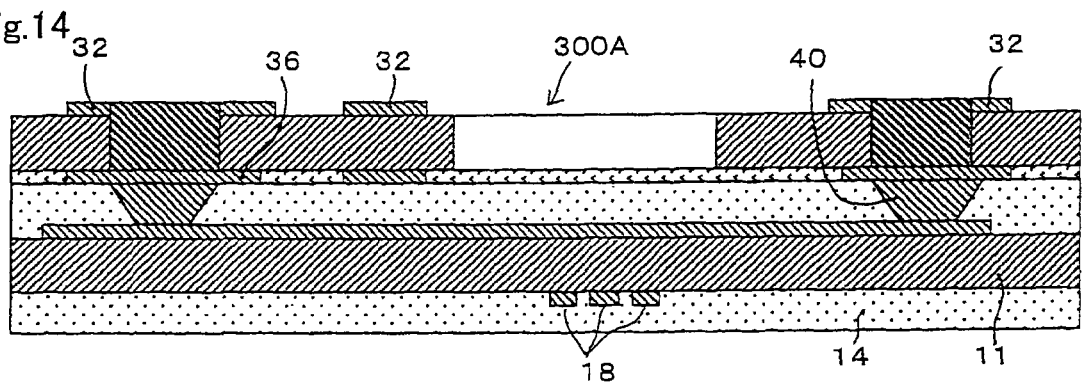

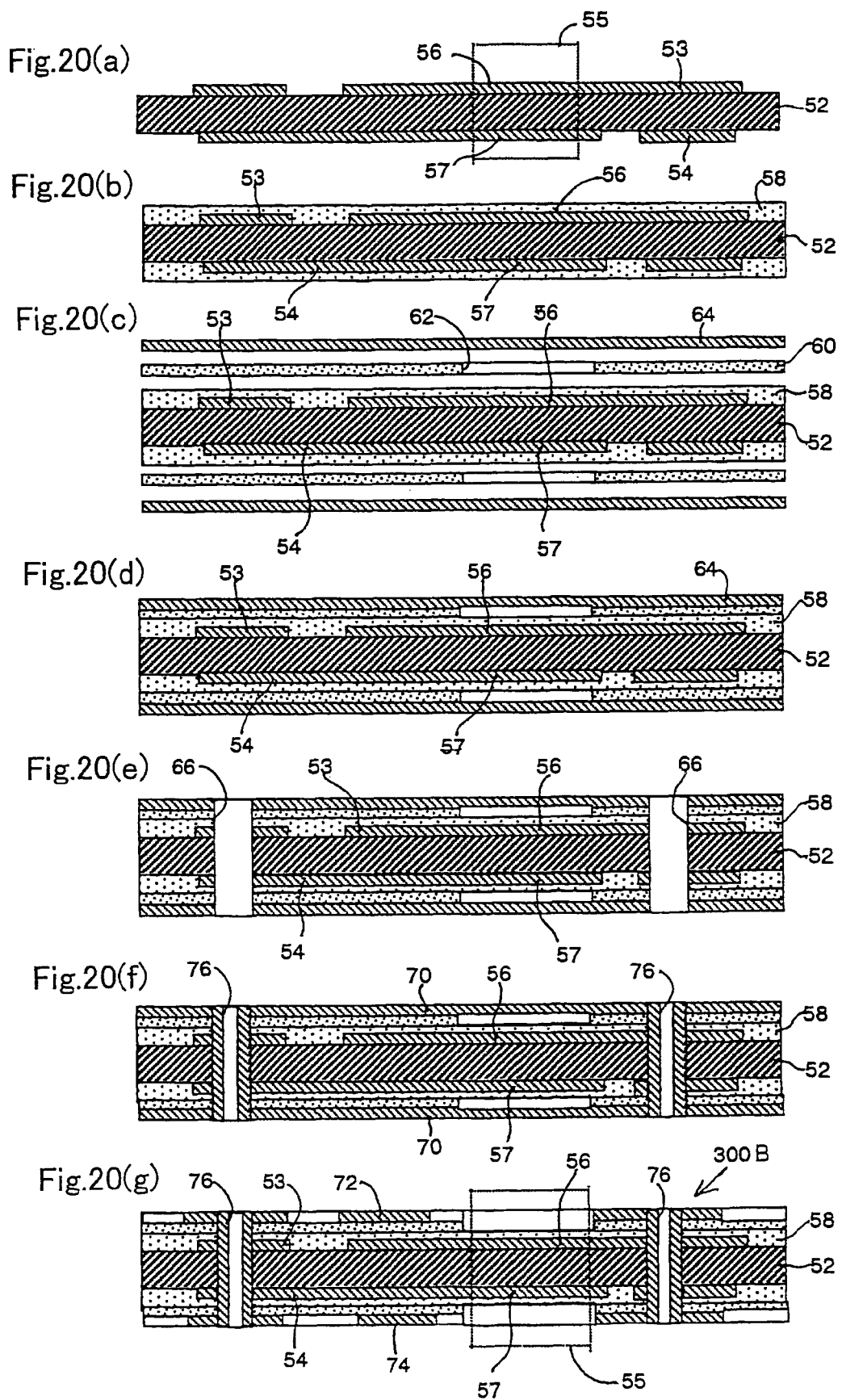

FLEX-RIGID WIRING BOARD AND MANUFACTURING METHOD THEREOF

FIELD OF THE INVENTION

The present invention relates to a flex-rigid printed wiring board formed from a bendably flexible substrate and rigid substrates, and to a manufacturing method for the flex-rigid printed wiring board.

BACKGROUND ART

The recent portable electronic devices such as a folding-type mobile phone and the like use a flex-rigid multilayer wiring board. FIG. 22 shows an example of such a conventional wiring board, in which inflexible rigid portions 500 and 520 are connected to a flexible portion 510 via a flexible substrate 544. Normally in the rigid portion 500, the flexible substrate 544 and pattern layers 504 and 506 on the surfaces of the rigid portions 500 and 520 are electrically connected to each other via a conductive layer in a plated through-hole 502 (cf. Japanese Patent Application Laid Open No. 90756 of 1993).

The conventional flex-rigid multilayer wiring board according to the invention disclosed in the Japanese Patent Application Laid Open No. 90756 of 1993 is manufactured by stacking a flexible substrate formed from a highly bendable base material such as polyimide resin film onto a rigid substrate formed from a rigid base material such as glass polyimide resin and having a circuit formed thereon with a prepreg, adhesive sheet or the like being inserted between them; stacking another such rigid substrate onto the flexible substrate with another such prepreg or adhesive sheet being inserted between them, joining them to one another by thermo compression bonding; and then subjecting a stack thus formed to many processes such as drilling, through-hole plating, resist coating and etching.

Since the flexible substrate should be freely bendable, so it uses no reinforcing material such as paper, glass fiber or the like used in the rigid substrate but it is formed from a substrate material including a highly bendable thin base film of polyimide resin, polyester resin or the like as an insulative material and a flexible copper foil attached to the base film.

When used singly, the polyimide film forming the base film can resist a temperature of 400° C. or more and also a soldering temperature of 250° C. or more satisfactorily during mounting of parts. In addition, it keeps a stable performance even if the environment varies after the printed wiring board using the polyimide film is actually assembled in an electronic apparatus. Therefore, the polyimide film is used in overwhelmingly more cases than the polyester film.

Also, the coverlay to protect a conductor circuit formed by etching a flexible copper foil attached to the base film uses an adhesive-coated polyimide film in many cases because of its flexibility.

The current social need is that the portable electronic devices should be higher in functionality and packaging density of parts. To meet this need, it has been demanded that the parts installed in the electronic devices should be designed smaller and correspondingly the wiring width of the circuit board on which such parts are to be mounted should be reduced more.

Especially, it is demanded that the wiring patterns formed on the flexible substrate included in a bendable flex-rigid printed wiring board should be finer and denser (the number of wires per unit area should be increased).

However, the polyimide film used as insulative base material in the flexible substrate is highly water-absorbing and largely varies in dimension. Because of these properties of the polyimide film, the land should be preformed large in size and the workpiece be formed small for an improved accuracy of alignment. Therefore, the polyimide film could not assure any high connection reliability and could not show good results in the thermo cycle test or similar reliability test.

Also, the film used as the insulative base material in the flexible substrate above is just a film formed from the polyimide resin, not any film formed from a core having the polyimide resin impregnated in the core. Therefore, the polyimide film is disadvantageous in the following:

(1) It has no sufficient strength;

(2) Bending cannot be made with a constant radius of curvature; and (3) Because of the problems (1) and (2) above, the flexible substrate is easily deformed around a portion thereof where it is to be bent or the conductor circuit is broken. Especially, in case the flexible substrate is repeatedly bent or the conductor circuit is formed from fine wiring patterns, the above problems will be noticeably serious.

Also, a waving will possibly take place at the bending portion of the flexible substrate and near an area where the rigid portion is formed. When the waving is formed, it will possibly result in cracking at a portion of the substrate where the waving has taken place or in breakage of the conductor circuit.

Further, forming of a cover lay to protect a conductor circuit provided on the flexible substrate from an adhesive-coated polyimide film will lead to deterioration of the connection reliability and insulation reliability of the through-hole. Therefore, drilling, desmearing, plating and the like should be effected under specially managed conditions, and combination of the flexible substrate with any other material will be limited.

Accordingly, the present invention has an object to overcome the above-mentioned drawbacks of the related art by providing a flex-rigid printed wiring board that can be bent largely while keeping a sufficient, constant strength at a portion thereof where it is to be bent, and a manufacturing method for the flex-rigid printed wiring board.

Also, the present invention has another object to provide a flex-rigid printed wiring board excellent in connection reliability and in which it is possible to prevent deformation of a flexible substrate at a portion where the substrate is to be bent, breakage or waving of a conductor circuit and a manufacturing method for the flex-rigid printed wiring board.

DISCLOSURE OF THE INVENTION

Findings the inventors of the present invention had through many researches to attain the aforementioned objects are as follows. A flexible substrate has an increased rigidity and varies less in dimension when it is formed from a bendable composite material not a film of polyimide resin as in the conventional flexible substrate but produced by impregnating a glass cloth with a resin and drying it, especially, a bendable composite material produced by impregnating a glass cloth with epoxy resin and drying it; and providing a conductor circuit on one side of such a substrate and a dummy pattern on the other side near a portion where the substrate is to be bent (will also be referred to as "bending portion" hereunder wherever appropriate) permits to easily bend the flexible substrate at the bending portion largely with a constant radius of curvature.

A further finding is as follows. With a conductor circuit provided on one side of a bendable composite material formed by impregnating a glass cloth with epoxy resin and drying it and a portion of each of wiring patterns forming the conductor circuit, that corresponds to a bending portion of such a substrate, being swollen to increase the wiring pattern width locally or curve the wiring patterns, the flexible substrate can easily be bent at the bending portion largely with a constant radius of curvature.

That is, the present invention was worked out based on the above findings.

(1) According to an embodiment of the present invention, there is provided a flex-rigid printed wiring board including rigid substrates each formed from an insulative base material and a conductor circuit provided on the insulative base material, and a bendably flexible substrate formed from an insulative base material, conductor circuit provided on the insulative base material and a cover lay to cover the conductor circuit, the rigid and flexible substrates being connected to each other, wherein the insulative base material of the flexible substrate is a bendable base material produced by impregnating a glass cloth with a resin and drying it; and the flexible substrate has the conductor circuit formed on one side thereof and a dummy pattern on the other side near a portion thereof where it is to be bent.

The "dummy pattern" in the above flex-rigid printed wiring board (1) as an embodiment of the present invention is a conductive or insulative layer formed on a side of the flexible substrate where the conductor circuit is formed and which is not intended for making any electrical connection. If is formed in an area mainly around a portion of the flexible substrate which is to be bent (namely, a bending portion).

The above-mentioned dummy pattern should preferably be a conductive or insulative layer having provided therein openings formed in a same shape or in different shapes and disposed regularly in a direction in which they intersect the linear patterns of at least the conductor circuit. The combination of the openings and linear patterns will be referred to as "lattice pattern" hereunder wherever appropriate.

The openings included in the lattice pattern may be formed to have three, four, five or more angular corners, have rounded angular corners, have a circular, elliptic or other curved form or have an angular shape and curved form in combination. In this embodiment of the present invention, however, the openings should preferably be circular or quadrangular.

Also, the openings of the lattice pattern may be formed to have the same shape and same area or to have different shapes and different areas in combination.

Also, the distances (pitches) from one to another of the plurality of openings included in the lattice pattern may be fixed or not, and the sizes and pitches of the openings near the bending portion may be different from those of the openings at other portion.

Each of the openings in the lattice pattern should desirably have an area of 10,000 to 200,000 $\mu m^2$. If the area is smaller than 10,000 $\mu m^2$, the flexible portion itself will be excessively strong so that it will have such a flexibility as will not permit to easily bend at the bending portion, and a stress developed in a reliability test such as the thermo cycle test will so easily be transmitted through the flexible portion as not to be buffered, resulting in a damage to the base material and conductor circuit. On the other hand, if the area exceeds 200,000 $\mu m^2$, the base material will be waved at the bending portion, so that the conductor circuit will be displaced and it will be difficult to easily bend the flexible substrate at the bending portion largely with a constant radius of curvature.

Also, the ratio between the sum of the areas of the openings in the lattice pattern and the area of the rest of the lattice pattern should preferably be within a range of 1:9 to 9:1. If the ratio is smaller than 1:9, the flexible portion itself will be excessively strong so that it will have such a flexibility as will not permit to easily bend the bending portion, a stress developed in a reliability test such as the thermo cycle test will so easily be transmitted through the flexible portion as not to be buffered, resulting in a damage to the base material and conductor circuit. On the other hand, if the ratio exceeds 9:1, the base material will be waved at the bending portion, so that the conductor circuit will be displaced and it be difficult to easily bend the flexible substrate at the bending portion largely with a constant radius of curvature.

The ratio between the sum of the areas of the openings in the lattice pattern and the area of the rest of the lattice pattern should more preferably be within a range of 2:8 to 8:2. As long as the ratio is within this range, even if it varies a little, the above problem will not take place in the reliability test such as the thermo cycle test, the base material will not be waved at the bending portion. Thus, the flexible substrate can be bent at the bending portion largely with a constant radius of curvature.

Also, the ratio between the sum of the areas of the openings in the lattice pattern and the area of the rest of the lattice pattern should more preferably be within a range of 9:10 to 11:10. As long as the ratio is within this range, even if it varies a little and a variation in uniformity takes place in the flexible substrate from one portion to another, the flexible substrate will positively withstand the conditions of the reliability test. Thus, the flexible substrate can uniformly be bent at the bending portion thereof largely with a constant radius of curvature.

Each of the openings in the lattice pattern should more preferably have an area of 10,000 to 126,000 $\mu m^2$ and the ratio between the sum of the areas of the openings and the area of the rest of the lattice pattern in which no such openings are formed more preferably be within the range of 1:9 to 9:1. As long as the area and ratio are included within these respective ranges, the flexible portion can be bent at the bending portion thereof with a constant radius of curvature, irrespectively of the shape of the openings. Also, since the electrical connection can be prevented from being poor due to a displacement of the conductor circuit and the stress developed when the flexible substrate is subjected to a reliability test such as thermo cycle test is buffered, the reliability of the flexible substrate can considerably be improved with no damage given to the base material and conductor circuit.

Also, each of the openings in the lattice pattern should more preferably have an area of 10,000 to 126,000 $\mu m^2$ and the ratio between the sum of the areas of the openings and the area of the rest of the lattice pattern in which no such openings are formed more preferably be within the range of 9:10 to 11:10. As long as the area and ratio are included within these respective ranges, the flexible substrate will not be influenced by any variations in size and shape of the openings and variation in uniformity of the material from one portion to another and the reliability can be improved.

In this embodiment of the present invention, the dummy pattern should desirably be a pattern extending in a direction in which it intersects the linear patterns of the conductor circuit. The dummy pattern should desirably be disposed near the bending portion of the flexible substrate and formed from at least three linear patterns of which the width is more than 150 $\mu m$. In case the dummy pattern is formed from more than three linear patterns, the flexible substrate can be bent at the bending portion thereof largely with a constant radius of curvature. If the linear-pattern width is less than 150 μm, the flexible substrate cannot possibly be bent at the bending portion with a constant radius of curvature.

Also, the distance between the linear patterns extending in the direction in which they will intersect those of the conductor circuit should preferably be more than 30 μm. In this case, the linear patterns extending along the bending portion of the flexible substrate can be disposed side by side. If the distance between the pattern lines is less than 30 μm, the linear patterns expending along the bending portion will overlap each other in some cases. In this case, waving will take place in a part of the bending portion, so that the linear patterns of the conductor circuit will possibly be broken, leading to a deteriorated connection reliability.

Also, the thickness of the linear patterns extending in the direction in which they will intersect those of the conductor circuit should preferably equal to, or larger than, that of the linear patterns of the conductor circuit. In case the linear patterns are thinner than those of the conductor circuit, the flexible substrate will be bent with a smaller radius of curvature as the case may be. Also, frequent bending of the flexible substrate will possibly lead to breakage of the wiring patterns of the conductor circuit.

Also, the linear patterns extending in the direction in which they will intersect those of the conductor circuit should desirably have a trapezoidal sectional shape. In case the sectional shape of the linear patterns extending in the direction in which they will intersect those of the conductor circuit is trapezoidal, pattern portions resulted when the dummy pattern is bent will not overlap each other. So, no step will occur at the bending portion and the linear patterns of the conductor circuit will be prevented from being broken.

Further, the bottom angles of the trapezoid should desirably be 45 to 90 deg. because the patterns extending along the bending portion can easily be disposed side by side.

In this embodiment of the present invention, the glass clock as a bendable base material forming the flexible substrate should preferably be 30 μm or less thick and the glass fibers forming the glass cloth be preferably be 1.5 to 7.0 μm thick. If the thickness of the glass cloth exceeds 30 μm, the flexible substrate cannot be bent. If the thickness of the glass fiber is less than 1.5 μm, it will be difficult to bend the flexible substrate with a large degree of bending (with a large radius of curvature). On the other hand, if the glass fiber is larger than 7.0 μm in thickness, the flexible substrate itself cannot be bent in some cases.

Also, the resin as a bendable base material impregnated in the glass cloth may be epoxy resin, polyimide resin, acrylic resin, liquid crystal polymer, phenol resin or the like of which the epoxy resin is most preferable as the flexible base material.

Further, the sheet of the bendable base material should desirably be less than 100 μm in thickness. If the sheet thickness exceeds 100 μm, the glass cloth will be excessively thick, resulting in a lower flexibility. That is, it will be difficult in some cases to bend the flexible substrate at the bending portion thereof largely with a constant radius of curvature.

In the embodiment of the present invention, the cover lay provided to protect the conductor circuit formed on the bendably flexible substrate should preferably be formed from a flexible adhesive-coated copper foil, a flexible solder resist layer or a prepreg prepared by impregnating a glass cloth with epoxy resin and then drying it to the B stage. In this case, the insulation reliability and connection reliability are better than when a polyimide film (e.g., adhesive-coated polyimide) is used.

Note that the dummy pattern in this embodiment of the present invention should preferably be formed on the inner surface of the bending portion of the flexible substrate. Thus, it is possible to easily bend the flexible substrate at the bending portion largely with a constant radius of curvature and prevent the conductor circuit formed on the side of the flexible substrate opposite to the inner surface of the bending portion from being broken. Also, since the dummy pattern is formed on the inner surface, it is highly durable against repeated bending and will less impair the base material of the flexible substrate and the conductor circuit.

(2) Also, according to another embodiment of the present invention, there is provided a flex-rigid printed wiring board including rigid substrates and a bendably flexible substrate having a conductor circuit provided on an insulative base material and covered with a cover lay, wherein the insulative base material of the flexible substrate is formed from a glass cloth impregnated with a resin to be bendable; and wiring patterns of the conductor circuit, formed on a portion of the flexible substrate where the latter is to be bent, are formed wide or curved in the width direction.

In the above flex-rigid printed wiring board (2) as another embodiment of the present invention, the wide wiring patterns formed on the bending portion of the flexible substrate are extended in the width direction (will be referred to as "extended pattern" hereunder).

Also, the largest width of the extended pattern may be larger than, and smaller than a double of, that of the wiring patterns formed on a portion of the flexible substrate where the latter is not to be bent.

Also, the extended pattern may be swollen to in one or both of directions perpendicular to the width direction.

In this embodiment of the present invention, the above wiring patterns curved as above (will be referred to as "curved pattern" hereunder) may have a width larger than, and smaller than a double of, that of the wiring patterns formed on the non-bending portion of the flexible substrate.

Also, the curved pattern may depict a part of a circle whose radius R is 2 to 10-mm and the shortest distance X from the largest curved portion of the pattern to the wiring patterns on the non-bending portion may be $R/3 \leq X \leq R$.

Also, in this embodiment of the present invention, the bendable base material may be a sheet-like one whose thickness is less than 100 μm.

Further, the glass cloth forming the bendable base material may be less than 30 μm thick and the glass fibers of the glass cloth may be 1.5 to 7.0 μm thick.

In the embodiment of the present invention, the cover lay to cover the conductor circuit may be formed from any one selected among a flexible adhesive-coated copper foil, a flexible solder resist layer and a prepreg prepared by impregnating a glass cloth with epoxy resin, drying and then processing it to the B stage.

Note that in the present invention, the "bending portion" refers to a surface area which will be a curve surface formed when the flexible substrate is bent. It is a portion located before and after the center of width-directional bending. The "non-bending portion" referred to a surface other than the bending portion.

In the flex-rigid printed wiring bards (1) and (2) as the embodiments of the present invention, the flexible substrate includes the bendable base material formed from a glass cloth impregnated with the resin and dried. So, the base material thus formed is increased in rigidity and will incur less dimensional variation. Thus, no such restraints as in forming a conventional conductor circuit will be placed on forming the flexible substrate in these embodiments. So, the conductor circuit can be prevented from being broken due to such a problem in the base material as in the conventional flex-rigid printed wiring boards.

Also, the wiring is not displaced due to a dimensional change of the connection between the flexible and rigid substrates, and thus the electrical connection will not be deteriorated.

Also, the dummy pattern formed on the side of the flexible substrate, opposite to the side where the conductor circuit is formed, or the extended pattern or curved pattern is formed on the bending portion on at least one side of the flexible substrate, thereby permitting to easily bend the flexible substrate at the bending portion. So, the flexible substrate can be bent at the bending portion thereof with a constant radius of curvature. Namely, the bending can be made without any variation in radius of curvature.

Use of the bendable base material formed by impregnating the glass cloth with the epoxy resin and drying it assures an improved rigidity of the base material, so that the dimensional variation of the base material can be minimized.

More specifically, the base material formed by drying the glass cloth impregnated with the resin is more difficult to bend, and lower in tolerance for repetition of bending, than the conventional flexible substrate formed from only a film of a resin such as polyimide resin. However, by forming the dummy pattern on the side of the flexible substrate, opposite to the side where the conductor circuit is formed, or by forming the extended pattern or curved pattern on the bending portion on at least one side of the flexible substrate, as above, the flexible substrate can be bent at the bending portion thereof with a stable radius of curvature as well as with an improved tolerance for the repetition of bending.

As the result, the wiring patterns of the conductor circuit can be prevented from being broken due to the bending of the flexible substrate, to thereby prevent the connection reliability from being deteriorated. The wiring patterns can keep a good electrical connection for a longer time than ever under the conditions of the reliability test such as thermo cycle test. Thus, it will not be damaged at the outer surface thereof. Also, since no waving is made, the base material will not easily be cracked and also the wiring patterns of the conductor circuit will not easily be broken.

(3) Also, according to another embodiment of the present invention, there is provided a manufacturing method for a flex-rigid printed wiring board including rigid substrates each formed from an insulative base material and a conductor circuit provided on the insulative base material, and a bendably flexible substrate formed from an insulative base material, conductor circuit provided on the insulative base material and a cover lay to cover the conductor circuit, the rigid and flexible substrates being connected to each other, wherein the insulative base material of the flexible substrate is a bendable base material produced by impregnating a glass cloth with a resin and drying it; and the flexible substrate has the conductor circuit formed on one side thereof and a dummy pattern on the other side near a portion thereof where it is to be bent.

(4) Also, according to another embodiment of the present invention, there is provided a manufacturing method for a flex-rigid printed wiring board including rigid substrates and a bendably flexible substrate having a conductor circuit provided on an insulative base material and covered with a cover lay, wherein the insulative base material of the flexible substrate is formed from a glass cloth impregnated with a resin to be bendable; and wiring patterns of the conductor circuit, formed on a portion of the flexible substrate where the latter is to be bent, are formed wide or curved in the width direction.

BRIEF DESCRIPTION OF THE DRAWINGS

FIG. 3(a) schematically illustrates a lattice-shaped dummy pattern having formed therein a plurality of rectangular openings equal in size to each other.

FIG. 3(b) schematically illustrates a lattice-shaped dummy pattern having formed therein a plurality of circular openings equal in size to each other.

FIG. 3(c) schematically illustrates a lattice-shaped dummy pattern having formed therein a plurality of rectangular openings equal in size to each other and rounded at the angular corners.

FIG. 3(d) schematically illustrates a lattice-shaped dummy pattern having formed therein a plurality of staggered rectangular openings equal in size to each other.

FIG. 3(e) schematically illustrates a lattice-shaped dummy pattern having formed therein a plurality of combinations of a large and small circular openings.

FIG. 9(a) schematically illustrates a mode of the curved wiring patterns.

FIG. 9(b) schematically illustrates a mode of the extended wiring patterns.

FIG. 9(c) schematically illustrates another mode of the curved wiring patterns.

FIG. 9(d) schematically illustrates another mode of the extended wiring patterns.

FIGS. 10(a) and 10(b) show the disposition of the curved or extended wiring patterns formed on either side of the flexible substrate.

FIG. 13 shows the process of stacking the flexible and rigid substrates one on the other in the flex-rigid printed wiring board according to the example 1 of the present invention.

FIG. 14 shows the flex-rigid printed wiring board according to the example 1 of the present invention.

FIGS. 20(a) to 20(g) show the process of manufacturing a flex-rigid printed wiring board according to an example 129 of the present invention.

BEST MODE FOR CARRYING OUT THE INVENTION

The flex-rigid printed wiring board according to an embodiment of the present invention is firstly characterized in that it includes rigid portions and a flexible portion including a flexible substrate whose insulative base material is formed from a bendable base material formed by drying a glass cloth impregnated with a resin, not from any film of a resin such as polyimide resin as in the conventional flex-rigid printed wiring boards and the insulative base material has a conductor circuit formed on one side thereof and a dummy pattern formed on the other side.

The glass clock as a bendable base material forming the flexible substrate should preferably be 30 µm or less thick and the glass fibers forming the glass cloth be preferably be 1.5 to 7.0 µm thick. If the thickness of the glass cloth exceeds 30 µm, the flexible substrate cannot be bent. If the thickness of the glass fiber is less than 1.5 µm, it will be difficult to bend the flexible substrate largely with a constant radius of curvature. On the other hand, if the glass fiber is larger than 7.0 µm in thickness, the flexible substrate itself cannot be bent in some cases.

Also, the resin as a bendable base material impregnated in the glass cloth may be epoxy resin, polyimide resin, acrylic resin, liquid crystal polymer, phenol resin or the like of which the epoxy resin is most preferable as the flexible base material.

Further, the sheet of the bendable base material should desirably be 10 to 100 µm in thickness. With a thickness of less than 10 µm, the electrical insulation will be deteriorated. If the sheet thickness exceeds 100 µm, the glass cloth will be excessively thick, resulting in a lower flexibility.

The bendable insulative base material has formed on one side thereof wiring patterns of the conductor circuit including interconnecting electrode pads. The wiring patterns are formed by plating the surface of the insulative base material or by etching a metal foil attached to the surface of the insulative base material, and the interconnecting electrode pads are formed as a part of the wiring patterns.

The interconnecting electrode pads formed on the flexible substrate should preferably be circular in shape, have a diameter of about 50 to 500 µm, and be disposed in a plurality of places with a pitch of about 100 to 700 µm.

If the above diameter is smaller than 50 µm, the connection reliability will be poor. A diameter exceeding 500 µm will cause it difficult to raise the wiring density for a higher packaging density.

Figure 1:
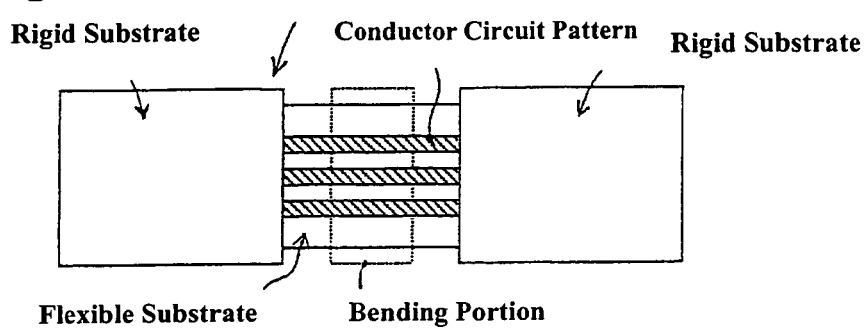
FIG. 1 schematically illustrates the flex-rigid printed wiring board according to a first embodiment of the present invention.

As shown in FIGS. 1 and 2, the flexible substrate included in the flex-rigid printed wiring board according to the embodiment of the present invention has a dummy pattern having no function of electrical connection formed near a portion thereof where it is to be bent and on a side thereof opposite to the side on which the conductor-circuit pattern is formed.

Since the dummy pattern has no function of electrical connection, it may not necessarily be formed from the same material as that of the conductor-circuit pattern but may be formed from an insulative material such a resin, ceramic or the like. The dummy pattern should desirably be formed from a metal from the viewpoint of the workability, retention of shape uniformity and tolerance for bending.

The dummy pattern should desirably be formed around the bending portion of the flexible substrate, and it should more preferably be formed on a side of the flexible substrate, which will be inner when the flexible substrate is bent. When the dummy pattern is thus formed, the flexible substrate can be bent at the bending portion thereof with a large radius of curvature so that the conductor circuit will not easily be broken and the connection reliability and reliability of the flexible substrate under the conditions of a thermo cycle test can thus be prevented from being lower.

In case the flexible substrate is formed from a bendable base material formed by drying a glass cloth impregnated with a resin (especially, epoxy resin) and the dummy pattern is disposed near the bending portion of the flexible substrate, as above, an appropriate rigidity (strength) can be imparted to the flexible substrate and also the bending portion be made appropriately flexible. Thus, the flexible substrate can be bent at the bending portion thereof largely with a constant radius of curvature.

As shown in FIG. 3, the dummy pattern should preferably be a conductive or insulative layer having provided as a lattice pattern therein openings formed in a same shape or in different shapes and disposed regularly in at least one line.

The above language "lattice pattern" refers to a disposition of a plurality of openings in the form of a lattice (as shown in FIGS. 3(a) to 3(c)) and also a disposition of a plurality of staggered openings (as in FIG. 3(d)).

The dummy pattern in the above flex-rigid printed wiring board as an embodiment of the present invention also includes a solid pattern having no openings formed therein. With the solid dummy pattern, however, the flexible substrate will be difficult to bend near the bending portion thereof as the case may be, and a stress developed in a reliability test such as thermo cycle test is likely to be transmitted while being not buffered. Namely, such a solid dummy pattern will possibly cause a damage to the base material and conductor circuit. On this account, the dummy pattern should preferably be not solid but be formed to have a lattice pattern in which a plurality of openings is disposed regularly in at least a line.

The openings included in the lattice pattern may be formed to have three, four, five or more angular corners, have rounded angular corners, have a circular, elliptic or other curved form or have an angular shape and curved form in combination.

Also, the openings of the lattice pattern may be formed to have the same shape and same area or to have different shapes and different areas in combination (as in FIG. 3(e)).

Also, the distances (pitches) from one to another of the plurality of openings included in the lattice pattern may be fixed or not, and the sizes and pitches of the openings near the bending portion may be different from those of the openings at other portion.

The dummy pattern should more preferably be formed like any of the patterns shown in FIGS. 3(a) to 3(e).

Each of the openings of the lattice pattern should desirably have an area of 10,000 to 200,000 µm². With an area smaller than 10,000 µm², the flexible portion itself will be excessively strong so that it will have such a flexibility as will not permit to easily bend the bending portion, and a stress developed in a reliability test such as the thermo cycle test will so easily be transmitted through the flexible portion as not to be buffered, resulting in a damage to the base material and conductor circuit. On the other hand, if the area exceeds 200,000 µm², the base material will be waved at the bending portion, so that the conductor circuit will be displaced and it will be difficult to easily bend the flexible substrate at the bending portion largely with a constant radius of curvature.

Also, the ratio between the sum of the areas of the openings of the lattice pattern and the area of the rest of the lattice pattern should preferably be within a range of 1:9 to 9:1. With a ratio smaller than 1:9, the flexible portion itself will be excessively strong so that it will have such a flexibility as will not permit to easily bend the bending portion, a stress developed in a reliability test such as the thermo cycle test will so easily be transmitted through the flexible portion as not to be buffered, resulting in a damage to the base material and conductor circuit. On the other hand, if the ratio exceeds 9:1, the base material will be waved at the bending portion, so that the conductor circuit will be displaced and it be difficult to easily bend the flexible substrate at the bending portion largely with a constant radius of curvature.

The ratio between the sum of the areas of the openings of the lattice pattern and the area of the rest of the lattice pattern should more preferably be within a range of 2:8 to 8:2. As long as the ratio is within this range, even if it varies a little, the above problem will not take place in the reliability test such as the thermo cycle test, the base material will not be waved at the bending portion. Thus, the flexible substrate can be bent at the bending portion thereof largely with a constant radius of curvature.

Also, the ratio between the sum of the areas of the openings of the lattice pattern and the area of the rest of the lattice pattern should more preferably be within a range of 9:10 to 11:10. As long as the ratio is within this range, even if it varies a little and a variation in uniformity takes place in the flexible substrate from one portion to another, the flexible substrate will positively withstand the conditions of the reliability test. Thus, the flexible substrate can uniformly be bent at the bending portion thereof largely with a constant radius of curvature.

Each of the openings of the lattice pattern should more preferably have an area of 10,000 to 126,000 µm² and the ratio between the sum of the areas of the openings and the area of the rest of the lattice in which no such openings are formed more preferably be within the range of 1:9 to 9:1. As long as the area and ratio are included within these respective ranges, the flexible portion can be bent at the bending portion thereof largely with a constant radius of curvature, irrespectively of the shape of the openings. Also, since the electrical connection can be prevented from being poor due to a displacement of the conductor circuit and the stress developed when the flexible substrate is subjected to a reliability test such as thermo cycle test is buffered, the reliability of the flexible substrate can considerably be improved with no damage given to the base material and conductor circuit.

Also, each of the openings of the lattice pattern should more preferably have an area of 10,000 to 126,000 µm² and the ratio between the sum of the areas of the openings and the area of the rest of the lattice in which no such openings are formed more preferably be within the range of 9:10 to 11:10. As long as the area and ratio are included within these respective ranges, the flexible substrate will not be influenced by any variations in size and shape of the openings and variation in uniformity of the material from one portion to another and the reliability can be improved.

Figure 4:
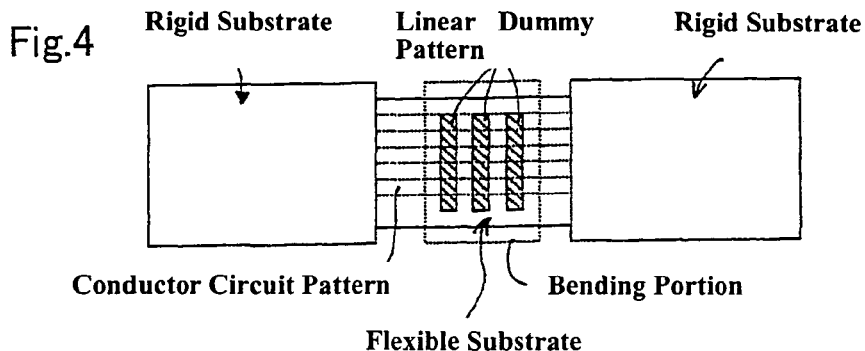
FIG. 4 schematically illustrates linear dummy patterns.
Figure 5A:
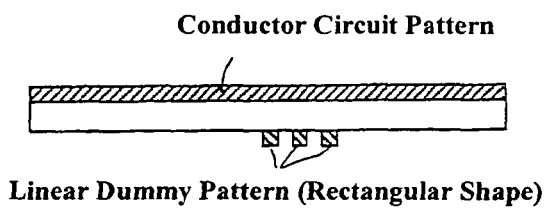
FIG. 5(a) schematically illustrates a geometrical relation between linear dummy patterns whose sectional shape is rectangular and a conductor-circuit pattern.
Figure 5B:
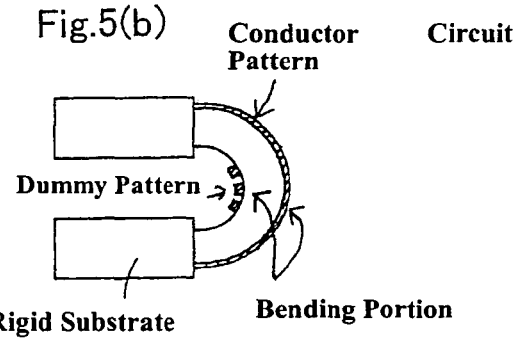
FIG. 5(b) schematically illustrates the flexible substrate being bent.

In this embodiment of the present invention, the dummy pattern should desirably be a pattern extending in a direction in which it intersects the linear patterns of the conductor circuit as shown in FIG. 4. The dummy pattern should desirably be disposed near the bending portion of the flexible substrate and formed from at least three linear patterns of which the width is more than 150 µm as shown in FIGS. 5(a) and 5(b). In case the dummy pattern is formed from more than three linear patterns, the flexible substrate can be bent at the bending portion thereof largely with a constant radius of curvature. If the linear-pattern width is less than 150 µm, the flexible substrate cannot possibly be bent at the bending portion thereof with a constant radius of curvature.

Also, the distance between the linear patterns extending in the direction in which they will intersect those of the conductor circuit should preferably be more than 30 µm. In this case, the linear patterns extending along the bending portion of the flexible substrate can be disposed side by side. If the distance between the pattern lines is less than 30 µm, the linear patterns expending along the bending portion will overlap each other in some cases. In this case, waving will take place in a part of the bending portion, so that the linear patterns of the conductor circuit will possibly be broken, leading to a deteriorated connection reliability.

Also, the thickness of the linear patterns extending in the direction in which they will intersect those of the conductor circuit should preferably equal to, or larger than, that of the linear patterns of the conductor circuit. In case the linear patterns are thinner than the wiring patterns of the conductor circuit, the flexible substrate will be bent with a smaller radius of curvature. Also, frequent bending of the flexible substrate will lead to breakage of the wiring patterns of the conductor circuit in some cases.

Figure 5C:
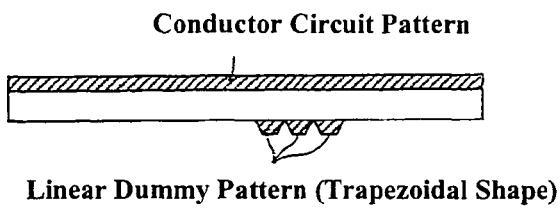
FIG. 5(c) schematically illustrates the geometrical relation between linear dummy patterns whose sectional shape is trapezoidal and a conductor-circuit pattern.

Also, the linear patterns should desirably have a trapezoidal sectional shape as shown in FIG. 5(c). Since in case the sectional shape is trapezoidal, pattern portions will not overlap each other when the dummy pattern is bent, no step will occur at the bending portion and the wiring patterns of the conductor circuit will be prevented from being broken (as in FIG. 5(d)).

Figure 5D:
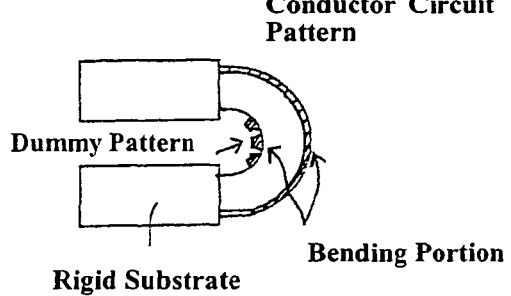
FIG. 5(d) schematically illustrates the flexible substrate being bent.
Figure 5E:
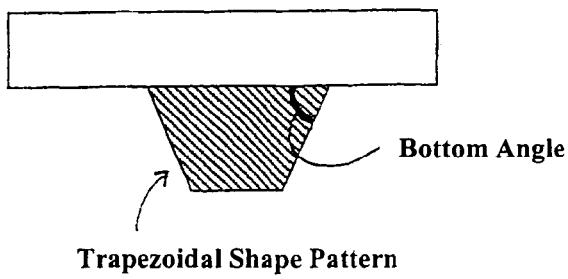
FIG. 5(e) schematically illustrates the bottom angles of the linear dummy patterns whose sectional shape is trapezoidal.

Further, the bottom angles of the trapezoid of the trapezoidal portion of the dummy pattern whose section is trapezoidal as shown in FIG. 5(e) should desirably be 45 to 90 deg. because the patterns extending along the bending portion can easily be disposed side by side. With bottom angles of the trapezoid being less than 45 deg., the extending patterns will be difficult to bend when the flexible substrate is bent at the bending portion. Namely, since the adjacent extending patterns are likely to form a clearance between them, it will be difficult to keep the radius of curvature constant. In case the bottom angles exceed 90 deg., the adjacent extending patterns are likely to overlap each other, it will be difficult to keep the radius of curvature constant. Also, in case the distance between the wiring patterns is increased to avoid the above problems, the extending patterns are likely to form a clearance between them, the radius of curvature will be difficult to be constant.

Note that the above language "linear pattern" refers not only to a continuous linear pattern extending in a direction in which it will intersect the wiring patterns of the conductor circuit, namely, extending in a direction along the bending portion of the flexible substrate but to a dot pattern defined by small patterns such as square, circular, elliptic or otherwise-shaped dots disposed at predetermined intervals in a direction along the bending portion of the flexible substrate to function generally similarly to the linear pattern.

According to the embodiment of the present invention, the cover lay provided to protect the conductor circuit formed on the bendably flexible substrate should preferably be formed from a flexible resin-coated copper foil, a flexible solder resist layer or a prepreg prepared by drying a glass cloth impregnated with epoxy resin to the B stage. In this case, the insulation reliability and connection reliability are better than when a polyimide film (e.g., adhesive-coated polyimide) is used.

The resin in the flexible resin-coated copper foil should preferably be about 50 μm thick in order to assure the insulation reliability.

Also, the flexible solder resist layer may be formed mainly from a thermosetting resin, thermoplastic resin, photosensitive resin or a thermosetting resin including (meta)acylic group. Preferably, the solder resist layer should be 20 to 50 μm thick in order to assure the insulation reliability.

Further, the prepreg formed by impregnating the glass cloth with epoxy resin and then drying it to the B stage should desirably be 20 to 50 μm thick in order to assure the insulation reliability.

Different from the flexible substrate, the rigid substrate included in the flex-rigid printed wiring board according to the embodiment of the present invention has no flexibility and is so rigid that it will not easily be deformed irrespectively of its form, number of layers, method of forming, etc.

The insulative resin base material of the rigid substrate may be a rigid one selected from among a glass fabric epoxy resin substrate, glass fabric bismaleimide triazine resin substrate, glass fabric polyphenylene ether resin substrate, aramid nonwoven fabric-epoxy resin substrate and aramid nonwoven fabric-polyimide resin substrate. Among them, the glass fabric epoxy resin substrate is the most preferable one for the insulative resin base.

The insulative resin base should be on the order of 20 to 600 μm in thickness. With a thickness of less than 20 μm, the insulative resin base material is lower in strength and cannot easily be handled and the electrical insulation will be lower in reliability. If the thickness exceeds 600 μm, it will be difficult to form any fine via through the base material and fill the via with a conductive material and the substrate itself will be thicker.

The insulative resin base material is plated on one side or both sides thereof with a copper foil having a thickness of 5 to 18 μm. If the thickness is smaller than 5 μm, an opening, formed by lasering, to form a via in the insulative resin base material will penetrate the base. On the contrary, with a thickness of more than 18 μm, it will be difficult to form, by etching, fine conductor circuit patterns.

The rigid substrate including the insulative resin base material and copper foil may use, among others, a single-sided copper clad laminate which can be formed by stacking a prepreg formed by impregnating a glass fabric with an epoxy resin and cured to the B stage and a copper foil and pressing them at a high temperature. Such a rigid substrate is excellent in accuracy of positioning without displacement of the wiring patterns and via-hole position during handling after etching the copper foil.

Note that the above conductor circuit formed on one side or both sides of the rigid substrate should preferably be formed by pressing, at a high temperature, a copper foil of about 5 to 18 μm in thickness via a resin adhesive layer kept in the B stage and then etching it appropriately.

The conductor circuit should preferably be formed by attaching an anti-etching film on the copper foil attached to the base surface, covering it with a mask having a specified circuit pattern and etching the copper foil to provide a conductor circuit including electrode pads (via-lands).

In the above conductor circuit forming process, a photosensitive dry film resist is first attached to the surface of the copper foil, then exposed to light along the specified circuit pattern and developed to form an etching resist, and the metal layer where no etching resist is formed is etched to provide a conductor circuit including electrode pads.

The etchant used in the above process may be at least one selected among aqueous solutions of sulfuric acid-hydrogen peroxide, persulfate, cupric chloride and ferric chloride.

Also, in a pre-processing to form a conductor circuit by etching the copper foil, the entire surface of the copper foil may be pre-etched to thin the copper foil to a thickness of about 1 to 10 μm, more preferably, to a thickness of about 2 to 8 μm, in order to form a fine pattern more easily.

The shape, size and number of the interconnecting electrode pads formed on the rigid substrate are not limited any specific ones. For example, the pad should preferably be formed as a circle whose diameter is about 50 to 500 μm and at a plurality of places with a pitch of about 100 to 700 μm. With a pad diameter of less than 50 μm, the connection is not highly reliable. With a diameter exceeding 500 μm, the pad will has an increased area, which is disadvantageous for a higher packaging density.

In the insulative resin base material, there is formed an opening for forming a via-hole (will be referred to as "via opening" hereunder). The via opening can be formed by lasering. More specifically, a transparent protective film, for example, a PET film, is attached to the surface of the insulative resin base, a carbon dioxide laser is irradiated from above the PET film to form an opening through the PET film, which extends from the surface of the insulative resin base to the copper foil. Under these processing conditions, the via opening should desirably have a diameter of about 50 to 250 μm.

Note that for removing resin left on the side and bottom surfaces of the via opening formed by the lasering, the insulative resin base material is subjected to desmearing. The desmearing is done by any of oxygen plasma discharge, corona discharge, ultraviolet laser irradiation and excimer laser irradiation. Also, the desmearing may be a wet desmearing using acid, oxidant or the like.

The via opening is filled with a conductive material to form a filled via-hole. The conductive material should preferably be a conductive paste or a metal plate formed by electroplating.

For manufacturing the flex-rigid printed wiring board with less cost and improved yield by simplifying the filled via-hole forming process, the via opening should preferably be filled with a conductive paste. For an improved connection reliability, the via opening should preferably be filled with a metal plate formed by electroplating. Among others, the electrolytic copper is preferable for filling in the via opening.

The conductive material may not only be filled in the via opening penetrating the insulative resin base and extending to the conductor circuit but also be projected to a specified height out of the via opening. The projection should desirably be as high as falling within a range of 5 to 30 μm.

If the projection height is less than 5 μm, the connection is likely to be poor. With a projection height exceeding 30 μm, the resistance of the conductive material will be higher, and the conductive material will spread too much along the surface of the insulative resin base and no fine pattern can be formed when it is thermally deformed in the hot pressing process.

In the flex-rigid printed wiring board according to the embodiment of the present invention, the rigid and flexible substrates may be connected electrically to each other in any of the following manners (1) to (7). By adopting an arbitrary combination of the connecting manners, the substrate material can effectively be used and the substrates be connected to each other with a high freedom of wiring.

(1) In case a flexible substrate is connected to one side of a rigid substrate, an interconnecting electrode pad is formed on one outermost surface of the rigid substrate, and an interconnecting electrode pad is also formed on one side of the flexible substrate to connect the electrode pads on the respective substrates to each other via a conductor lump.

(2) In case different flexible substrates are connected to both sides of a rigid substrate, respectively, an interconnecting electrode pad is formed on either outermost surface of the rigid substrate and each of the flexible substrates is disposed opposite to the interconnecting electrode pads formed on both sides of the rigid substrate to connect the opposite interconnecting electrode pads opposite to each other via a conductor lump.

(3) In case different rigid substrates are connected to both sides of a flexible substrate, respectively, an interconnecting electrode pad is formed on either side of the flexible substrate and the different rigid substrates having interconnecting electrode pads formed on one outermost surface thereof oppositely to the interconnecting electrode pads on the flexible substrate are disposed for the interconnecting electrode pads on the substrates to be opposite to each other to connect the mutually opposite interconnecting electrode pads to each other via a conductor lump.

(4) In case a plurality of rigid substrates is connected electrically to a flexible substrate in a plurality of places, the plurality of rigid substrates is pre-formed to have an arbitrary number of conductive layers and an arbitrary number of insulative resin layers, interconnecting electrode pads formed on the individually formed rigid and flexible substrates are disposed opposite to each other and the mutually opposite interconnecting electrode pads are connected to each other via a conductor lump.

Figure 21A:
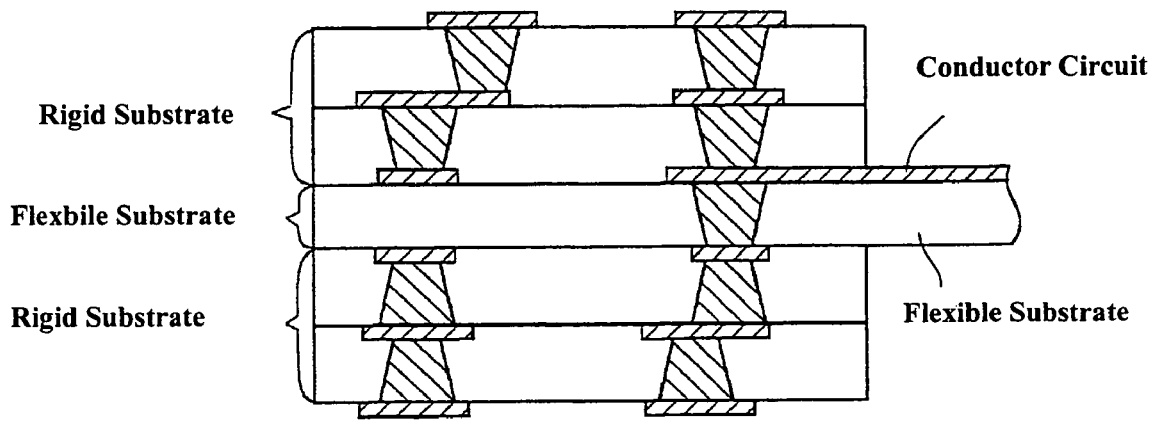
FIGS. 21(a) and 21(b) schematically illustrate two examples of the electrical connection between the rigid and flexible substrates in the flex-rigid printed wiring board according to the present invention.

(5) In a rigid substrate, layers are connected to each other via the via as a bore or the filled via formed an opening filled with a conductive material. Also, rigid and flexible substrates are connected to each other via the via or filled via. Also, a stacked via formed from a stack of vias may be used for such connection as necessary as shown in FIG. 21(a).

(6) A plated through-hole is formed through both rigid and flexible substrates to electrically connect the substrates to each other via the plated through-hole. Also, rigid substrates may be disposed on either side of a flexible substrate as the case may be, and a plated through-hole be formed through these substrates.

Figure 21B:
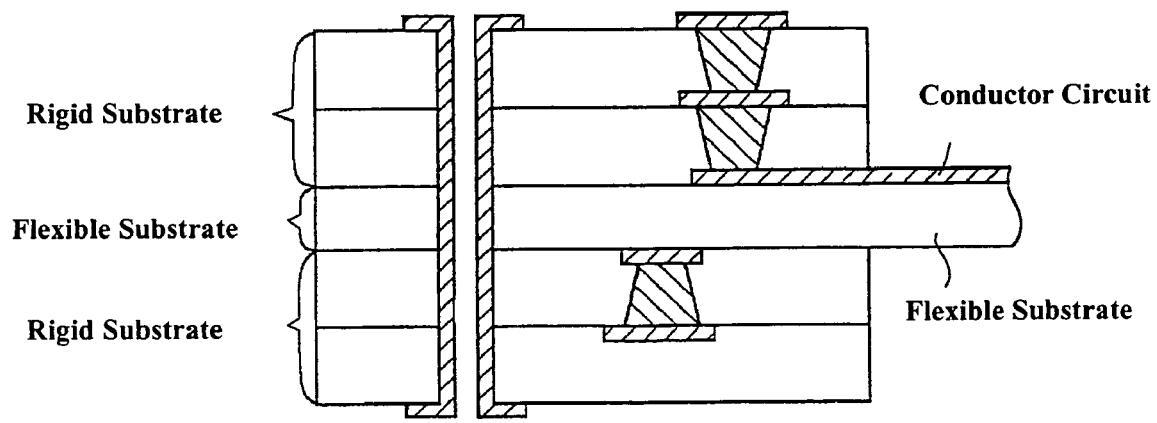
Figure 22:
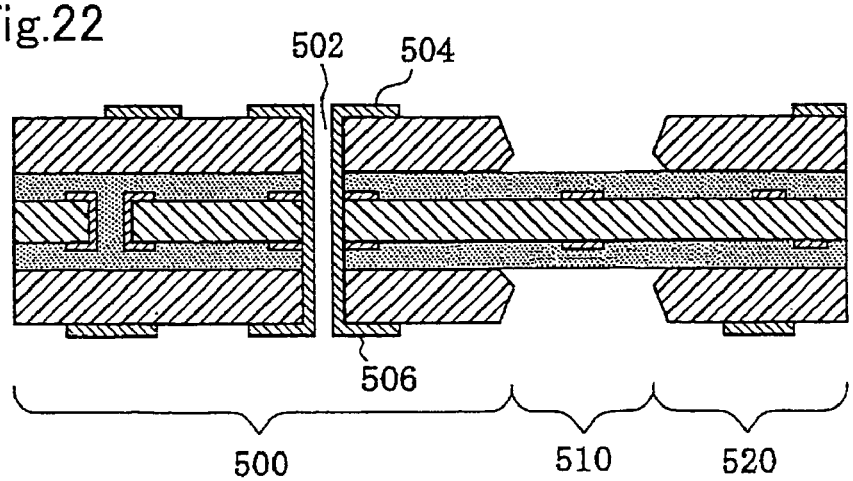
FIG. 22 schematically illustrates the sectional structure of the conventional flex-rigid printed wiring board.

(7) Rigid and flexible substrates are connected to each other by a combination of the manners of connection as in (5) and (6), that is, via the plated through-hole and via in combination. See FIG. 21(b).

Among the above four connecting manners (1) to (7), the fourth one (4) in which a flexible substrate is connected to one outermost surface of a rigid substrate will be explained hereebelow.

For example, the flex-rigid printed wiring board in which a flexible substrate is connected to rigid substrates at to one outermost surface of the latter is typically such that a flexible substrate is joined at one or either side thereof at one end of the latter to rigid substrates previously interlayer-connected to each other (these rigid substrates will be referred to as "one rigid portion" hereunder) and also joined at one or either side thereof at the other end to other rigid substrates previously interlayer-connected to each other (these rigid substrates will be referred to as "other rigid portion" hereunder).

In this manner of substrate connection, a portion, between the opposite ends, of the flexible substrate is not to be in contact with the rigid substrates (thus, the portion will be referred to as "flexible portion" hereunder). The flexible portion has provided thereon a conductor circuit to provide a electrical connection between the one and other rigid substrates. The conductor circuit is normally covered with an insulative layer called "cover lay".

In a predetermined area on one side of the flexible substrate included in each rigid portion, for example, in a surface area along the short side of the elongated rectangular substrate, there are pre-formed a plurality of interconnecting electrode pads as a part of the conductor circuit and a conductor circuit and insulative layer. Also, in a predetermined area of an outer surface of the rigid substrates interlayer-connected to each other, there is pre-formed a plurality of interconnecting electrode pads corresponding to those provided on the flexible substrate.

The pluralities of interconnecting electrode pads on the rigid portions are electrically connected to each other by a conductor lump interposed between the rigid and flexible substrates, and are joined integrally to each other with an adhesive in a surface area other than the interconnecting electrode pads.

When forming a conductor circuit by plating or etching one or two circuit boards forming the outermost layer of the rigid substrate, the interconnecting electrode pad may be formed as a part of the conductor circuit, independently on the insulative resin layer on the circuit board forming the outermost layer or as a via-land penetrating the insulative resin layer to electrically connect to the lower conductor circuit.

In the flex-rigid printed wiring board according to the present invention, the area where the interconnecting electrode pad on the rigid substrate is to be formed may not necessarily be the entire surface of the insulative resin layer as the outermost layer of the rigid substrate but may be in an arbitrary position where a sufficiently strong connection will be assured.

For example, the above area may be a peripheral surface area along the shorter or longer side of a rectangular substrate or a surface area extending from the periphery toward the center of a substrate.

Since an area may thus arbitrarily be selected in which the interconnecting electrode pad is to be formed, wires can be led out in any directions correspondingly to a design of the casing of an electronic device in which the flex-rigid printed wiring board is to be built in and layout of other rigid substrates and electronic parts housed in the device casing. The wiring in this flex-rigid printed wiring board is thus extremely advantageous.

Further, the rigid and flexible substrates are joined to each other with an insulative adhesive layer attached or coated on a surface area of the rigid or flexible substrate where the interconnecting electrode pads are not formed.

A stack wiring board structure formed with the interlayer connection of the rigid substrate being coincident with that of the flexible substrate, the interlayer connections being lap-joined to each other for electrical continuity via a conductor lump, is one of the preferred embodiments of the present invention. Employment of such a stack wiring board structure implements a reduced wiring length, and permits to provide a preferable flex-rigid printed wiring board for packaging electronic parts operable on a large power.

The conductor lump connecting the interconnecting electrode pads provided on the rigid and flexible substrates, respectively, to each other should desirably be provided to project on the interconnecting electrode pad provided on either the rigid substrate or flexible substrate. The conductor lump will easily penetrate through the insulative adhesive layer when the rigid and flexible substrates are placed to overlap each other.

The conductor lump is typically formed to have the shape of a smooth convex-curve, spherical or hemispheric, a column, prismatic or cylindrical, a bump (post), pyramidic or conical, a ball or a pin by plating, printing, transferring, implanting, electrodeposition or the like of a metal selected among copper, gold, silver, tin or the like or their alloy or various solders. However, it is not limited to any of these examples but it may be a means which can electrically connect the interconnecting electrode pads provided on the rigid substrate and that on the flexible substrate to each other with a sufficient strength.

In case the conductor lump is the above-mentioned bump (post) formed by plating, it may be formed by plating copper. In this case, the conductor lump should preferably be connected to the interconnecting electrode pad on the flexible substrate via a solder layer because it assures an excellent electrical continuity through itself.

Also, the solder for the bump (post) or ball may be selected from among Sn/Pb, Sn/Sb, Sn/Ag, Sn/Ag/Cu, Sn/Cu, Sn/Zn and Sn/Ag/In/Cu solders.

That is, the solder may be either one selected from the above-mentioned metals or solders or a mixture of two or more of the metals or solders.

Among others, a bump formed from a solder containing no lead, namely, a so-called lead-free solder, should preferably be used not to pollute the natural environment. Such solders include, for example, Sn/Sb, Sn/Ag, Sn/Ag/Cu, Sn/Cu, Sn/Zn and Sn/Ag/In/Cu solders. Taking account of the material of each of the rigid and flexible substrates, an Sn-37Pb solder whose melt point is 183° C. or an Sn-35Ag-0.7Cu solder whose melt point is 217° C. is more preferable for use to form the bump as the conductor lump.

Further, a bump formed by plating the Sn/Ag solder is more preferable since it is excellent in malleability and can effectively suppress the stress developed in the cooling/heating cycle.

The solder bump should preferably have a height of about 10 to 150 μm. This solder bump can be formed by plating, printing, transferring, implanting, electrodeposition or the like.

To form the solder bump by printing, a printing mask (metal mask) having a circular opening formed therein is placed in a position on a rigid or flexible substrate, corresponding to the interconnecting electrode pad on the substrate, a solder paste is applied over the mask and heated to form the solder bump.

Also, to form the solder bump by transferring, a rigid or flexible substrate having an interconnecting electrode pad provided thereon, solder carrier and retaining jig as a weight are placed one after another on the horizontal surface of a horizontal jig, for example, the substrate and solder carrier are held tight between the horizontal jig and retaining jig and held horizontally, the solder pattern of the solder carrier is transferred by reflowing to the interconnecting electrode pad, and then the solder carrier is removed to form a solder bump on the interconnecting electrode pad.

Further, the solder ball may be formed from a copper ball of 100 to 800 μm in diameter and a solder layer having a thickness of less than 150 μm and which covers the copper ball.

The rigid and flexible substrates should preferably be connected to each other electrically and physically by pressing the interconnecting electrode pad on the flexible substrate to the solder bump or ball on the interconnecting electrode pad of the rigid substrate, heating the solder bump or ball to melt the latter, and then curing the melted solder.

In the flex-rigid printed wiring board as the embodiment of the present invention, the resin forming the insulative adhesive layer for attaching the rigid and flexible substrates to each other and securing them and the conductor lump is to penetrate may be selected from among polyvinyl butyral resin, phenol resin, nitrile rubber, polyimide resin, phenoxy resin, xylene resin or a mixture of two or more of them, polycarbonate resin, polysulfon resin, polyether imide resin, liquid crystal polymer, polyamide resin, etc., for example. Also, the insulative adhesive layer may contain glass mat, inorganic filler, glass fabric or the like (prepreg).

For example, in case the above prepreg is used, it is interposed between the rigid and flexible substrates and hot-pressed to form the insulative adhesive layer.

In case the prepreg is used, the bump formed on the interconnecting electrode pad should preferably be formed molding a metal paste into a specified shape and then curing it. For accurate penetration in a specified position, the conductor lump should preferably have the free end thereof formed in a conical or pyramidic shape for easy penetration through the insulative adhesive layer. Alternatively, the shape may be hemispheric or trapezoidal.

The metal paste may be a conductive compound prepared by mixing a conductive powder of silver, gold, solder powder, carbon powder or the like, an alloy powder of them or a metal powder mixture of them, and a binder such as polycarbonate resin, polysulfon resin, polyester resin, phenoxy resin, melamine resin, phenol resin, polyimide resin or the like.

The metallic bump may be formed as a conductive bump having a high aspect ratio by printing using a relatively thick metal mask. The bump should preferably have a height about 1.3 times larger than the thickness of the insulative adhesive layer. For example, the bump height is set to 65 to 150 μm when the insulative adhesive layer is 50 μm thick.

Note that although the flexible and rigid substrates may electrically be connected to each other by connecting the interconnecting electrode pads provided on the substrates to each other via the conductor lump as above, they may be electrically connected to each other via a plated through-hole penetrated through the overlapping portions of the flexible and rigid substrates. Also, for the purpose of such electrical connection, for example, a multilayer printed wiring board having prepared by the conventional manufacturing method to have a plated through-hole formed therein may be used as the rigid substrates.

An example of the method of manufacturing a flex-rigid printed wiring board in which a flexible substrate and rigid substrates are electrically connected via a plated through-hole will be explained herebelow.

First, wiring patterns of the conductor circuit are formed on one of the surfaces of an insulative base material prepared by impregnating a glass cloth with epoxy resin and drying it and a dummy pattern is formed around a bending portion on the surface of the insulative base material, opposite to the surface where the wiring patterns are formed, thereby preparing a flexible substrate.

Next, a cover layer to cover either side of the substrate having the wiring patterns and dummy pattern formed thereon is formed, and a prepreg open at a portion thereof where it is to be bent and a copper foil are stacked and hot-pressed together on both sides of the substrate to form a stack.

A lasering hole is formed in the copper foil on the surface of the stack, and laser is irradiated under predetermined conditions to form a through-hole through the substrate. Then, a copper-plate layer is formed on the substrate surface including the inner surface of the through-hole to form a plated through-hole.

Next, wiring patterns are formed, by etching, on the front and rear surfaces of the substrate having the copper plate layer. Thus, the wiring patterns will electrically be connected to that formed on the flexible substrate via the plated through-hole.

Further, after a solder resist layer is formed on the flexible portion, the outer surface of the flexible portion is processed using a rooter. Thus, there is manufactured a flex-rigid printed wiring board including a flexible portion having wiring patterns formed on one side thereof and a dummy pattern formed on the other surface.

Further, the flex-rigid printed wiring board is secondly characterized in that in that it includes rigid portions and a flexible portion including a flexible substrate whose insulative base material is formed from a bendable base material formed by drying a glass cloth impregnated with a resin, not from any film of a resin such as polyimide resin as in the conventional flex-rigid printed wiring boards, the insulative base material has formed on at least one side thereof a conductor circuit having wiring patterns extending longitudinally, and a part of the wiring patterns is formed as an extended or curved pattern on the bending portion.

The "extended pattern" in the flex-rigid printed wiring board as the embodiment of the present invention is a pattern in which a part of the wiring patterns formed longitudinally of the conductor circuit provided on at least one side of the flexible substrate has the line width thereof intentionally extended or swollen, and the "curved pattern" is a pattern formed contiguous to the wiring patterns formed longitudinally of the conductor circuit and curved in the direction of the line width.

The wiring patterns extending longitudinally of the conductor circuit are formed on the non-bending portion of the flexible portion and serves only as a conductive layer for electrical connection. The extended and curved patterns are formed mainly on the bending portion of the flexible portion and serve as a conductive layer for electrical connection and also as a positive helper for bending the flexible substrate.

The extended or curved pattern, formed on the bending portion as above, helps the bending of the flexible substrate at the bending portion thereof and increases the degree of bending (radius of curvature), and also keeps the degree of bending constant.

Note that concerning the "radius of curvature", the "Rika-gaku-Jiten" (Physical and Chemical Dictionary) by the Iwan-ami Shoten, Publishers, describes that "on the assumption that tangential lines at two points P(s) and P'(s+Δs) on a curved line form together an angle Δω, the limit value dω/ds when Δs of Δω/Δs changes toward zero (0) is called a curvature at the points P and its reciprocal ρ is called a radius of curvature". Namely, a curved line or bending is regarded as a part of a circle, and the radius of the circle is taken as a radius of curvature.

According to the embodiment of the present invention, the glass cloth included in the flexible insulative base material should preferably be less than 30 μm thick, and the glass fibers of the glass cloth be 1.5 to 7.0 μm and more preferably 3.5 to 7.0 μm. With a thickness of the glass cloth being larger than 30 μm, the flexible substrate will be difficult to bend. If the glass fibers are less than 1.5 μm in thickness, it will be difficult to assure a larger degree of bending (radius of curvature). On the contrary, with a thickness of the glass fibers being larger than 7.0 μm, the flexible substrate will not be bendable. In case the thickness of the glass fibers is within the range of 3.5 to 7.0 μm, the flexible portion will have an appropriate strength and a variation in thickness of the glass fibers will not have an influence on the strength and bendability of the flexible portion.

Also, the resin impregnated in the glass cloth to form the flexible insulative base material may be epoxy resin, polyimide resin, acrylic resin, liquid crystal polymer, phenol resin or the like. Among these resins, the epoxy resin is most preferable for this use.

The flexible insulative base material should preferably be on the order of 10 to 100 μm. With a thickness of less than 10 μm, the electrical insulation of the base material will be lower. On the other hand, in case the thickness exceeds 100 μm, the glass cloth included in the base material will have an excessively large thickness and lower bendability.

On at least one side of the insulative base material, there are formed wiring patterns of a conductor circuit including the interconnecting electrode pads. The wiring patterns are formed by plating the surface of the insulative base material or attaching a metal foil to the surface of the insulative base material and etching the metal foil, and the interconnecting electrode pads are formed as a part of the wiring patterns.

The wiring patterns of the conductor circuit provided on the flexible substrate are on the order of 3 to 75 μm in thickness. With a thickness of less than 3 μm, the connection reliability will be lower. On the other hand, if the thickness exceeds 75 μm, the bending reliability will be lower.

The interconnecting electrode pads formed on the flexible substrate should preferably be circular in shape, have a diameter of about 50 to 500 μm, and be disposed in a plurality of places with a pitch of about 100 to 700 μm.

If the above diameter is smaller than 50 μm, the connection reliability will be insufficiently lower for a higher packaging density. A diameter exceeding 500 μm will cause it difficult to raise the wiring density for a higher packaging density.

Such interconnecting electrode pads may be via-lands penetrating through the substrate to provide a electrical connection with the conductor circuit on the other side. The flexible and rigid substrates may be electrically connected to each other via such viaholes as will be described later.

Figure 6:
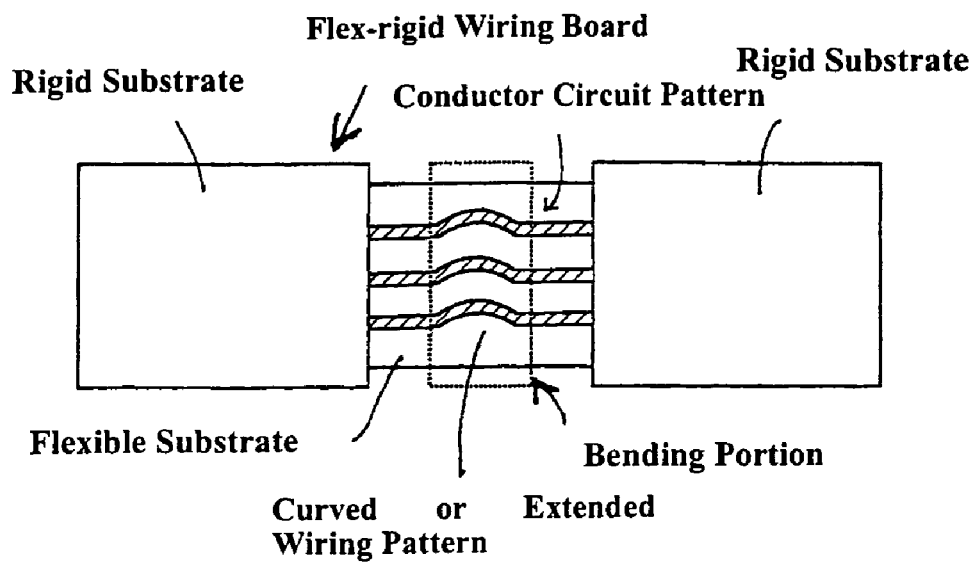
FIG. 6 schematically illustrates a flex-rigid printed wiring board according to a second embodiment of the present invention.

In the flex-rigid printed wiring board as the embodiment of the present invention, a part of the wiring patterns of the conductor circuit is formed into an extended or curved pattern that is locally swollen at the bending portion of the flexible substrate as shown in FIG. 6. With such extended or curved pattern, it is possible to prevent the conductor circuit at the bending portion from being broken, increase the strength of the flexible substrate to bend the flexible substrate at the bending portion with a larger and constant degree of bending (radius of curvature).

Figure 7:
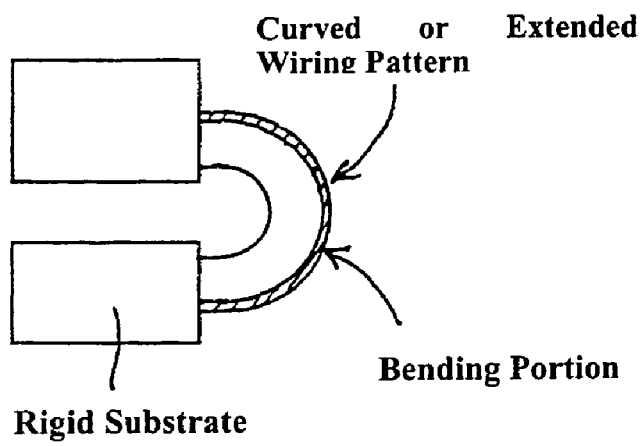
FIG. 7 schematically illustrates a flexible substrate having curved or extended wiring patterns formed on one side thereof.
Figure 8:
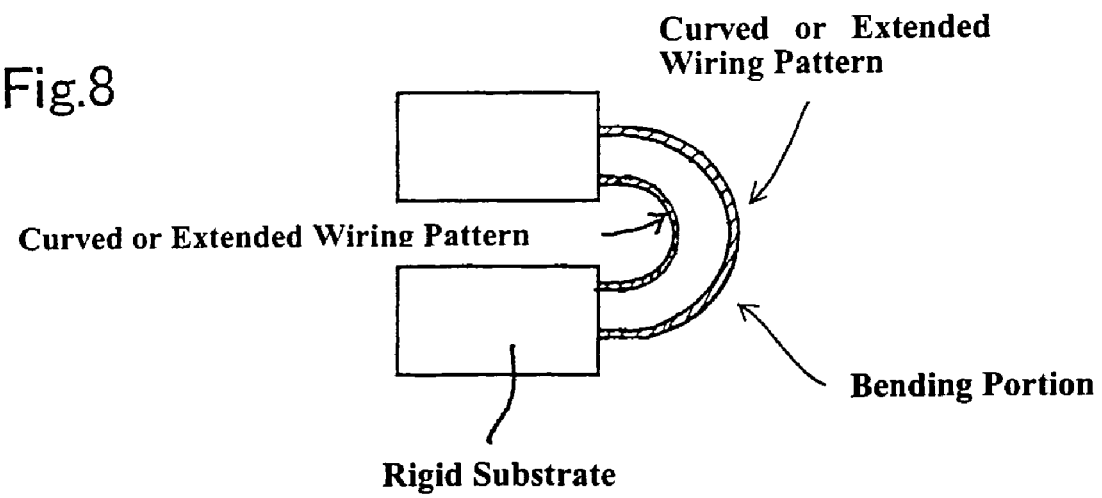
FIG. 8 schematically illustrates a flexible substrate having curved or extended wiring patterns formed on either side thereof.

That is, since swelling or curving a part of the wiring patterns provided on the inner or outer surface of the bending portion of the flexible substrate (as shown in FIG. 7) or on both the inner and outer surfaces of the bending portion (as shown in FIG. 8) permits to reduce the stretching ratio of the copper foil included in the wiring patterns, so the conductor circuit can be prevented from being broken or otherwise damaged and it is possible to bend the flexible substrate at the bending portion thereof largely with a constant radius of curvature.

In the flex-rigid printed wiring board as the embodiment of the present invention, the line width of the curve pattern as shown in FIG. 9(a) should desirably be larger than, and smaller than a double of, that of the wiring patterns provided on the non-bending portion to extend longitudinally. With a line width smaller than the wiring patterns at the non-bending portion, the wiring patterns will more easily be broken. On the other hand, if the line width exceeds the double of that of the wiring patterns the pattern will be too hard to bend and will reduce the wiring density.

Also, the curved pattern should desirably depict a circle whose radius R is 2 to 10 mm and the shortest distance X from the maximum curved portion of the curved pattern to the wiring patterns at the non-bending portion be $R/3 \leq X \leq R$. If the radius R is less than 2 mm, it will not be effective for bending the pattern. A radius exceeding 10 mm will reduce the wiring density.

Also, in the flex-rigid printed wiring board according to the embodiment of the present invention, the maximum line width of the extended pattern as shown in FIGS. 9(b) to 9(d) should preferably be larger than, and smaller than a double of, that of the wiring patterns provided at the non-bending portion to extend longitudinally. If the line width is smaller than that of the wiring patterns at the non-bending portion, the wiring patterns will more easily be broken and the internal resistance of the wiring will increase so that the electrical properties of the wiring patterns will be deteriorated. On the other hand, with a line width being larger than the double of that of the wiring patterns at the non-bending portion, it will possibly be difficult to increase the wiring density of the wiring patterns and deteriorate the electrical properties of the wiring patterns Further, the flexible substrate cannot be bent largely (namely, with a large radius of curvature).

Further, the extended pattern should preferably be formed on one or either side of the longitudinally extending wiring patterns for the latter not to easily be broken.

The extended or curved pattern should preferably be laid in an area 0.5 mm or more apart from the peripheral end of the substrate and being within the bending portion in order to prevent any trouble such as tearing of the insulative base material of the flexible substrate from the end frame of the latter. On the other hand, if the extended or curved pattern is laid in an area less than 0.5 mm from the peripheral end of the substrate, the base material will possibly be torn in the vicinity of the substrate end face, resulting in breakage of the wiring pattern.

Also, in the flex-rigid printed wiring board as the embodiment of the present invention in which the conductor circuit is provided on either side of the flexible substrate, a part of the wiring patterns formed on one side of the flexible substrate may be formed as an extended or curved pattern and also a part of the wiring patterns of the conductor circuit formed on the other side may be formed as an extended or curved pattern, in order to prevent easy breakage of the wiring pattern.

The extended or curved patterns on both sides of the flexible substrate should preferably be laid in places opposite to each other across the flexible substrate as shown in FIG. 10(a) or in staggered places as shown in FIG. 10(b). In the latter mode of arrangement of the extended or curved patterns, the flexible substrate is easy to bend and the wiring patterns are not easy to be broken.

In the flex-rigid printed wiring board as the embodiment of the present invention, the cover lay provided to cover and insulate the conductor circuit provided on the flexible substrate should preferably be formed from a flexible adhesive-coated copper foil, a flexible solder resist layer or a prepreg prepared by impregnating a glass cloth with epoxy resin and then drying it to the B stage. In this case, the insulation reliability and connection reliability are better than when a polyimide film (e.g., adhesive-coated polyimide) is used.

The above flexible resin-coated copper foil should desirably be about 50 μm in thickness of its resin. If the thickness is larger than 50 μm, the cover lay will not be easy to bend. On the other hand, with a thickness smaller than 50 μm, the insulation reliability of the cover lay will be lower.

Also, the flexible solder resist layer may be formed mainly from a thermosetting resin, thermoplastic resin, photosensitive resin or a thermosetting resin including (meta)acylic group. Preferably, the solder resist layer should be 20 to 50 μm. With a thickness of less than 20 μm, the insulation resistance will be lower. On the other hand, if the thickness exceeds 50 μm, the cover lay will not easily be bent.

Further, the prepreg formed by impregnating the glass cloth with epoxy resin and then drying it to the B stage should desirably be 20 to 50 μm thick. If the thickness is less than 20 μm, the insulation reliability will be lower. On the other hand, with a thickness of more than 50 μm, the cover lay will not be easy to bend.

Also, the cover lay on one side should preferably be different in thickness from the one on the other side. With this difference in thickness between the cover lays, the cover lay will be bent in a direction in which it deflects and thus have a larger and constant radius of curvature.

Different from the flexible substrate, the rigid substrate included in the flex-rigid printed wiring board according to the embodiment of the present invention has no flexibility and is so rigid that it will not easily be deformed irrespectively of its form, number of layers, method of forming, etc.

The insulative resin base material included in the rigid substrate may be a rigid one selected from among a glass fabric epoxy resin substrate, glass fabric bismaleimide triazine resin substrate, glass fabric polyphenylene ether resin substrate, aramid nonwoven fabric-epoxy resin substrate and aramid nonwoven fabric-polyimide resin substrate and the like. Among them, the glass fabric epoxy resin substrate is the most preferable one for the insulative resin base.

The insulative resin base should be on the order of 20 to 600 μm in thickness. With a thickness of less than 20 μm, the insulative resin base material is lower in strength and cannot easily be handled and the electrical insulation will be lower in reliability. If the thickness exceeds 600 μm, it will be difficult to form any fine via through the base material and fill the via with a conductive material, and the substrate itself will be thicker.

The insulative resin base material is plated on one side or both sides thereof with a copper foil having a thickness of 5 to 18 μm. If the thickness is smaller than 5 μm, an opening, formed by lasering, to form a via in the insulative resin base material will penetrate the base. On the contrary, with a thickness of more than 18 μm, it will be difficult to form, by etching, fine conductor circuit patterns.

The rigid substrate including the insulative resin base material and copper foil may use, among others, a single-sided copper clad laminate which can be formed by stacking a prepreg formed by impregnating a glass fabric with an epoxy resin and cured to the B stage and a copper foil and pressing them at a high temperature. Such a rigid substrate is excellent in accuracy of positioning without displacement of the wiring patterns and via-hole position during handling after etching the copper foil.

Note that the above conductor circuit formed on one or either side of the rigid substrate should preferably be formed by pressing, at a high temperature, a copper foil of about 5 to 18 μm in thickness via a resin adhesive layer kept in the B stage and then etching it appropriately.

The conductor circuit should preferably be formed by attaching an anti-etching film on the copper foil attached to the base surface, covering it with a mask having a specified circuit pattern and etching the copper foil to provide a conductor circuit including electrode pads (via-lands).

In the above conductor circuit forming process, a photo-sensitive dry film resist is first attached to the surface of the copper foil, then exposed to light along the specified circuit pattern and developed to form an etching resist, and the metal layer where no etching resist is formed is etched to provide a conductor circuit pattern including electrode pads.

The etchant used in the above process may be at least one selected among aqueous solutions of sulfuric acid-hydrogen peroxide, persulfate, cupric chloride and ferric chloride.

Also, in a pre-processing to form a conductor circuit by etching the copper foil, the entire surface of the copper foil may be pre-etched to thin the copper foil to a thickness of about 1 to 10 μm, more preferably, to a thickness of about 2 to 8 μm, in order to form a fine pattern more easily.

The shape, size and number of the interconnecting electrode pads formed on the rigid substrate are not limited any specific ones. For example, the pad should preferably be formed as a circle whose diameter is about 50 to 500 μm and at a plurality of places with a pitch of about 100 to 700 μm. With a pad diameter of less than 50 μm, the connection is not highly reliable. With a diameter exceeding 500 μm, the pad will has an increased area, which is disadvantageous for a higher packaging density.

In the insulative resin base material, there may be formed an opening for forming a via-hole (will be referred to as "via opening" hereunder). The via opening can be formed by lasering. More specifically, a transparent protective film, for example, a PET film, is attached to the surface of the insulative resin base, a carbon dioxide laser is irradiated from above the PET film to form an opening through the PET film, which extends from the surface of the insulative resin base to the copper foil. Under these processing conditions, the via opening should desirably have a diameter of about 50 to 250 μm.

Note that for removing resin left on the side and bottom surfaces of the via opening formed by the lasering, the insulative resin base material is subjected to desmearing. The desmearing is done by any of oxygen plasma discharge, corona discharge, ultraviolet laser irradiation and excimer laser irradiation. Also, the desmearing may be a wet desmearing using acid, oxidant or the like.

The via opening is filled with a conductive material to form a filled via-hole. The conductive material should preferably be a conductive paste or a metal plate formed by electroplating.

For manufacturing the flex-rigid printed wiring board with less cost and improved yield by simplifying the filled via-hole forming process, the via opening should preferably be filled with a conductive paste. For an improved connection reliability, the via opening should preferably be filled with a metal plate formed by electroplating. Among others, the electrolytic copper is preferable for filling in the via opening.

The conductive material may not only be filled in the via opening penetrating through the insulative resin base and extending to the conductor circuit but also be projected to a specified height out of the via opening. The projection should desirably be as high as falling within a range of 5 to 30 μm.

If the projection height is less than 5 μm, the connection is likely to be poor. With a projection height exceeding 30 μm, the resistance of the conductive material will be higher, and the conductive material will spread too much along the surface of the insulative resin base and no fine pattern can be formed when it is thermally deformed in the hot pressing process.

In the aforementioned flex-rigid printed wiring board (2) according to the embodiment of the present invention, the rigid and flexible substrates may be connected electrically to each other in any of various manners as in the flex-rigid printed wiring board (1). By adopting an arbitrary combination of the connecting manners, the substrate material can effectively be used and the substrates be connected to each other with a high freedom of wiring.

Note that in place of the aforementioned electrical connection between the flexible and rigid substrates to each other with the interconnecting electrode pads on these substrates being connected to each other via the conductor lumps as above, the connection may be made via the plated through-holes formed through the overlapping portions of the flexible and rigid substrates.

Note that in place of the aforementioned electrical connection between the flexible and rigid substrates to each other with the interconnecting electrode pads on these substrates being connected to each other via the conductor lumps as above, the electrical connection between the flexible and rigid substrates may be made via the plated through-hole formed through the overlapping portions of the flexible and rigid substrates. There will be illustrated and explained below an example of the method of manufacturing the flex-rigid printed wiring board in which the flexible and rigid substrates are electrically connected to each other via the plated through-hole.

First, on at least one side of an insulative base material formed by impregnating a glass cloth with epoxy resin or the like and drying it, there are formed longitudinally extending wiring patterns of a conductor circuit, and a part of the wiring patterns, positioned on the bending portion, is formed as an extended or curved pattern, A flexible substrate is thus prepared.

Next, a cover lay is formed to cover at least the surface having the extended or curved pattern formed thereon, a prepreg opened at a portion thereof where it is to be bent and a copper foil are stacked and then hot-pressed on either side of the flexible substrate to provide a stack.

A lasering opening is formed in the copper foil on the surface of the stack, a through-hole is formed through the flexible substrate by lasering under predetermined conditions, and then a copper plate layer is formed on the substrate surface including the inner wall of the through-hole, thereby forming a plated through-hole.

Then, wiring patterns are formed, by etching, on both the front and rear (or top and bottom) surfaces of the substrate having the copper plate layer formed thereon. Thus, the wiring patterns will electrically be connected via the plated through-hole to the wiring patterns formed on the flexible substrate.

Further, a solder-resist layer is formed, then wiring patterns are formed, by processing with a rooter, on at least one side. A part of the wiring patterns, positioned at the bending portion, is formed into an extended or curved pattern to form a bendable portion. Thus, there is provided a flex-rigid printed wiring board including the flexible portion.

The flex-rigid printed wiring board as an embodiment of the present invention will be illustrated and explained in further detail concerning examples of the present invention.

Example 1

Figure 11A:
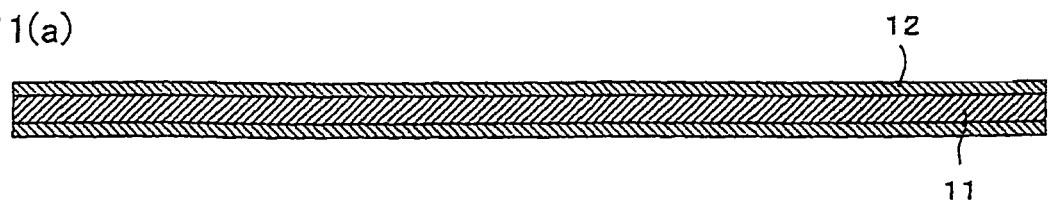
FIGS. 11(a) to 11(c) show the process of preparing a flexible substrate included in a flex-rigid printed wiring board according to a example 1 of the present invention.

(A) Preparation of a Flexible Substrate (1) As a starting material for a flexible substrate 100A as a member to manufacture a flex-rigid printed wiring board according to an embodiment of the present invention, there was used a 50 μm-thick double-sided copper-clad laminate (E-67 by HITACHI CHEMICAL) in which an 18 μm-thick copper foil 12 was laminated on either side of an insulative base material 11 formed by impregnating a 20 μm-thick glass cloth (whose thickness may be less than 30 μm and whose glass fibers had a mean thickness of 4.0 μm) with epoxy resin and drying it. See FIG. 11(a).

Figure 11B:
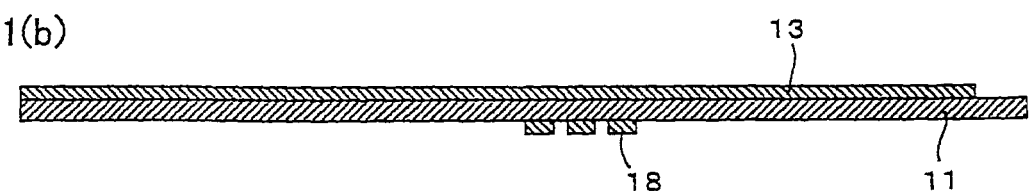

(2) The copper foil 12 laminated on either side of the insulative film 11 was etched with a cupric chloride aqueous-solution to form a conductor circuit pattern 13 whose line width was 300 μm and 250 μm-diameter interconnecting electrode pads 16 on one side of the insulative base material. A lattice-shaped dummy pattern 18 (having formed therein openings each having a rectangular shape and an area of 10,000 μm$^2$, the ratio between the sum of the areas of all the openings and the area of the rest of the lattice pattern being 10:10) was formed around the bending portion on the surface opposite to the surface on which the wiring patterns of the conductor circuit were formed. See FIG. 11(b).

Figure 11C:
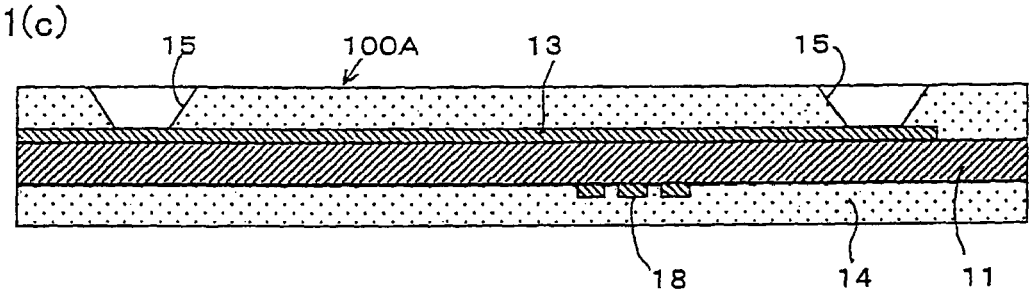

(3) A solder resist (NPR-90 by NIPPON POLYTECH) was coated over the wiring patterns 13 by screen-printing, dried and then exposed to light of 400 mj/cm$^2$ and further dried at 150° C. for one hour to form a 20 μm-thick resin-made cover layer 14 which protects the wiring patterns 13. See FIG. 11(c).

Note that the cover layer 14 had formed therein 300 μm-diameter openings 15 reaching the interconnecting electrode pads 16 and through which the conductor lumps provided on the interconnecting electrode pads on rigid substrates which will further be described later were to electrically be connected to the interconnecting electrode pads 16.

Figure 12A:
FIGS. 12(a) to 12(f) show the process of preparing a rigid substrate also included in the flex-rigid printed wiring board according to the example 1 of the present invention.
Figure 12B:
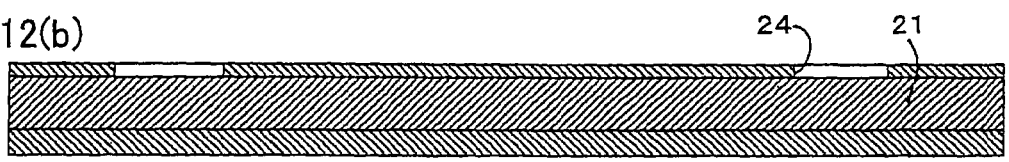
Figure 12C:

(B) Preparation of a Rigid Substrate (1) Lasering openings 24 were made, by etching with a cupric chloride aqueous-solution, in one side of a 0.11 mm-thick double-sided copper clad laminate (R-1766 by MATSUSHITA ELECTRIC; see FIG. 12(a)) including a glass epoxy resin substrate 21 having a 12 μm-thick copper foil 22 laminated on either side thereof, and further 250 μm-diameter openings 26 for filling copper plate were formed in the double-sided copper-clad laminate by irradiating carbon-dioxide laser. See FIGS. 12(b) and 12(c).

Figure 12D:

(2) Further, a Pd catalyst was applied to the inner wall of the opening (through-hole) 26, the inner wall was plated with copper by electroless plating with a plating solution and under conditions as will be given below, and then plated with electrolytic copper, to thereby fill a copper plate 28 in each of the openings 26. See FIG. 12(d).

Electroless Copper Plating Solution:

| | |
|---|---|
| Copper sulfate | 10 g/liter |
| HCHO | 8 g/liter |
| NaOH | 5 g/liter |
| Rochelle salt | 45 g/liter |
| Temperature | 30° C. |

Electrolytic Copper Plating Solution:

| | |
|---|---|
| Sulfuric acid | 180 g/liter |
| Copper sulfate | 80 g/liter |
| CAPARACID GL (by ATOTEK Japan) | 1 ml/liter |

Plating Conditions:

| | |
|---|---|
| Current density | 2 A/dm$^2$ |
| Time | 30 min |
| Temperature | 25° C. |

Figure 12E:
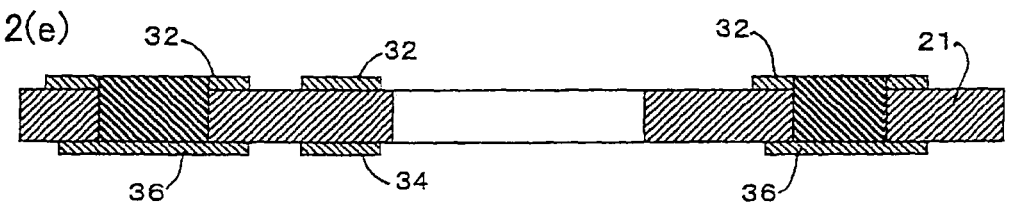

(3) Both sides of the substrate with the copper plate 28 filled in the openings 26 were etched using the cupric chloride aqueous-solution to form patterns 32 and 34 on the front and rear sides of the substrate, and a part of the pattern 34 was formed into an interconnecting electrode pad 36. Further, the outer surface of the substrate was processed using a rooter (as in FIG. 12(e)).

Figure 12F:
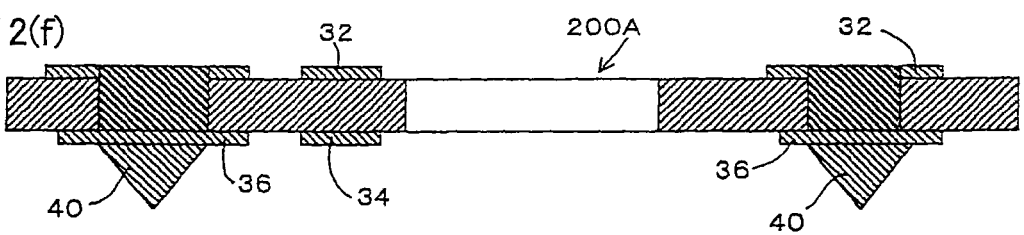
Figure 15A:
FIGS. 15(a) to 15(g) show the process of manufacturing a flex-rigid printed wiring board according a example 35 of the present invention.
Figure 15B:
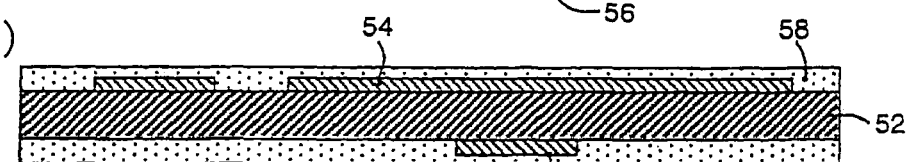
Figure 15C:
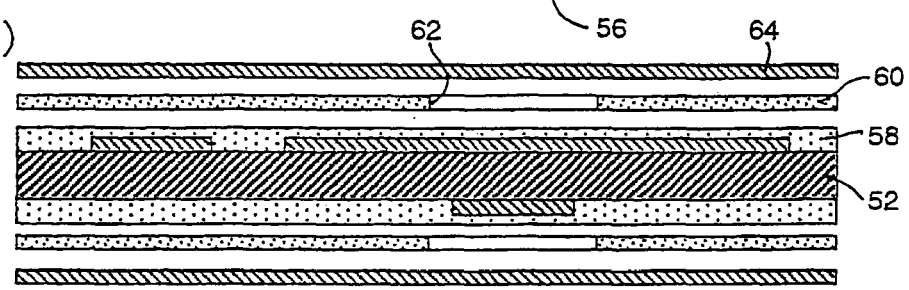
Figure 15D:
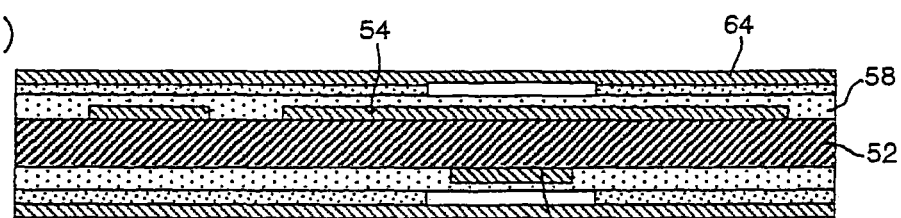
Figure 15E:
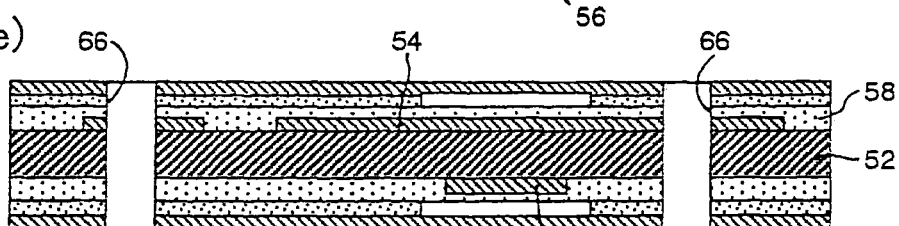
Figure 15F:
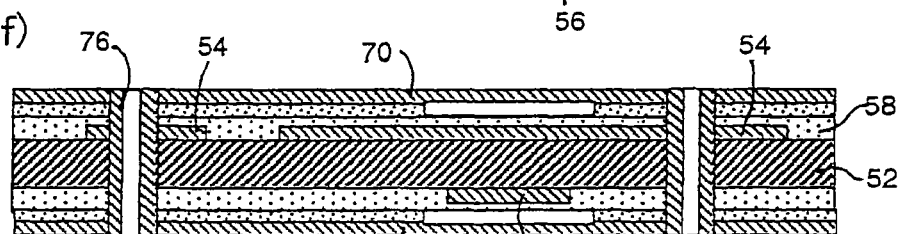
Figure 15G:
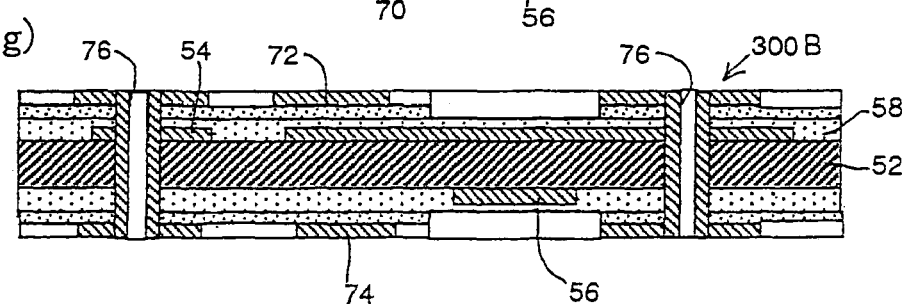

(4) Next, conical projections 40, namely, solder bumps, were formed on the interconnecting electrode pads 36 by filling a silver paste (SOLAMET by DU PONT) into a metal mask having a conical opening formed therein with the use of a squeegee. Further, the conical projections 40 were cured by heating at 150° C. for one hour to form a rigid substrate 200A. See FIG. 12(f).

(C) Stacking of the Substrates (1) The conical projection 40 on the rigid substrate 200A prepared in the above process (B) was pierced through a prepreg 42 (GIA-671N by HITACHI CHEMICAL) under a pressure of 10 kg/cm$^2$. See FIG. 13.

(2) Next, the flexible substrate 100A prepared in the above process (A) and the rigid substrate 200A were stacked one on the other and hot-pressed at 180° C. with a pressure of 40 kg/cm$^2$ to provide a flex-rigid printed wiring board 300A in which the flexible and rigid substrates 100A and 200A were connected to each other via the conical projections 40. See FIG. 14.

Example 2

There was manufactured a flex-rigid printed wiring board 300A similar to the example 1 except that there was formed around the bending portion of the flexible substrate a lattice-shaped dummy pattern 18 having formed therein openings each having a rectangular shape and an area of 40,000 μm$^2$, the ratio between the sum of the areas of all the openings and the area of the rest of the lattice pattern being 9:10.

Example 3

There was manufactured a flex-rigid printed wiring board 300A similar to the example 1 except that there was formed around the bending portion of the flexible substrate a lattice-shaped dummy pattern 18 having formed therein openings each having a rectangular shape and an area of 90,000 $\mu m^2$, the ratio between the sum of the areas of all the openings and the area of the rest of the lattice pattern being 11:10.

Example 4

There was manufactured a flex-rigid printed wiring board 300A similar to the example 1 except that there was formed around the bending portion of the flexible substrate a lattice-shaped dummy pattern 18 having formed therein openings each having a rectangular shape and an area of 90,000 $\mu m^2$, the ratio between the sum of the areas of all the openings and the area of the rest of the lattice pattern being 1:9.

Example 5

There was manufactured a flex-rigid printed wiring board 300A similar to the example 1 except that there was formed around the bending portion of the flexible substrate a lattice-shaped dummy pattern 18 having formed therein openings each having a rectangular shape and an area of 90,000 $\mu m^2$, the ratio between the sum of the areas of all the openings and the area of the rest of the lattice pattern being 2:8.

Example 6

There was manufactured a flex-rigid printed wiring board 300A similar to the example 1 except that there was formed around the bending portion of the flexible substrate a lattice-shaped dummy pattern 18 having formed therein openings each having a rectangular shape and an area of 90,000 $\mu m^2$, the ratio between the sum of the areas of all the openings and the area of the rest of the lattice pattern being 8:2.

Example 7

There was manufactured a flex-rigid printed wiring board 300A similar to the example 1 except that there was formed around the bending portion of the flexible substrate a lattice-shaped dummy pattern 18 having formed therein openings each having a rectangular shape and an area of 90,000 $\mu m^2$, the ratio between the sum of the areas of all the openings and the area of the rest of the lattice pattern being 9:1.

Example 8

There was manufactured a flex-rigid printed wiring board 300A similar to the example 1 except that there was formed around the bending portion of the flexible substrate a lattice-shaped dummy pattern 18 having formed therein openings each having a circular shape and an area of 7,850 $\mu m^2$, the ratio between the sum of the areas of all the openings and the area of the rest of the lattice pattern being 10:10.

Example 9

There was manufactured a flex-rigid printed wiring board 300A similar to the example 1 except that there was formed around the bending portion of the flexible substrate a lattice-shaped dummy pattern 18 having formed therein openings each having a circular shape and an area of 49,087 $\mu m^2$, the ratio between the sum of the areas of all the openings and the area of the rest of the lattice pattern being 10:9.

Example 10

There was manufactured a flex-rigid printed wiring board 300A similar to the example 1 except that there was formed around the bending portion of the flexible substrate a lattice-shaped dummy pattern 18 having formed therein openings each having a circular shape and an area of 125,600 $\mu m^2$, the ratio between the sum of the areas of all the openings and the area of the rest of the lattice pattern being 11:10.

Example 11

There was manufactured a flex-rigid printed wiring board 300A similar to the example 1 except that there was formed around the bending portion of the flexible substrate a lattice-shaped dummy pattern 18 having formed therein openings each having a circular shape and an area of 125,600 $\mu m^2$, the ratio between the sum of the areas of all the openings and the area of the rest of the lattice pattern being 1:9.

Example 12

There was manufactured a flex-rigid printed wiring board 300A similar to the example 1 except that there was formed around the bending portion of the flexible substrate a lattice-shaped dummy pattern 18 having formed therein openings each having a circular shape and an area of 125,600 $\mu m^2$, the ratio between the sum of the areas of all the openings and the area of the rest of the lattice pattern being 2:8.

Example 13

There was manufactured a flex-rigid printed wiring board 300A similar to the example 1 except that there was formed around the bending portion of the flexible substrate a lattice-shaped dummy pattern 18 having formed therein openings each having a circular shape and an area of 125,600 $\mu m^2$, the ratio between the sum of the areas of all the openings and the area of the rest of the lattice pattern being 8:2.

Example 14

There was manufactured a flex-rigid printed wiring board 300A similar to the example 1 except that there was formed around the bending portion of the flexible substrate a lattice-shaped dummy pattern 18 having formed therein openings each having a circular shape and an area of 125,600 $\mu m^2$, the ratio between the sum of the areas of all the openings and the area of the rest of the lattice pattern being 9:1.

Example 15

There was manufactured a flex-rigid printed wiring board 300A similar to the example 1 except that there was formed around the bending portion of the flexible substrate a lattice-shaped dummy pattern 18 having formed therein openings each having rounded angular corners and an area of 10,025 $\mu m^2$, the ratio between the sum of the areas of all the openings and the area of the rest of the lattice pattern being 10:10.

Example 16

There was manufactured a flex-rigid printed wiring board 300A similar to the example 1 except that there was formed around the bending portion of the flexible substrate a lattice-shaped dummy pattern 18 having formed therein square openings each having rounded angular corners and an area of 40,090 $\mu m^2$, the ratio between the sum of the areas of all the openings and the area of the rest of the lattice pattern being 9:10.

Example 17

There was manufactured a flex-rigid printed wiring board 300A similar to the example 1 except that there was formed around the bending portion of the flexible substrate a lattice-shaped dummy pattern 18 having formed therein square openings each having rounded angular corners and an area of 90,123 $\mu m^2$, the ratio between the sum of the areas of all the openings and the area of the rest of the lattice pattern being 11:10.

Example 18

There was manufactured a flex-rigid printed wiring board 300A similar to the example 1 except that there was formed around the bending portion of the flexible substrate a lattice-shaped dummy pattern 18 having formed therein square openings each having rounded angular corners and an area of 90,123 $\mu m^2$, the ratio between the sum of the areas of all the openings and the area of the rest of the lattice pattern being 1:9.

Example 19

There was manufactured a flex-rigid printed wiring board 300A similar to the example 1 except that there was formed around the bending portion of the flexible substrate a lattice-shaped dummy pattern 18 having formed therein square openings each having rounded angular corners and an area of 90,123 $\mu m^2$, the ratio between the sum of the areas of all the openings and the area of the rest of the lattice pattern being 2:8.

Example 20

There was manufactured a flex-rigid printed wiring board 300A similar to the example 1 except that there was formed around the bending portion of the flexible substrate a lattice-shaped dummy pattern 18 having formed therein square openings each having rounded angular corners and an area of 90,123 $\mu m^2$, the ratio between the sum of the areas of all the openings and the area of the rest of the lattice pattern being 8:2.

Example 21

There was manufactured a flex-rigid printed wiring board 300A similar to the example 1 except that there was formed around the bending portion of the flexible substrate a lattice-shaped dummy pattern 18 having formed therein square openings each having rounded angular corners and an area of 90,123 $\mu m^2$, the ratio between the sum of the areas of all the openings and the area of the rest of the lattice pattern being 9:1.

Example 22

There was manufactured a flex-rigid printed wiring board 300A similar to the example 1 except that there was formed around the bending portion of the flexible substrate a lattice-shaped dummy pattern 18 having formed therein circular openings staggered in relation to each other and each having rounded angular corners and an area of 49,087 $\mu m^2$, the ratio between the sum of the areas of all the openings and the area of the rest of the lattice pattern being 10:10.

Example 23

There was manufactured a flex-rigid printed wiring board 300A similar to the example 1 except that there was formed around the bending portion of the flexible substrate a lattice-shaped dummy pattern 18 having formed therein circular openings staggered in relation to each other and each having rounded angular corners and an area of 49,087 $\mu m^2$, the ratio between the sum of the areas of all the openings and the area of the rest of the lattice pattern being 1:9.

Example 24

There was manufactured a flex-rigid printed wiring board 300A similar to the example 1 except that there was formed around the bending portion of the flexible substrate a lattice-shaped dummy pattern 18 having formed therein circular openings staggered in relation to each other and each having rounded angular corners and an area of 49,087 $\mu m^2$, the ratio between the sum of the areas of all the openings and the area of the rest of the lattice pattern being 9:1.

Example 25

There was manufactured a flex-rigid printed wiring board 300A similar to the example 1 except that there was formed around the bending portion of the flexible substrate a lattice-shaped dummy pattern 18 having formed therein circular openings each having an area of 49,087 $\mu m^2$ and circular openings each having an area of 10,000 $\mu m^2$, these two types of openings being laid alternately and the ratio between the sum of the areas of all the openings and the area of the rest of the lattice pattern being 10:10.

Example 26

There was manufactured a flex-rigid printed wiring board 300A similar to the example 1 except that there was formed around the bending portion of the flexible substrate a lattice-shaped dummy pattern 18 having formed therein circular openings each having an area of 49,087 $\mu m^2$ and circular openings each having an area of 10,000 $\mu m^2$, these two types of openings being laid alternately and the ratio between the sum of the areas of all the openings and the area of the rest of the lattice pattern being 1:9.

Example 27

There was manufactured a flex-rigid printed wiring board 300A similar to the example 1 except that there was formed around the bending portion of the flexible substrate a lattice-shaped dummy pattern 18 having formed therein circular openings each having an area of 49,087 $\mu m^2$ and circular openings each having an area of 10,000 $\mu m^2$, these two types of openings being laid alternately and the ratio between the sum of the areas of all the openings and the area of the rest of the lattice pattern being 9:1.

Example 28

There was manufactured a flex-rigid printed wiring board 300A similar to the example 1 except that there was formed around the bending portion of the flexible substrate a solid pattern (15 mm×15 mm) having no openings formed therein.

Comparative Example 1

There was manufactured a flex-rigid printed wiring board similar to the example 1 except that no dummy pattern was formed.

Example 29

There was manufactured a flex-rigid printed wiring board 300A similar to the example 1 except that six linear dummy patterns whose sectional shape was rectangular and line width was 150 μm were formed around the bending portion with a distance of 30 μm between adjacent ones thereof.

Example 30

There was manufactured a flex-rigid printed wiring board 300A similar to the example 1 except that six linear dummy patterns whose sectional shape was rectangular and line width was 200 μm were formed around the bending portion with a distance of 50 μm between adjacent ones thereof.

Example 31

There was manufactured a flex-rigid printed wiring board 300A similar to the example 1 except that six linear dummy patterns whose sectional shape was rectangular and line width was 250 μm were formed around the bending portion with a distance of 60 μm between adjacent ones thereof.

Example 32

There was manufactured a flex-rigid printed wiring board 300A similar to the example 1 except that six linear dummy patterns whose sectional shape was trapezoidal and 75 deg. in bottom angle and line width was 150 μm were formed around the bending portion with a distance of 30 μm between adjacent ones thereof.

Example 33

There was manufactured a flex-rigid printed wiring board 300A similar to the example 1 except that six linear dummy patterns whose sectional shape was trapezoidal and 60 deg. in bottom angle and line width was 200 μm were formed around the bending portion with a distance of 50 μm between adjacent ones thereof.

Example 34

There was manufactured a flex-rigid printed wiring board 300A similar to the example 1 except that six linear dummy patterns whose sectional shape was trapezoidal and 45 deg. in bottom angle and line width was 250 μm were formed around the bending portion with a distance of 60 μm between adjacent ones thereof.

Reference Example 1

There was manufactured a flex-rigid printed wiring board 300A similar to the example 1 except that six linear dummy patterns whose sectional shape was rectangular and line width was 140 μm were formed around the bending portion with a distance of 20 μm between adjacent ones thereof.

Reference Example 2

There was manufactured a flex-rigid printed wiring board 300A similar to the example 1 except that six linear dummy patterns whose sectional shape was trapezoidal and 75 deg. in bottom angle and line width was 140 μm were formed around the bending portion with a distance of 20 μm between adjacent ones thereof.

Example 35

There was manufactured a flex-rigid printed wiring board 300A similar to the example 1 except that as a starting material for a flexible substrate, there was used a 50 μm-thick double-sided copper-clad laminate formed by hot-pressing of an 18 μm-thick copper foil 12 on either side of an insulative base material 11 formed by drying a 20 μm-thick glass cloth (whose glass fibers had a mean thickness of 1.5 μm) impregnated with epoxy resin to cure the epoxy resin and six linear dummy patterns whose sectional shape was rectangular and line width was 100 μm were formed around the bending portion with a distance of 40 μm between adjacent ones thereof.

Example 36

There was manufactured a flex-rigid printed wiring board 300A similar to the example 1 except that as a starting material for a flexible substrate, there was used a 50 μm-thick double-sided copper-clad laminate formed by hot-pressing of an 18 μm-thick copper foil 12 on either side of an insulative base material 11 formed by drying a 20 μm-thick glass cloth (whose glass fibers had a mean thickness of 3.0 μm) impregnated with epoxy resin to cure the epoxy resin and six linear dummy patterns whose sectional shape was rectangular and line width was 100 μm were formed around the bending portion with a distance of 40 μm between adjacent ones thereof.

Example 37

There was manufactured a flex-rigid printed wiring board 300A similar to the example 1 except that as a starting material for a flexible substrate, there was used a 50 μm-thick double-sided copper-clad laminate formed by hot-pressing of an 18 μm-thick copper foil 12 on either side of an insulative base material 11 formed by drying a 20 μm-thick glass cloth (whose glass fibers had a mean thickness of 4.0 μm) impregnated with epoxy resin to cure the epoxy resin and six linear dummy patterns whose sectional shape was rectangular and line width was 100 μm were formed around the bending portion with a distance of 40 μm between adjacent ones thereof.

Example 38

There was manufactured a flex-rigid printed wiring board 300A similar to the example 1 except that as a starting material for a flexible substrate, there was used a 60 μm-thick double-sided copper-clad laminate formed by hot-pressing of an 18 μm-thick copper foil 12 on either side of an insulative base material 11 formed by drying a 30 μm-thick glass cloth (whose glass fibers had a mean thickness of 5.0 μm) impregnated with epoxy resin to cure the epoxy resin and six linear dummy patterns whose sectional shape was rectangular and line width was 100 μm were formed around the bending portion with a distance of 40 μm between adjacent ones thereof.

Example 39

There was manufactured a flex-rigid printed wiring board 300A similar to the example 1 except that as a starting material for a flexible substrate, there was used a 100 μm-thick double-sided copper-clad laminate formed by hot-pressing of an 18 μm-thick copper foil 12 on either side of an insulative base material 11 formed by drying a 60 μm-thick glass cloth (whose glass fibers had a mean thickness of 5.0 μm) impregnated with epoxy resin to cure the epoxy resin and six linear dummy patterns whose sectional shape was rectangular and line width was 100 μm were formed around the bending portion with a distance of 40 μm between adjacent ones thereof.

Example 40

There was manufactured a flex-rigid printed wiring board 300A similar to the example 1 except that as a starting material for a flexible substrate, there was used a 50 μm-thick double-sided copper-clad laminate formed by hot-pressing of an 18 μm-thick copper foil 12 on either side of an insulative base material 11 formed by drying a 20 μm-thick glass cloth (whose glass fibers had a mean thickness of 1.5 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Example 41

There was manufactured a flex-rigid printed wiring board 300A similar to the example 1 except that as a starting material for a flexible substrate, there was used a 50 μm-thick double-sided copper-clad laminate formed by hot-pressing of an 18 μm-thick copper foil 12 on either side of an insulative base material 11 formed by drying a 20 μm-thick glass cloth (whose glass fibers had a mean thickness of 3.0 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Example 42

There was manufactured a flex-rigid printed wiring board 300A similar to the example 1 except that as a starting material for a flexible substrate, there was used a 50 μm-thick double-sided copper-clad laminate formed by hot-pressing of an 18 μm-thick copper foil 12 on either side of an insulative base material 11 formed by drying a 20 μm-thick glass cloth (whose glass fibers had a mean thickness of 4.0 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Example 43

There was manufactured a flex-rigid printed wiring board 300A similar to the example 1 except that as a starting material for a flexible substrate, there was used a 60 μm-thick double-sided copper-clad laminate formed by hot-pressing of an 18 μm-thick copper foil 12 on either side of an insulative base material 11 formed by drying a 30 μm-thick glass cloth (whose glass fibers had a mean thickness of 5.0 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Example 44

There was manufactured a flex-rigid printed wiring board 300A similar to the example 1 except that as a starting material for a flexible substrate, there was used a 100 μm-thick double-sided copper-clad laminate formed by hot-pressing of an 18-m-thick copper foil 12 on either side of an insulative base material 11 formed by drying a 60 μm-thick glass cloth (whose glass fibers had a mean thickness of 5.0 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Reference Example 3

There was manufactured a flex-rigid printed wiring board 300A similar to the example 1 except that as a starting material for a flexible substrate, there was used a 50 μm-thick double-sided copper-clad laminate formed by hot-pressing of an 18 μm-thick copper foil 12 on either side of an insulative base material 11 formed by drying a 15 μm-thick glass cloth (whose glass fibers had a mean thickness of 4.0 μm) impregnated with epoxy resin to cure the epoxy resin and six linear dummy patterns whose sectional shape was rectangular and line width was 100 μm were formed around the bending portion with a distance of 40 μm between adjacent ones thereof.

Reference Example 4

There was manufactured a flex-rigid printed wiring board 300A similar to the example 1 except that as a starting material for a flexible substrate, there was used a 150 μm-thick double-sided copper-clad laminate formed by hot-pressing of an 18 μm-thick copper foil 12 on either side of an insulative base material 11 formed by drying a 100 μm-thick glass cloth (whose glass fibers had a mean thickness of 7.0 μm) impregnated with epoxy resin to cure the epoxy resin and six linear dummy patterns whose sectional shape was rectangular and line width was 100 μm were formed around the bending portion with a distance of 40 μm between adjacent ones thereof.

Reference Example 5

There was manufactured a flex-rigid printed wiring board 300A similar to the example 1 except that as a starting material for a flexible substrate, there was used a 50 μm-thick double-sided copper-clad laminate formed by hot-pressing of an 18 μm-thick copper foil 12 on either side of an insulative base material 11 formed by drying a 15 μm-thick glass cloth (whose glass fibers had a mean thickness of 4.0 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Reference Example 6

There was manufactured a flex-rigid printed wiring board 300A similar to the example 1 except that as a starting material for a flexible substrate, there was used a 150 μm-thick double-sided copper-clad laminate formed by hot-pressing of an 18 μm-thick copper foil 12 on either side of an insulative base material 11 formed by drying a 100 µm-thick glass cloth (whose glass fibers had a mean thickness of 7.0 µm) impregnated with epoxy resin to cure the epoxy resin and six linear dummy patterns whose sectional shape was trapezoidal and 70 deg. in boot angle and line width was 100 µm were formed around the bending portion with a distance of 40 µm between adjacent ones thereof.

Example 45

(1) As a starting material for a flexible substrate 100B as a member to manufacture a flex-rigid printed wiring board according to an embodiment of the present invention, there was used a 50 µm-thick double-sided copper-clad laminate (E-67 by HITACHI CHEMICAL) in which an 18 µm-thick copper foil was laminated on either side of an insulative base material 52 formed by impregnating a 20 µm-thick glass cloth (whose thickness may be less than 30 µm and whose glass fibers had a mean thickness of 4.0 µm) with epoxy resin and drying it.

(2) First, a dry film resist was laminated on either side of a 0.05 mm-thick double-sided copper clad laminate, exposed and developed to provide an etching resist. Then, the etching resist was etched with a cupric chloride aqueous-solution to form wiring patterns 54 of a conductor circuit, whose line width was 300 µm on the one side and a lattice-shaped dummy pattern 56 (having formed therein openings each having a rectangular shape and an area of 10,000 µm$^2$, the ratio between the sum of the areas of all the openings and the area of the rest of the lattice pattern being 10:10), around the bending portion, on the side opposite to the surface on which the wiring patterns of the conductor circuit were formed. See FIG. 15(*a*).

(3) A solder resist (NPR-90 by NIPPON POLYTECH) was coated, by screen-printing, on either side of the substrate having formed thereon the wiring patterns 54 and dummy pattern 56, exposed to light of 400 mj/cm$^2$ and dried at 150° C. for one hour to form a cover layer 58. See FIG. 15(*b*).

(4) A prepreg 60 (R-1661 by MATSUSHITA ELECTRIC) opened (indicated at a reference numeral 62) at a portion where it is to be bent and a 12 µm-thick copper foil 64 were stacked on either side having the cover layer 58 formed thereon (see FIG. 15(*c*)), and the stack was hot-pressed under a pressure of 35 kg/cm$^2$ at 180° C. (see FIG. 15(*d*)).

(5) The surface of the stack formed as in step (4) above was irradiated with carbon dioxide laser under predetermined conditions to form 100 µm-diameter openings 66 in the copper foil 64, and carbon dioxide laser was further irradiated through the openings 66 under different conditions to form through-holes 68 whose diameter was 300 µm through the substrate. See FIG. 15(*e*).

After the lasering, the through-holes 68 were desmeared with a solution of permanganic acid to remove smears residing in the through-holes 68

(6) Further, a Pd catalyst was applied to the inner wall of the openings (through-holes) 68 formed in step (5) above, the inner wall was plated with copper by electroless plating with a plating solution and under conditions as will be given below, and then plated with electrolytic copper to form copper-plated layers 70 in the entire substrate including the inner wall of the through-holes 68. See FIG. 15(*f*).

Thus, plated through-holes 76 were formed.

Electroless Copper Plating Solution:

| | |
|---|---|
| Copper sulfate | 10 g/liter |
| HCHO | 8 g/liter |
| NaOH | 5 g/liter |
| Rochelle salt | 45 g/liter |
| Temperature | 30° C. |

Electrolytic Copper Plating Solution:

| | |
|---|---|
| Sulfuric acid | 180 g/liter |
| Copper sulfate | 80 g/liter |
| CAPARACID GL (by ATOTEK Japan) | 1 ml/liter |

Plating Conditions:

| | |
|---|---|
| Current density | 2 A/dm$^2$ |
| Time | 30 min |
| Temperature | 25° C. |

(7) Next, a dry film resist was laminated on either side of the substrate having the copper plate layer 70 formed thereon in step (6) above, exposed and developed to form an etching resist, and then etched with a cupric chloride aqueous-solution to form wiring patterns 72 and 74 on the front and rear sides, respectively, of the substrate.

The wiring patterns 72 and 74 were electrically connected to the wiring patterns 54 formed on the flexible substrate 52 via the plated through-holes 76. See FIG. 15(*g*).

(8) Further, a solder resist layer was formed, and then the outer surface of the substrate was processed by a rooter to provide the flex-rigid printed wiring board 300B having the wiring patterns 54 on the front side thereof and the dummy pattern 56 on the rear side.

Example 46

There was manufactured a flex-rigid printed wiring board 300B similar to the example 45 except that there was formed around the bending portion of the flexible substrate a lattice-shaped dummy pattern 56 having formed therein openings each having a rectangular shape and an area of 40,000 µm$^2$, the ratio between the sum of the areas of all the openings and the area of the rest of the lattice pattern being 9:10.

Example 47

There was manufactured a flex-rigid printed wiring board 300B similar to the example 45 except that there was formed around the bending portion of the flexible substrate a lattice-shaped dummy pattern 56 having formed therein openings each having a rectangular shape and an area of 90,000 µm$^2$, the ratio between the sum of the areas of all the openings and the area of the rest of the lattice pattern being 11:10.

Example 48

There was manufactured a flex-rigid printed wiring board 300B similar to the example 45 except that there was formed around the bending portion of the flexible substrate a lattice-shaped dummy pattern 18 having formed therein openings each having a rectangular shape and an area of 90,000 µm$^2$, the ratio between the sum of the areas of all the openings and the area of the rest of the lattice pattern being 1:9.

Example 49

There was manufactured a flex-rigid printed wiring board 300B similar to the example 45 except that there was formed around the bending portion of the flexible substrate a lattice-shaped dummy pattern 18 having formed therein openings each having a rectangular shape and an area of 90,000 µm², the ratio between the sum of the areas of all the openings and the area of the rest of the lattice pattern being 2:8.

Example 50

There was manufactured a flex-rigid printed wiring board 300B similar to the example 45 except that there was formed around the bending portion of the flexible substrate a lattice-shaped dummy pattern 18 having formed therein openings each having a rectangular shape and an area of 90,000 µm², the ratio between the sum of the areas of all the openings and the area of the rest of the lattice pattern being 8:2.

Example 51

There was manufactured a flex-rigid printed wiring board 300B similar to the example 45 except that there was formed around the bending portion of the flexible substrate a lattice-shaped dummy pattern 18 having formed therein openings each having a rectangular shape and an area of 90,000 µm², the ratio between the sum of the areas of all the openings and the area of the rest of the lattice pattern being 9:1.

Working Pattern 52:

There was manufactured a flex-rigid printed wiring board 300B similar to the example 45 except that there was formed around the bending portion of the flexible substrate a lattice-shaped dummy pattern 56 having formed therein openings each having a circular shape and an area of 7,850 µm², the ratio between the sum of the areas of all the openings and the area of the rest of the lattice pattern being 10:10.

Example 53

There was manufactured a flex-rigid printed wiring board 300B similar to the example 45 except that there was formed around the bending portion of the flexible substrate a lattice-shaped dummy pattern 56 having formed therein openings each having a circular shape and an area of 49,087 µm², the ratio between the sum of the areas of all the openings and the area of the rest of the lattice pattern being 9:10.

Example 54

There was manufactured a flex-rigid printed wiring board 300B similar to the example 45 except that there was formed around the bending portion of the flexible substrate a lattice-shaped dummy pattern 56 having formed therein openings each having a circular shape and an area of 125,600 µm², the ratio between the sum of the areas of all the openings and the area of the rest of the lattice pattern being 11:10.

Example 55

There was manufactured a flex-rigid printed wiring board 300B similar to the example 45 except that there was formed around the bending portion of the flexible substrate a lattice-shaped dummy pattern 18 having formed therein openings each having a circular shape and an area of 125,600 µm², the ratio between the sum of the areas of all the openings and the area of the rest of the lattice pattern being 1:9.

Example 56

There was manufactured a flex-rigid printed wiring board 300B similar to the example 45 except that there was formed around the bending portion of the flexible substrate a lattice-shaped dummy pattern 18 having formed therein openings each having a circular shape and an area of 125,600 µm², the ratio between the sum of the areas of all the openings and the area of the rest of the lattice pattern being 2:8.

Example 57

There was manufactured a flex-rigid printed wiring board 300B similar to the example 45 except that there was formed around the bending portion of the flexible substrate a lattice-shaped dummy pattern 18 having formed therein openings each having a circular shape and an area of 125,600 µm², the ratio between the sum of the areas of all the openings and the area of the rest of the lattice pattern being 8:2.

Example 58

There was manufactured a flex-rigid printed wiring board 300B similar to the example 45 except that there was formed around the bending portion of the flexible substrate a lattice-shaped dummy pattern 18 having formed therein openings each having a circular shape and an area of 125,600 µm², the ratio between the sum of the areas of all the openings and the area of the rest of the lattice pattern being 9:1.

Example 59

There was manufactured a flex-rigid printed wiring board 300B similar to the example 45 except that there was formed around the bending portion of the flexible substrate a lattice-shaped dummy pattern 56 having formed therein openings each having rounded angular corners and an area of 10,025 µm², the ratio between the sum of the areas of all the openings and the area of the rest of the lattice pattern being 10:10.

Example 60

There was manufactured a flex-rigid printed wiring board 300B similar to the example 45 except that there was formed around the bending portion of the flexible substrate a lattice-shaped dummy pattern 56 having formed therein square openings each having rounded angular corners and an area of 40,090 µm², the ratio between the sum of the areas of all the openings and the area of the rest of the lattice pattern being 9:10.

Example 61

There was manufactured a flex-rigid printed wiring board 300B similar to the example 45 except that there was formed around the bending portion of the flexible substrate a lattice-shaped dummy pattern 56 having formed therein square openings each having rounded angular corners and an area of 90,123 µm², the ratio between the sum of the areas of all the openings and the area of the rest of the lattice pattern being 11:10.

Example 62

There was manufactured a flex-rigid printed wiring board 300B similar to the example 45 except that there was formed around the bending portion of the flexible substrate a lattice-shaped dummy pattern 18 having formed therein square openings each having rounded angular corners and an area of 90,123 μm², the ratio between the sum of the areas of all the openings and the area of the rest of the lattice pattern being 1:9.

Example 63

There was manufactured a flex-rigid printed wiring board 300B similar to the example 45 except that there was formed around the bending portion of the flexible substrate a lattice-shaped dummy pattern 18 having formed therein square openings each having rounded angular corners and an area of 90,123 μm², the ratio between the sum of the areas of all the openings and the area of the rest of the lattice pattern being 2:8.

Example 64

There was manufactured a flex-rigid printed wiring board 300B similar to the example 45 except that there was formed around the bending portion of the flexible substrate a lattice-shaped dummy pattern 18 having formed therein square openings each having rounded angular corners and an area of 90,123 μm², the ratio between the sum of the areas of all the openings and the area of the rest of the lattice pattern being 8:2.

Example 65

There was manufactured a flex-rigid printed wiring board 300B similar to the example 45 except that there was formed around the bending portion of the flexible substrate a lattice-shaped dummy pattern 18 having formed therein square openings each having rounded angular corners and an area of 90,123 μm², the ratio between the sum of the areas of all the openings and the area of the rest of the lattice pattern being 9:1.

Example 66

There was manufactured a flex-rigid printed wiring board 300B similar to the example 45 except that there was formed around the bending portion of the flexible substrate a lattice-shaped dummy pattern 56 having formed therein circular openings staggered in relation to each other and each an area of 49,087 μm², the ratio between the sum of the areas of all the openings and the area of the rest of the lattice pattern being 10:10.

Example 67

There was manufactured a flex-rigid printed wiring board 300B similar to the example 45 except that there was formed around the bending portion of the flexible substrate a lattice-shaped dummy pattern 18 having formed therein circular openings staggered in relation to each other and each having an area of 49,087 μm², the ratio between the sum of the areas of all the openings and the area of the rest of the lattice pattern being 1:9.

Example 68

There was manufactured a flex-rigid printed wiring board 300B similar to the example 45 except that there was formed around the bending portion of the flexible substrate a lattice-shaped dummy pattern 18 having formed therein circular openings staggered in relation to each other and each having an area of 49,087 μm², the ratio between the sum of the areas of all the openings and the area of the rest of the lattice pattern being 9:1.

Example 69

There was manufactured a flex-rigid printed wiring board 300B similar to the example 45 except that there was formed around the bending portion of the flexible substrate a lattice-shaped dummy pattern 56 having formed therein circular openings each having an area of 49,087 μm² and circular openings each having an area of 10,000 μm², these two types of openings being laid alternately and the ratio between the sum of the areas of all the openings and the area of the rest of the lattice pattern being 10:10.

Example 70

There was manufactured a flex-rigid printed wiring board 300B similar to the example 45 except that there was formed around the bending portion of the flexible substrate a lattice-shaped dummy pattern 18 having formed therein circular openings each having an area of 49,087 μm² and circular openings each having an area of 10,000 μm², these two types of openings being laid alternately and the ratio between the sum of the areas of all the openings and the area of the rest of the lattice pattern being 1:9.

Example 71

There was manufactured a flex-rigid printed wiring board 300B similar to the example 45 except that there was formed around the bending portion of the flexible substrate a lattice-shaped dummy pattern 18 having formed therein circular openings each having an area of 49,087 μm² and circular openings each having an area of 10,000 μm², these two types of openings being laid alternately and the ratio between the sum of the areas of all the openings and the area of the rest of the lattice pattern being 9:1.

Example 72

There was manufactured a flex-rigid printed wiring board 300B similar to the example 45 except that there was formed around the bending portion of the flexible substrate a solid pattern (15 mm×15 mm) having no openings formed therein.

Comparative Example 2

There was manufactured a flex-rigid printed wiring board similar to the example 45 except that no dummy pattern was formed.

Example 73

There was manufactured a flex-rigid printed wiring board 300B similar to the example 45 except that six linear dummy patterns whose sectional shape was rectangular and line width was 150 μm were formed around the bending portion with a distance of 30 μm between adjacent ones thereof.

Example 74

There was manufactured a flex-rigid printed wiring board 300B similar to the example 45 except that six linear dummy patterns whose sectional shape was rectangular and line width was 200 μm were formed around the bending portion with a distance of 50 μm between adjacent ones thereof.

Example 75

There was manufactured a flex-rigid printed wiring board 300B similar to the example 45 except that six linear dummy patterns whose sectional shape was rectangular and line width was 250 μm were formed around the bending portion with a distance of 60 μm between adjacent ones thereof.

Example 76

There was manufactured a flex-rigid printed wiring board 300B similar to the example 45 except that six linear dummy patterns whose sectional shape was trapezoidal and 75 deg. in bottom angle and line width was 150 μm were formed around the bending portion with a distance of 30 μm between adjacent ones thereof.

Example 77

There was manufactured a flex-rigid printed wiring board 300B similar to the example 45 except that six linear dummy patterns whose sectional shape was trapezoidal and 60 deg. in bottom angle and line width was 200 μm were formed around the bending portion with a distance of 50 μm between adjacent ones thereof.

Example 78

There was manufactured a flex-rigid printed wiring board 300B similar to the example 45 except that six linear dummy patterns whose sectional shape was trapezoidal and 45 deg. in bottom angle and line width was 250 μm were formed around the bending portion with a distance of 60 μm between adjacent ones thereof.

Reference Example 7

There was manufactured a flex-rigid printed wiring board 300B similar to the example 45 except that six linear dummy patterns whose sectional shape was rectangular and line width was 140 μm were formed around the bending portion with a distance of 20 μm between adjacent ones thereof.

Reference Example 8

There was manufactured a flex-rigid printed wiring board 300B similar to the example 45 except that six linear dummy patterns whose sectional shape was trapezoidal and 75 deg. in bottom angle and line width was 140 μm were formed around the bending portion with a distance of 20 μm between adjacent ones thereof.

Example 79

There was manufactured a flex-rigid printed wiring board 300B similar to the example 45 except that as a starting material for a flexible substrate, there was used a 50 μm-thick double-sided copper-clad laminate formed by hot-pressing of an 18 μm-thick copper foil 12 on either side of an insulative base material 52 formed by drying a 20 μm-thick glass cloth (whose glass fibers had a mean thickness of 1.5 μm) impregnated with epoxy resin to cure the epoxy resin and six linear dummy patterns whose sectional shape was rectangular and line width was 100 μm were formed around the bending portion with a distance of 40 μm between adjacent ones thereof.

Example 80

There was manufactured a flex-rigid printed wiring board 300B similar to the example 45 except that as a starting material for a flexible substrate, there was used a 50 μm-thick double-sided copper-clad laminate formed by hot-pressing of an 18 μm-thick copper foil 12 on either side of an insulative base material 52 formed by drying a 20 μm-thick glass cloth (whose glass fibers had a mean thickness of 3.0 μm) impregnated with epoxy resin to cure the epoxy resin and six linear dummy patterns whose sectional shape was rectangular and line width was 100 μm were formed around the bending portion with a distance of 40 μm between adjacent ones thereof.

Example 81

There was manufactured a flex-rigid printed wiring board 300B similar to the example 45 except that as a starting material for a flexible substrate, there was used a 50 μm-thick double-sided copper-clad laminate formed by hot-pressing of an 18 μm-thick copper foil 12 on either side of an insulative base material 52 formed by drying a 20 μm-thick glass cloth (whose glass fibers had a mean thickness of 4.0 μm) impregnated with epoxy resin to cure the epoxy resin and six linear dummy patterns whose sectional shape was rectangular and line width was 100 μm were formed around the bending portion with a distance of 40 μm between adjacent ones thereof.

Example 82

There was manufactured a flex-rigid printed wiring board 300B similar to the example 45 except that as a starting material for a flexible substrate, there was used a 60 μm-thick double-sided copper-clad laminate formed by hot-pressing of an 18 μm-thick copper foil 12 on either side of an insulative base material 52 formed by drying a 30 μm-thick glass cloth (whose glass fibers had a mean thickness of 5.0 μm) impregnated with epoxy resin to cure the epoxy resin and six linear dummy patterns whose sectional shape was rectangular and line width was 100 μm were formed around the bending portion with a distance of 40 μm between adjacent ones thereof.

Example 83

There was manufactured a flex-rigid printed wiring board 300B similar to the example 45 except that as a starting material for a flexible substrate, there was used a 100 μm-thick double-sided copper-clad laminate formed by hot-pressing of an 18 μm-thick copper foil 12 on either side of an insulative base material 52 formed by drying a 60 μm-thick glass cloth (whose glass fibers had a mean thickness of 5.0 μm) impregnated with epoxy resin to cure the epoxy resin and six linear dummy patterns whose sectional shape was rectangular and line width was 100 μm were formed around the bending portion with a distance of 40 μm between adjacent ones thereof.

Example 84

There was manufactured a flex-rigid printed wiring board 300B similar to the example 45 except that as a starting material for a flexible substrate, there was used a 50 μm-thick double-sided copper-clad laminate formed by hot-pressing of an 18 μm-thick copper foil 12 on either side of an insulative base material 52 formed by drying a 20 μm-thick glass cloth (whose glass fibers had a mean thickness of 1.5 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Example 85

There was manufactured a flex-rigid printed wiring board 300B similar to the example 45 except that as a starting material for a flexible substrate, there was used a 50 μm-thick double-sided copper-clad laminate formed by hot-pressing of an 18 μm-thick copper foil 12 on either side of an insulative base material 52 formed by drying a 20 μm-thick glass cloth (whose glass fibers had a mean thickness of 3.0 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Example 86

There was manufactured a flex-rigid printed wiring board 300B similar to the example 45 except that as a starting material for a flexible substrate, there was used a 50 μm-thick double-sided copper-clad laminate formed by hot-pressing of an 18 μm-thick copper foil 12 on either side of an insulative base material 52 formed by drying a 20 μm-thick glass cloth (whose glass fibers had a mean thickness of 4.0 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Example 87

There was manufactured a flex-rigid printed wiring board 300B similar to the example 45 except that as a starting material for a flexible substrate, there was used a 60 μm-thick double-sided copper-clad laminate formed by hot-pressing of an 18 μm-thick copper foil 12 on either side of an insulative base material 52 formed by drying a 30 μm-thick glass cloth (whose glass fibers had a mean thickness of 5.0 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Example 88

There was manufactured a flex-rigid printed wiring board 300B similar to the example 45 except that as a starting material for a flexible substrate, there was used a 100 μm-thick double-sided copper-clad laminate formed by hot-pressing of an 18 μm-thick copper foil 12 on either side of an insulative base material 52 formed by drying a 60 μm-thick glass cloth (whose glass fibers had a mean thickness of 5.0 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Reference Example 9

There was manufactured a flex-rigid printed wiring board 300B similar to the example 45 except that as a starting material for a flexible substrate, there was used a 50 μm-thick double-sided copper-clad laminate formed by hot-pressing of an 18 μm-thick copper foil 12 on either side of an insulative base material 52 formed by drying a 15 μm-thick glass cloth (whose glass fibers had a mean thickness of 4.0 μm) impregnated with epoxy resin to cure the epoxy resin and six linear dummy patterns whose sectional shape was rectangular and line width was 100 μm were formed around the bending portion with a distance of 40 μm between adjacent ones thereof.

Reference Example 10

There was manufactured a flex-rigid printed wiring board 300B similar to the example 45 except that as a starting material for a flexible substrate, there was used a 150 μm-thick double-sided copper-clad laminate formed by hot-pressing of an 18 μm-thick copper foil 12 on either side of an insulative base material 52 formed by drying a 100 μm-thick glass cloth (whose glass fibers had a mean thickness of 7.0 μm) impregnated with epoxy resin to cure the epoxy resin and six linear dummy patterns whose sectional shape was rectangular and line width was 100 μm were formed around the bending portion with a distance of 40 μm between adjacent ones thereof.

Reference Example 11

There was manufactured a flex-rigid printed wiring board 300B similar to the example 45 except that as a starting material for a flexible substrate, there was used a 50 μm-thick double-sided copper-clad laminate formed by hot-pressing of an 18 μm-thick copper foil 12 on either side of an insulative base material 52 formed by drying a 15 μm-thick glass cloth (whose glass fibers had a mean thickness of 4.0 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Reference Example 12

There was manufactured a flex-rigid printed wiring board 300B similar to the example 45 except that as a starting material for a flexible substrate, there was used a 150 μm-thick double-sided copper-clad laminate formed by hot-pressing of an 18 μm-thick copper foil 12 on either side of an insulative base material 52 formed by drying a 100 μm-thick glass cloth (whose glass fibers had a mean thickness of 7.0 μm) impregnated with epoxy resin to cure the epoxy resin and six linear dummy patterns whose sectional shape was trapezoidal and 70 deg. in boot angle and line width was 100 μm were formed around the bending portion with a distance of 40 μm between adjacent ones thereof.

Example 89

Figure 16A:
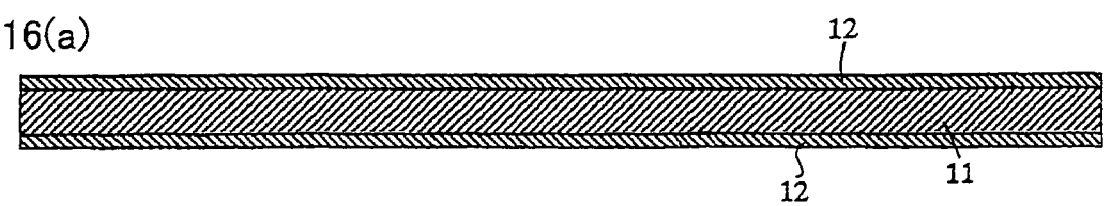
FIGS. 16(a) to 16(c) show the process of preparing a flexible substrate in a flex-rigid printed wiring board according a example 89 of the present invention.

(A) Preparation of a Flexible Substrate (1) As a starting material for a flexible substrate 100A as a member to manufacture a flex-rigid printed wiring board according to an embodiment of the present invention, there was used a 50 μm-thick double-sided copper-clad laminate (E-67 by HITACHI CHEMICAL) in which an 18 μm-thick copper foil 12 was laminated on either side of an insulative base material 11 formed by impregnating a 25 μm-thick glass cloth (whose glass fibers had a mean thickness of 4.0 μm) with epoxy resin and drying it. See FIG. 16(a).

Figure 16B:
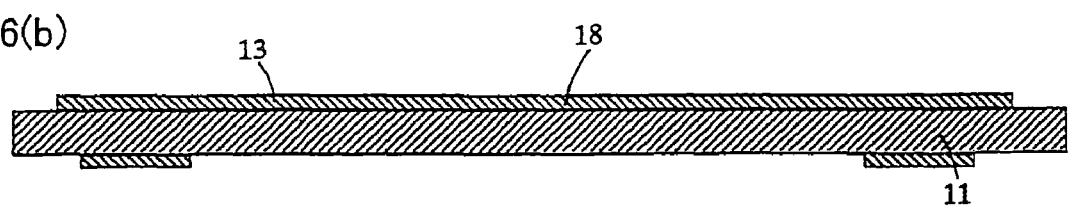

(2) The copper foil 12 laminated on either side of the insulative film 11 was etched with a cupric chloride aqueous-solution to form three wiring patterns 13 extending longitudinally and whose line width was 100 μm and 250 μm-diameter interconnecting electrode pads 16 contiguous to the wiring patterns 13 and intended for electrical connection with rigid substrates which will be described in detail later. It should be noted that the wiring patterns 13 were formed on a substrate surface which would be inner when the flexible substrate 100A was bent and each of the wiring patterns at the bending portion was formed as a wide pattern 18 of which a part is swollen in the width direction, namely, in one direction nearly perpendicular to the extension of the wiring patterns as shown in FIG. 9(b) for the wide portion to be 1.5 times larger in line width than the rest of the pattern (100×1.5=150 μm). See FIG. 16(b).

Note that the distance (d) between the centers of the wide portions of the adjacent patterns 18 was within a range of 4 times (325 μm) of the width of the wiring patterns 13.

Figure 16C:
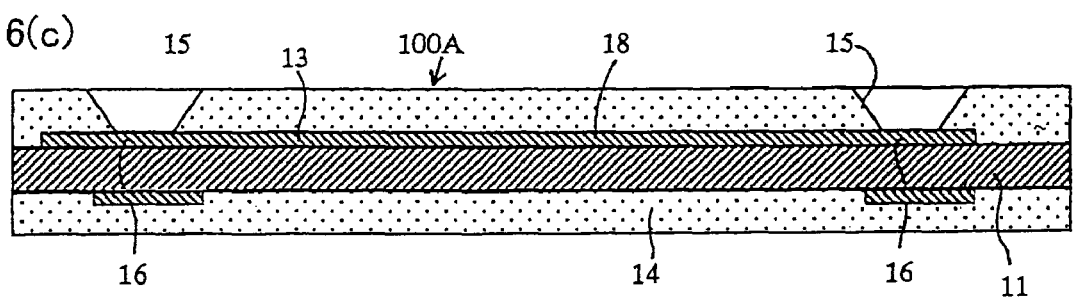

(3) A solder resist (NPR-90 by NIPPON POLYTECH) was coated over the wiring patterns 13 by screen-printing, dried and then exposed to light of 400 mj/cm² and further dried at 150° C. for one hour to form a 25 μm-thick resin-made cover layer 14 having 300 μm-diameter openings 15 formed therein and which protects the wiring patterns 13. See FIG. 16(c).

Figure 17A:
FIGS. 17(a) to 17(f) show the process of preparing a rigid substrate also included in the flex-rigid printed wiring board according the example 89 of the present invention.
Figure 17B:
Figure 17C:

(B) Preparation of a Rigid Substrate (1) Lasering openings 24 were made, by etching with a cupric chloride aqueous-solution, in one side of a 0.11 mm-thick double-sided copper clad laminate (R-1766 by MATSUSHITA ELECTRIC; see FIG. 17(a)) including a glass epoxy resin substrate 21 having a 12 μm-thick copper foil 22 laminated on either side thereof, and further 250 μm-diameter openings 26 for filling copper plate were formed in the double-sided copper-clad laminate by irradiating carbon-dioxide laser. See FIGS. 17(b) and 17(c).

Figure 17D:

(2) Further, a Pd catalyst was applied to the inner wall of the openings (through-holes) 26, the inner wall was plated with copper by electroless plating with a plating solution and under conditions as will be given below, and then plated with electrolytic copper, to thereby fill a copper plate 28 in each of the openings 26. See FIG. 17(d).

Electroless Copper Plating Solution:

| Copper sulfate | 10 g/liter |
| HCHO | 8 g/liter |
| NaOH | 5 g/liter |
| Rochelle salt | 45 g/liter |
| Temperature | 30° C. |

Electrolytic Copper Plating Solution:

| Sulfuric acid | 180 g/liter |
| Copper sulfate | 80 g/liter |
| CAPARACID GL (by ATOTEK Japan) | 1 ml/liter |

Plating Conditions:

| Current density | 2 A/dm² |
| Time | 30 min |
| Temperature | 25° C. |

Figure 17E:
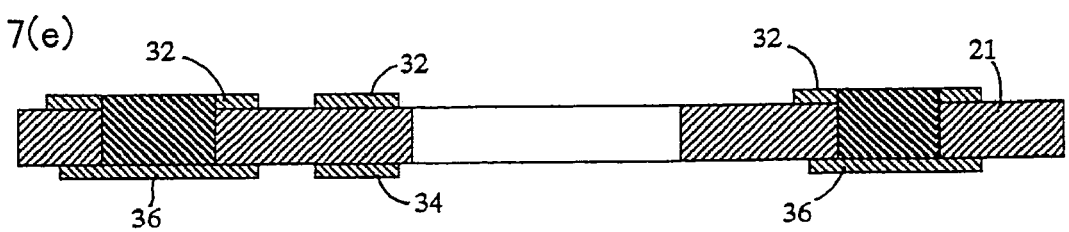

(3) Both sides of the substrate with the copper plate 28 filled in the openings 26 were etched using the cupric chloride aqueous-solution to form patterns 32 and 34 on the front and rear sides of the substrate, and a part of the pattern 34 was formed into an interconnecting electrode pad 36. Further, the outer surface of the substrate was processed using a rooter (as in FIG. 17(e)).

Figure 17F:
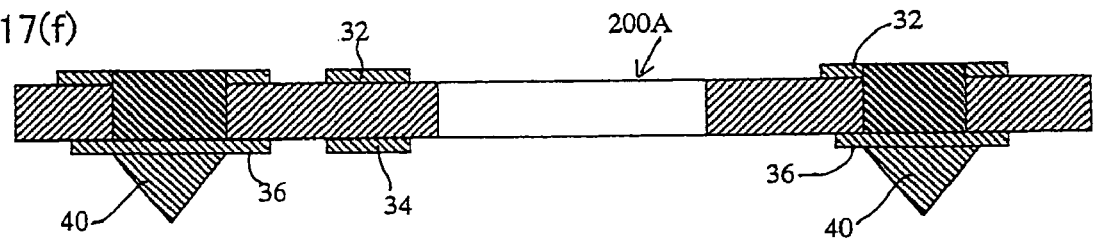

(4) Next, domed projections 40, namely, solder bumps, were formed on the interconnecting electrode pads 36 by filling a silver paste (SOLAMET by DU PONT) into a metal mask having a circular opening formed therein with the use of a squeegee. Further, the projections 40 were cured by heating at 150° C. for one hour to form a rigid substrate 200A. See FIG. 17(f).

Figure 18:
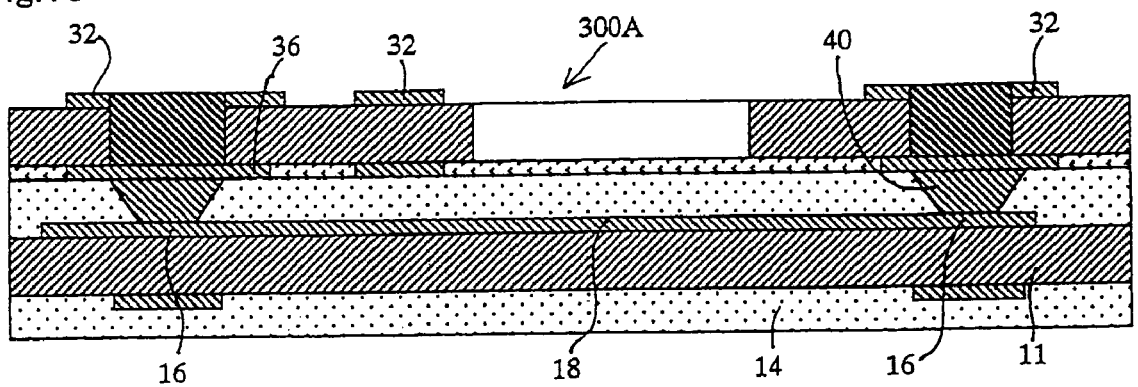
FIG. 18 shows the process of stacking the flexible and rigid substrates one on the other in the flex-rigid printed wiring board according to the example 89 of the present invention.

(C) Stacking of the Substrates (1) The domed projection 40 on the rigid substrate 200A prepared in the above process (B) was pierced through a prepreg 42 (GIA-671N by HITACHI CHEMICAL) under a pressure of 10 kg/cm². See FIG. 18.

Figure 19:
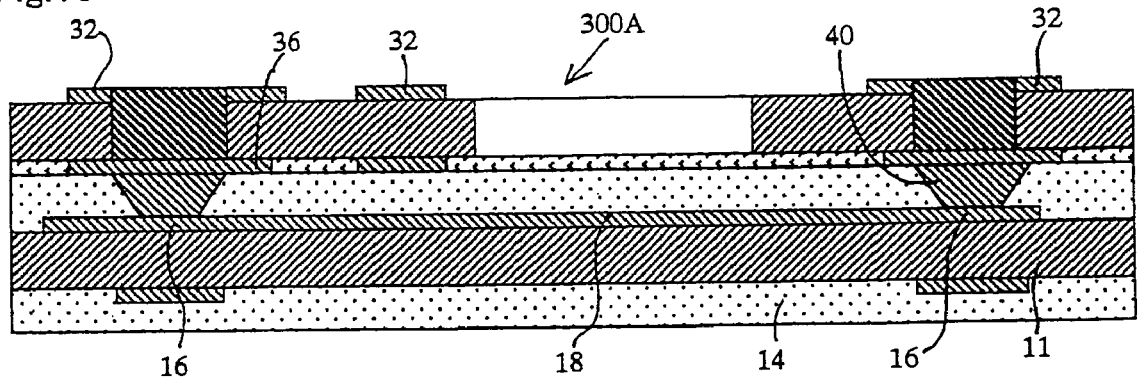
FIG. 19 shows the flex-rigid printed wiring board according the example 89 of the present invention.

(2) Next, the flexible substrate 100A prepared in the above process (A) and the rigid substrate 200A were stacked one on the other and hot-pressed at 180° C. with a pressure of 40 kg/cm² to provide a flex-rigid printed wiring board 300A in which the flexible and rigid substrates 100A and 200A were connected to each other via the conical projections 40. See FIG. 19.

Example 90

There was manufactured a flex-rigid printed wiring board 300A similar to the example 89 except that each of the wiring patterns at the bending portion was formed into an extended pattern swollen to one side thereof for the line width thereof to be a maximum of 1.05 times larger than the rest, other than the swollen portion, thereof (100×1.05=105 μm).

Note that the distance (d) between the centers of the adjacent extended patterns was within a range of 4 times (285 μm) of the width of the wiring patterns.

Example 91

There was manufactured a flex-rigid printed wiring board 300A similar to the example 89 except that each of the wiring patterns at the bending portion was formed into an extended pattern swollen to one side thereof for the line width thereof to be a maximum of 2.0 times larger than the rest, that is, other than the swollen portion, thereof (100×2.0=200 μm) as shown in FIG. 9(b).

Note that the distance (d) between the centers of the adjacent extended patterns was within a range of 4 times (375 μm) of the width of the wiring patterns.

Example 92

There was manufactured a flex-rigid printed wiring board 300A similar to the example 89 except that each of the wiring patterns at the bending portion was formed into an extended pattern swollen to both sides thereof for the line width thereof to be a maximum of 1.5 times larger than the rest thereof, namely, other than the swollen portion (100×1.5=150 μm) as shown in FIG. 9(c).

Note that the distance (d) between the centers of the adjacent extended patterns was within a range of 4 to 6 times (475 μm) of the width of the wiring patterns.

Example 93

There was manufactured a flex-rigid printed wiring board 300A similar to the example 89 except that each of the wiring patterns at the bending portion was formed into an extended pattern swollen to both sides thereof for the line width thereof to be a maximum of 1.05 times larger than the rest thereof, namely, other than the swollen portion (100×1.05=105 μm) as shown in FIG. 9(c).

Note that the distance (d) between the centers of the adjacent extended patterns was within a range of 4 times (385 μm) of the width of the wiring patterns.

Example 94

There was manufactured a flex-rigid printed wiring board 300A similar to the example 89 except that each of the wiring patterns at the bending portion was formed into an extended pattern swollen to both sides thereof for the line width thereof to be a maximum of 2.0 times larger than the rest thereof, namely, other than the swollen portion (100×2.0=200 μm) as shown in FIG. 9(c).

Note that the distance (d) between the centers of the adjacent extended patterns was within a range of 4 to 6 times (575 μm) of the width of the wiring patterns.

Example 95

There was manufactured a flex-rigid printed wiring board 300A similar to the example 89 except that right and left ones of the three wiring patterns at the bending portion were formed into extended patterns swollen to one side thereof for the line width thereof to be a maximum of 1.5 times larger than the rest thereof, namely, other than the swollen portion (100×1.5=150 μm) while the central one of the wiring patterns was formed into an extended pattern swollen to both sides thereof for the line width thereof to be a maximum of 1.5 times larger than the rest thereof, namely, other than the swollen portion (100×1.5=150 μm), as shown in FIG. 9(d). Note that the distance (d) between the centers of the adjacent extended patterns was within a range of 4 times (375 μm) of the width of the wiring patterns.

Example 96

There was manufactured a flex-rigid printed wiring board 300A similar to the example 89 except that right and left ones of the three wiring patterns at the bending portion were formed into extended patterns swollen to one side thereof for the line width thereof to be a maximum of 1.05 times larger than the rest thereof, namely, other than the swollen portion (100×1.05=105 μm) while the central one of the wiring patterns was formed into an extended pattern swollen to both sides thereof for the line width thereof to be a maximum of 1.05 times larger than the rest thereof, namely, other than the swollen portion (100×1.05=105 μm), as shown in FIG. 9(d). Note that the distance (d) between the centers of the adjacent extended patterns was within a range of 4 times (295 μm) of the width of the wiring patterns.

Example 97

There was manufactured a flex-rigid printed wiring board 300A similar to the example 89 except that right and left ones of the three wiring patterns at the bending portion were formed into extended patterns swollen to one side thereof for the line width thereof to be a maximum of 2.0 times larger than the rest thereof, namely, other than the swollen portion (100×2.0=200 μm) while the central one of the wiring patterns was formed into an extended pattern swollen to both sides thereof for the line width thereof to be a maximum of 2.0 times larger than the rest thereof, namely, other than the swollen portion (100×2.0=200 μm), as shown in FIG. 9(d).

Note that the distance (d) between the centers of the adjacent extended patterns was within a range of 4 times (390 μm) of the width of the wiring patterns.

Reference Example 13

There was manufactured a flex-rigid printed wiring board 300A similar to the example 89 except that each of the wiring patterns at the bending portion was formed into an extended pattern swollen to both sides thereof for the line width thereof to be a maximum of 2.5 times larger than the rest thereof, namely, other than the swollen portion (100×2.5=250 μm) as shown in FIG. 9(c).

Note that the distance (d) between the centers of the adjacent extended patterns was within a range of more than 6 times (675 μm) of the width of the wiring patterns.

Reference Example 14

There was manufactured a flex-rigid printed wiring board 300A similar to the example 89 except that each of the wiring patterns at the bending portion was formed into an extended pattern swollen to both sides thereof for the line width thereof to be a maximum of 3.0 times larger than the rest thereof, namely, other than the swollen portion (100×3.0=300 μm) as shown in FIG. 9(c).

Note that the distance (d) between the centers of the adjacent extended patterns was within a range of more than 6 times (775 μm) of the width of the wiring patterns.

Comparative Example 3

There was manufactured a flex-rigid printed wiring board similar to the example 89 except that each of the wiring patterns at the bending portion was formed into a normal linear pattern, but not into any swollen extended pattern.

Note that the distance (d) between the centers of the adjacent extended patterns was within a range of 4 times (175 μm) of the width of the wiring patterns.

Comparative Example 4

There was manufactured a flex-rigid printed wiring board similar to the example 89 except that each of the wiring patterns at the bending portion was formed into an extended pattern whose minimum line width was ½ (100 μm×0.5=50 μm) any swollen extended pattern.

Note that the distance (d) between the centers of the adjacent extended patterns was within a range of 4 times (175 μm) of the width of the wiring patterns.

Example 98

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 2 mm and the shortest distance X from the largest curve of the pattern to wiring patterns at the non-bending portion being equal to R.

Example 99

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 2 mm and the shortest distance X from the largest curve of the pattern to wiring patterns at the non-bending portion being equal to R/2.

Example 100

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 2 mm and the shortest distance X from the largest curve of the pattern to wiring patterns at the non-bending portion being equal to R/3.

Example 101

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 5 mm and the shortest distance X from the largest curve of the pattern to wiring patterns at the non-bending portion being equal to R.

Example 102

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 5 mm and the shortest distance X from the largest curve of the pattern to wiring patterns at the non-bending portion being equal to R/2.

Example 103

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 5 mm and the shortest distance X from the largest curve of the pattern to wiring patterns at the non-bending portion being equal to R/3.

Example 104

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 8 mm and the shortest distance X from the largest curve of the pattern to wiring patterns at the non-bending portion being equal to R.

Example 105

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 8 mm and the shortest distance X from the largest curve of the pattern to wiring patterns at the non-bending portion being equal to R/2.

Example 106

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 8 mm and the shortest distance X from the largest curve of the pattern to wiring patterns at the non-bending portion being equal to R/3.

Example 107

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 10 mm and the shortest distance X from the largest curve of the pattern to wiring patterns at the non-bending portion being equal to R.

Example 108

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 10 mm and the shortest distance X from the largest curve of the pattern to wiring patterns at the non-bending portion being equal to R/2.

Example 109

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 10 mm and the shortest distance X from the largest curve of the pattern to wiring patterns at the non-bending portion being equal to R/3.

Example 110

There was manufactured a flex-rigid printed wiring board 300A similar to the example 89 except that the wiring patterns at the bending portion were formed into patterns curved in the width direction and whose line width at the curved portion was 1.5 times larger than that of the rest thereof, namely, other than the curved portion, the curved pattern being a part of a circle whose radius R is 2 mm and the shortest distance X from the largest curve of the pattern to wiring patterns at the non-bending portion being equal to R/2.

Example 111

There was manufactured a flex-rigid printed wiring board 300A similar to the example 89 except that the wiring patterns at the bending portion were formed into patterns curved in the width direction and whose line width at the curved portion was 1.5 times larger than that of the rest thereof, namely, other than the curved portion, the curved pattern being a part of a circle whose radius R is 5 mm and the shortest distance X from the largest curve of the pattern to wiring patterns at the non-bending portion being equal to R/2.

Example 112

There was manufactured a flex-rigid printed wiring board 300A similar to the example 89 except that the wiring patterns at the bending portion were formed into patterns curved in the width direction and whose line width at the curved portion was 1.5 times larger than that of the rest thereof, namely, other than the curved portion, the curved pattern being a part of a circle whose radius R is 8 mm and the shortest distance X from the largest curve of the pattern to wiring patterns at the non-bending portion being equal to R/2.

Example 113

There was manufactured a flex-rigid printed wiring board 300A similar to the example 89 except that the wiring patterns at the bending portion were formed into patterns curved in the width direction and whose line width at the curved portion was 1.5 times larger than that of the rest thereof, namely, other than the curved portion, the curved pattern being a part of a circle whose radius R is 10 mm and the shortest distance X from the largest curve of the pattern to wiring patterns at the non-bending portion being equal to R/2.

Example 114

There was manufactured a flex-rigid printed wiring board 300A similar to the example 89 except that the wiring patterns at the bending portion were formed into patterns curved in the width direction and whose line width at the curved portion was 2.0 times larger than that of the rest thereof, namely, other than the curved portion, the curved pattern being a part of a circle whose radius R is 5 mm and the shortest distance X from the largest curve of the pattern to wiring patterns at the non-bending portion being equal to R/2.

Example 115

There was manufactured a flex-rigid printed wiring board 300A similar to the example 89 except that the wiring patterns at the bending portion were formed into patterns curved in the width direction and whose line width at the curved portion was 2.0 times larger than that of the rest thereof, namely, other than the curved portion, the curved pattern being a part of a circle whose radius R is 8 mm and the shortest distance X from the largest curve of the pattern to wiring patterns at the non-bending portion being equal to R/2.

Example 116

There was manufactured a flex-rigid printed wiring board 300A similar to the example 89 except that the wiring patterns at the bending portion were formed into patterns curved in the width direction and whose line width at the curved portion was 2.0 times larger than that of the rest thereof, namely, other than the curved portion, the curved pattern being a part of a circle whose radius R is 10 mm and the shortest distance X from the largest curve of the pattern to wiring patterns at the non-bending portion being equal to R/2.

Reference Example 15

There was manufactured a flex-rigid printed wiring board 300A similar to the example 89 except that the wiring patterns at the bending portion were formed into patterns curved in the width direction and whose line width at the curved portion was 2.5 times larger than that of the rest thereof, namely, other than the curved portion, the curved pattern being a part of a circle whose radius R is 5 mm and the shortest distance X from the largest curve of the pattern to wiring patterns at the non-bending portion being equal to R/2.

Reference Example 16

There was manufactured a flex-rigid printed wiring board 300A similar to the example 89 except that the wiring patterns at the bending portion were formed into patterns curved in the width direction and whose line width at the curved portion was 2.5 times larger than that of the rest thereof, namely, other than the curved portion, the curved pattern being a part of a circle whose radius R is 8 mm and the shortest distance X from the largest curve of the pattern to wiring patterns at the non-bending portion being equal to R/2.

Reference Example 17

There was manufactured a flex-rigid printed wiring board 300A similar to the example 89 except that the wiring patterns at the bending portion were formed into patterns curved in the width direction and whose line width at the curved portion was 2.5 times larger than that of the rest thereof, namely, other than the curved portion, the curved pattern being a part of a circle whose radius R is 10 mm and the shortest distance X from the largest curve of the pattern to wiring patterns at the non-bending portion being equal to R/2.

Reference Example 18

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 1.5 mm and the shortest distance X from the largest curve of the pattern to wiring patterns at the non-bending portion being equal to R/2.

Reference Example 19

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 12 mm and the shortest distance X from the largest curve of the pattern to wiring patterns at the non-bending portion being equal to R/2.

Reference Example 20

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 1.5 mm and the shortest distance X from the largest curve of the pattern to wiring patterns at the non-bending portion being equal to R/4.

Reference Example 21

There was manufactured a flex-rigid printed wiring board 300A similar to the example 89 except that the wiring patterns at the bending portion were formed into patterns curved in the width direction and equal in line width to the initial patterns, the curved pattern being a part of a circle whose radius R is 12 mm and the shortest distance X from the largest curve of the pattern to wiring patterns at the non-bending portion being equal to R/4.

Example 117

There was manufactured a flex-rigid printed wiring board 300A similar to the example 89 except that as a starting material for a flexible substrate, there was used a 50 µm-thick double-sided copper-clad laminate formed by hot-pressing of an 18 µm-thick copper foil 12 on either side of an insulative base material 11 formed by drying a 20 µm-thick glass cloth (whose glass fibers had a mean thickness of 4.0 µm) impregnated with epoxy resin to cure the epoxy resin.

Example 118

There was manufactured a flex-rigid printed wiring board 300A similar to the example 92 except that as a starting material for a flexible substrate, there was used a 50 µm-thick double-sided copper-clad laminate formed by hot-pressing of an 18 µm-thick copper foil 12 on either side of an insulative base material 11 formed by drying a 30 µm-thick glass cloth (whose glass fibers had a mean thickness of 4.0 µm) impregnated with epoxy resin to cure the epoxy resin.

Example 119

There was manufactured a flex-rigid printed wiring board 300A similar to the example 95 except that as a starting material for a flexible substrate, there was used a 100 µm-thick double-sided copper-clad laminate formed by hot-pressing of an 18 µm-thick copper foil 12 on either side of an insulative base material 11 formed by drying a 60 µm-thick glass cloth (whose glass fibers had a mean thickness of 4.0 µm) impregnated with epoxy resin to cure the epoxy resin.

Example 120

There was manufactured a flex-rigid printed wiring board 300A similar to the example 102 except that as a starting material for a flexible substrate, there was used a 50 µm-thick double-sided copper-clad laminate formed by hot-pressing of an 18 µm-thick copper foil 12 on either side of an insulative base material 11 formed by drying a 20 µm-thick glass cloth (whose glass fibers had a mean thickness of 5.0 µm) impregnated with epoxy resin to cure the epoxy resin.

Example 121

There was manufactured a flex-rigid printed wiring board 300A similar to the example 105 except that as a starting material for a flexible substrate, there was used a 50 µm-thick double-sided copper-clad laminate formed by hot-pressing of an 18 µm-thick copper foil 12 on one side of an insulative base material 11 formed by drying a 30 µm-thick glass cloth (whose glass fibers had a mean thickness of 5.0 µm) impregnated with epoxy resin to cure the epoxy resin.

Example 122

There was manufactured a flex-rigid printed wiring board 300A similar to the example 108 except that as a starting material for a flexible substrate, there was used a 100 µm-thick double-sided copper-clad laminate formed by hot-pressing of an 18 µm-thick copper foil 12 on either side of an insulative base material 11 formed by drying a 60 µm-thick glass cloth (whose glass fibers had a mean thickness of 5.0 µm) impregnated with epoxy resin to cure the epoxy resin.

Example 123

There was manufactured a flex-rigid printed wiring board 300A similar to the example 89 except that as a starting material for a flexible substrate, there was used a 50 µm-thick double-sided copper-clad laminate formed by hot-pressing of an 18 µm-thick copper foil 12 on either side of an insulative base material 11 formed by drying a 20 µm-thick glass cloth (whose glass fibers had a mean thickness of 1.5 µm) impregnated with epoxy resin to cure the epoxy resin.

Example 124

There was manufactured a flex-rigid printed wiring board 300A similar to the example 92 except that as a starting material for a flexible substrate, there was used a 50 µm-thick double-sided copper-clad laminate formed by hot-pressing of an 18 µm-thick copper foil 12 on either side of an insulative base material 11 formed by drying a 30 µm-thick glass cloth (whose glass fibers had a mean thickness of 1.5 µm) impregnated with epoxy resin to cure the epoxy resin.

Example 125

There was manufactured a flex-rigid printed wiring board 300A similar to the example 95 except that as a starting material for a flexible substrate, there was used a 100 µm-thick double-sided copper-clad laminate formed by hot-pressing of an 18 µm-thick copper foil 12 on either side of an insulative base material 11 formed by drying a 60 µm-thick glass cloth (whose glass fibers had a mean thickness of 1.5 µm) impregnated with epoxy resin to cure the epoxy resin.

Example 126

There was manufactured a flex-rigid printed wiring board 300A similar to the example 102 except that as a starting material for a flexible substrate, there was used a 50 µm-thick double-sided copper-clad laminate formed by hot-pressing of an 18 µm-thick copper foil 12 on either side of an insulative base material 11 formed by drying a 20 µm-thick glass cloth (whose glass fibers had a mean thickness of 7.0 μm) impregnated with epoxy resin to cure the epoxy resin.

Example 127

There was manufactured a flex-rigid printed wiring board 300A similar to the example 105 except that as a starting material for a flexible substrate, there was used a 50 μm-thick double-sided copper-clad laminate formed by hot-pressing of an 18 μm-thick copper foil 12 on either side of an insulative base material 11 formed by drying a 30 μm-thick glass cloth (whose glass fibers had a mean thickness of 7.0 μm) impregnated with epoxy resin to cure the epoxy resin.

Example 128

There was manufactured a flex-rigid printed wiring board 300A similar to the example 108 except that as a starting material for a flexible substrate, there was used a 100 μm-thick double-sided copper-clad laminate formed by hot-pressing of an 18 μm-thick copper foil 12 on either side of an insulative base material 11 formed by drying a 60 μm-thick glass cloth (whose glass fibers had a mean thickness of 7.0 μm) impregnated with epoxy resin to cure the epoxy resin.

Reference Example 22

There was manufactured a flex-rigid printed wiring board 300A similar to the example 89 except that as a starting material for a flexible substrate, there was used a 50 μm-thick double-sided copper-clad laminate formed by hot-pressing of an 18 μm-thick copper foil 12 on either side of an insulative base material 11 formed by drying a 15 μm-thick glass cloth (whose glass fibers had a mean thickness of 4.0 μm) impregnated with epoxy resin to cure the epoxy resin.

Reference Example 23

There was manufactured a flex-rigid printed wiring board 300A similar to the example 92 except that as a starting material for a flexible substrate, there was used a 150 μm-thick double-sided copper-clad laminate formed by hot-pressing of an 18 μm-thick copper foil 12 on either side of an insulative base material 11 formed by drying a 100 μm-thick glass cloth (whose glass fibers had a mean thickness of 4.0 μm) impregnated with epoxy resin to cure the epoxy resin.

Reference Example 24

There was manufactured a flex-rigid printed wiring board 300A similar to the example 102 except that as a starting material for a flexible substrate, there was used a 50 μm-thick double-sided copper-clad laminate formed by hot-pressing of an 18 μm-thick copper foil 12 on either side of an insulative base material 11 formed by drying a 15 μm-thick glass cloth (whose glass fibers had a mean thickness of 7.0 μm) impregnated with epoxy resin to cure the epoxy resin.

Reference Example 25

There was manufactured a flex-rigid printed wiring board 300A similar to the example 108 except that as a starting material for a flexible substrate, there was used a 150 μm-thick double-sided copper-clad laminate formed by hot-pressing of an 18 μm-thick copper foil 12 on either side of an insulative base material 11 formed by drying a 100 μm-thick glass cloth (whose glass fibers had a mean thickness of 7.0 μm) impregnated with epoxy resin to cure the epoxy resin.

Example 129

(1) As a starting material for a flexible substrate 100B as a member to manufacture a flex-rigid printed wiring board according to an embodiment of the present invention, there was used a 50 μm-thick double-sided copper-clad laminate (E-67 by HITACHI CHEMICAL) in which an 18 μm-thick copper foil was laminated on either side of an insulative base material 52 formed by impregnating a 20 μm-thick glass cloth (whose thickness may be less than 30 μm and whose glass fibers had a mean thickness of 4.0 μm) with epoxy resin and drying it.

(2) First, a dry film resist was laminated on either side of a 0.05 mm-thick double-sided copper clad laminate, exposed and developed to provide an etching resist. Then, the etching resist was etched with a cupric chloride aqueous-solution to form three longitudinally extending wiring patterns 53 and 54 whose line width was 100 μm on each of the front and rear sides. The longitudinally extending wiring patterns 53 and 54 were formed into extended patterns 56 and 57 of which a part is swollen to one side in the vicinity of the bending portion 55 to have a line width which is a maximum of 1.5 times larger than the rest of the pattern (100×1.5=150 μm) as shown in FIG. 9(b). See FIG. 20(a).

Note that the distance (d) between the centers of the three adjacent extended patterns 56 or 57 was within a range of 4 times (325 μm) of the width of the wiring patterns 53 or 54.

(3) A solder resist (NPR-90 by NIPPON POLYTECH) was coated, by screen-printing, on either side of the substrate having formed thereon the extended patterns 56 and 57 formed as in step (2), exposed to light of 400 mj/cm$^2$ and dried at 150° C. for one hour to form a cover layer 58. See FIG. 20(b).

(4) A prepreg 60 (R-1661 by MATSUSHITA ELECTRIC) opened (indicated at a reference numeral 62) at a portion where it is to be bent and a 12 μm-thick copper foil 64 were stacked on either side having the cover layer 58 formed thereon (see FIG. 20(c)), and the stack was hot-pressed under a pressure of 35 kg/cm$^2$ at 180° C. (see FIG. 20(d)).

(5) The surface of the stack formed as in step (4) above was irradiated with carbon dioxide laser under predetermined conditions to form 100 μm-diameter openings 66 in the copper foil 64, carbon dioxide laser was further irradiated through the openings 66 under different conditions to form through-holes 68 whose diameter was 300 μm through the substrate. See FIG. 20(e).

After the lasering, the through-holes 68 were desmeared with a solution of permanganic acid to remove smears residing in the through-holes 68

(6) Further, a Pd catalyst was applied to the inner wall of the openings (through-holes) 68 formed in step (5) above, the inner wall was plated with copper by electroless plating with a plating solution and under conditions as will be given below, and then plated with electrolytic copper to form copper-plated layers 70 in the entire substrate including the inner wall of the through-holes 68. See FIG. 20(f).

Thus, plated through-holes 76 were formed.

Electroless Copper Plating Solution:

| | |
|---|---|
| Copper sulfate | 10 g/liter |
| HCHO | 8 g/liter |

-continued

| | |
|---|---|
| NaOH | 5 g/liter |
| Rochelle salt | 45 g/liter |
| Temperature | 30° C. |

Electrolytic Copper Plating Solution:

| | |
|---|---|
| Sulfuric acid | 180 g/liter |
| Copper sulfate | 80 g/liter |
| CAPARACID GL (by ATOTEK Japan) | 1 ml/liter |

Plating Conditions:

| | |
|---|---|
| Current density | 2 A/dm$^2$ |
| Time | 30 min |
| Temperature | 25° C. |

(7) Next, a dry film resist was laminated on either side of the substrate having the copper plate layer 70 formed thereon in step (6) above, exposed and developed to form an etching resist, and then etched with a cupric chloride aqueous-solution to form wiring patterns 72 and 74 on the front and rear sides, respectively, of the substrate.

The wiring patterns 72 and 74 were electrically connected to the wiring patterns 53 and 54 formed on the flexible substrate 52 via the plated through-holes 76. See FIG. 20(g).

(8) Further, a solder resist layer was formed, and then the outer surface of the substrate was processed by a rooter to provide the flex-rigid printed wiring board 300B having the extended patterns 56 and 57 around the bending portion 55 on either side of the substrate.

Example 130

There was manufactured a flex-rigid printed wiring board 300B similar to the example 129 except that each of the wiring patterns at the bending portion has a part thereof formed into an extended pattern swollen to one side thereof for the line width thereof to be a maximum of 1.05 times larger than the rest thereof, namely, other than the swollen portion (100×1.05=105 μm).

Note that the distance (d) between the centers of the three adjacent extended patterns was within a range of 4 times (285 μm) of the width of the wiring patterns.

Working Pattern 131:

There was manufactured a flex-rigid printed wiring board 300B similar to the example 129 except that each of the wiring patterns 53 and 54 at the bending portion had a part thereof formed into an extended pattern 56 (57) swollen to one side thereof for the line width thereof to be a maximum of 2.0 times larger than the rest thereof, namely, other than the swollen portion (100×2.0=200 μm).

Note that the distance (d) between the centers of the three adjacent extended patterns was within a range of 4 times (375 μm) of the width of the wiring patterns.

Example 132

There was manufactured a flex-rigid printed wiring board 300B similar to the example 129 except that each of the wiring patterns at the bending portion was formed into extended patterns swollen to both sides thereof, as shown in FIG. 9(c), for the line width to be a maximum of 1.5 times larger than the rest thereof, namely, other than the swollen portion (100×1.5=150 μm).

Note that the distance (d) between the centers of the three adjacent extended patterns was within a range of 4 to 6 times (475 μm) of the width of the wiring patterns.

Example 133

There was manufactured a flex-rigid printed wiring board 300B similar to the example 129 except that each of the wiring patterns at the bending portion was formed into extended patterns swollen to both sides thereof, as shown in FIG. 9(c), for the line width to be a maximum of 1.05 times larger than the rest thereof, namely, other than the swollen portion (100×1.05=105 μm).

Note that the distance (d) between the centers of the three adjacent extended patterns was within a range of 4 times (385 μm) of the width of the wiring patterns.

Example 134

There was manufactured a flex-rigid printed wiring board 300B similar to the example 129 except that each of the wiring patterns at the bending portion was formed into extended patterns swollen to both sides thereof, as shown in FIG. 9(c), for the line width to be a maximum of 2.0 times larger than the rest thereof, namely, other than the swollen portion (100×2.0=200 μm).

Note that the distance (d) between the centers of the three adjacent extended patterns was within a range of 4 to 6 times (575 μm) of the width of the wiring patterns.

Example 135

There was manufactured a flex-rigid printed wiring board 300B similar to the example 129 except that each of outer ones of the three wiring patterns at the bending portion had a part thereof formed into an extended pattern swollen to one side thereof, as shown in FIG. 9(d), for the line width thereof to be a maximum of 1.5 times larger than the rest thereof, namely, other than the swollen portion (100×1.5=150 μm) and the central one of the wiring patterns had a part thereof formed into an extended pattern swollen to both sides thereof for the line width thereof to be a maximum of 1.5 times larger than the rest thereof, namely, other than the swollen portion (100×1.5=150 μm).

Note that the distance (d) between the centers of the three adjacent extended patterns was within a range of 4 times (385 μm) of the width of the wiring patterns.

Example 136

There was manufactured a flex-rigid printed wiring board 300B similar to the example 129 except that each of outer ones of the three wiring patterns at the bending portion had a part thereof formed into an extended pattern swollen to one side thereof, as shown in FIG. 9(d), for the line width thereof to be a maximum of 1.05 times larger than the rest thereof, namely, other than the swollen portion (100×1.05=105 μm) and the central one of the wiring patterns had a part thereof formed into an extended pattern swollen to both sides thereof for the line width thereof to be a maximum of 1.05 times larger than the rest thereof, namely, other than the swollen portion (100×1.05=105 μm).

Example 137

There was manufactured a flex-rigid printed wiring board 300B similar to the example 129 except that each of outer ones of the three wiring patterns at the bending portion had a part thereof formed into an extended pattern swollen to one side thereof, as shown in FIG. 9(d), for the line width thereof to be a maximum of 2.0 times larger than the rest thereof, namely, other than the swollen portion (100×2.0=200 μm) and the central one of the wiring patterns had a part thereof formed into an extended pattern swollen to both sides thereof for the line width thereof to be a maximum of 2.0 times larger than the rest thereof, namely, other than the swollen portion (100×2.0=200 μm).

Note that the distance (d) between the centers of the three adjacent extended patterns was within a range of 4 times (390 μm) of the width of the wiring patterns.

Reference Example 26

There was manufactured a flex-rigid printed wiring board 300B similar to the example 129 except that each of the wiring patterns at the bending portion was formed into an extended pattern swollen to both sides thereof, as shown in FIG. 9(c), for the line width to be a maximum of 2.5 times larger than the rest thereof, namely, other than the swollen portion (100×2.5=250 μm).

Note that the distance (d) between the centers of the three adjacent extended patterns was within a range of 6 times (675 μm) of the width of the wiring patterns.

Reference Example 27

There was manufactured a flex-rigid printed wiring board 300B similar to the example 129 except that each of the wiring patterns at the bending portion was formed into an extended pattern swollen to both sides thereof, as shown in FIG. 9(c), for the line width to be a maximum of 3.0 times larger than the rest thereof, namely, other than the swollen portion (100×3.0=300 μm).

Note that the distance (d) between the centers of the three adjacent extended patterns was within a range of 6 times (775 μm) of the width of the wiring patterns.

Example 138

There was manufactured a flex-rigid printed wiring board 300B similar to the example 129 except that the wiring patterns at the bending portion were formed into patterns curved in the width direction and equal in line width to the initial patterns, the curved pattern being a part of a circle whose radius R is 2 mm and the shortest distance X from the largest curve of the pattern to wiring patterns at the non-bending portion being equal to R.

Example 139

There was manufactured a flex-rigid printed wiring board 300B similar to the example 129 except that the wiring patterns at the bending portion were formed into patterns curved in the width direction and equal in line width to the initial patterns, the curved pattern being a part of a circle whose radius R is 2 mm and the shortest distance X from the largest curve of the pattern to wiring patterns at the non-bending portion being equal to R/2.

Example 140

There was manufactured a flex-rigid printed wiring board 300B similar to the example 129 except that the wiring patterns at the bending portion were formed into patterns curved in the width direction and equal in line width to the initial patterns, the curved pattern being a part of a circle whose radius R is 2 mm and the shortest distance X from the largest curve of the pattern to wiring patterns at the non-bending portion being equal to R/3.

Example 141

There was manufactured a flex-rigid printed wiring board 300B similar to the example 129 except that the wiring patterns at the bending portion were formed into patterns curved in the width direction and equal in line width to the initial patterns, the curved pattern being a part of a circle whose radius R is 5 mm and the shortest distance X from the largest curve of the pattern to wiring patterns at the non-bending portion being equal to R.

Example 142

There was manufactured a flex-rigid printed wiring board 300B similar to the example 129 except that the wiring patterns at the bending portion were formed into patterns curved in the width direction and equal in line width to the initial patterns, the curved pattern being a part of a circle whose radius R is 5 mm and the shortest distance X from the largest curve of the pattern to wiring patterns at the non-bending portion being equal to R/2.

Example 143

There was manufactured a flex-rigid printed wiring board 300B similar to the example 129 except that the wiring patterns at the bending portion were formed into patterns curved in the width direction and equal in line width to the initial patterns, the curved pattern being a part of a circle whose radius R is 5 mm and the shortest distance X from the largest curve of the pattern to wiring patterns at the non-bending portion being equal to R/3.

Example 144

There was manufactured a flex-rigid printed wiring board 300B similar to the example 129 except that the wiring patterns at the bending portion were formed into patterns curved in the width direction and equal in line width to the initial patterns, the curved pattern being a part of a circle whose radius R is 8 mm and the shortest distance X from the largest curve of the pattern to wiring patterns at the non-bending portion being equal to R.

Example 145

There was manufactured a flex-rigid printed wiring board 300B similar to the example 129 except that the wiring patterns at the bending portion were formed into patterns curved in the width direction and equal in line width to the initial patterns, the curved pattern being a part of a circle whose

Example 146

There was manufactured a flex-rigid printed wiring board 300B similar to the example 129 except that the wiring patterns at the bending portion were formed into patterns curved in the width direction and equal in line width to the initial patterns, the curved pattern being a part of a circle whose radius R is 8 mm and the shortest distance X from the largest curve of the pattern to wiring patterns at the non-bending portion being equal to R/3.

Example 147

There was manufactured a flex-rigid printed wiring board 300B similar to the example 129 except that the wiring patterns at the bending portion were formed into patterns curved in the width direction and equal in line width to the initial patterns, the curved pattern being a part of a circle whose radius R is 10 mm and the shortest distance X from the largest curve of the pattern to wiring patterns at the non-bending portion being equal to R.

Example 148

There was manufactured a flex-rigid printed wiring board 300B similar to the example 129 except that the wiring patterns at the bending portion were formed into patterns curved in the width direction and equal in line width to the initial patterns, the curved pattern being a part of a circle whose radius R is 10 mm and the shortest distance X from the largest curve of the pattern to wiring patterns at the non-bending portion being equal to R/2.

Example 149

There was manufactured a flex-rigid printed wiring board 300B similar to the example 129 except that the wiring patterns at the bending portion were formed into patterns curved in the width direction and equal in line width to the initial patterns, the curved pattern being a part of a circle whose radius R is 10 mm and the shortest distance X from the largest curve of the pattern to wiring patterns at the non-bending portion being equal to R/3.

Example 150

There was manufactured a flex-rigid printed wiring board 300B similar to the example 129 except that the wiring patterns at the bending portion were formed into patterns curved in the width direction and whose line width at the curved portion was 1.5 times larger than that of the rest thereof, namely, other than the curved portion, the curved pattern being a part of a circle whose radius R is 2 mm and the shortest distance X from the largest curve of the pattern to wiring patterns at the non-bending portion being equal to R/2.

Example 151

There was manufactured a flex-rigid printed wiring board 300B similar to the example 129 except that the wiring patterns at the bending portion were formed into patterns curved in the width direction and whose line width at the curved portion was 1.5 times larger than that of the rest thereof, namely, other than the curved portion, the curved pattern being a part of a circle whose radius R is 5 mm and the shortest distance X from the largest curve of the pattern to wiring patterns at the non-bending portion being equal to R/2.

Example 152

There was manufactured a flex-rigid printed wiring board 300B similar to the example 129 except that the wiring patterns at the bending portion were formed into patterns curved in the width direction and whose line width at the curved portion was 1.5 times larger than that of the rest thereof, namely, other than the curved portion, the curved pattern being a part of a circle whose radius R is 8 mm and the shortest distance X from the largest curve of the pattern to wiring patterns at the non-bending portion being equal to R/2.

Example 153

There was manufactured a flex-rigid printed wiring board 300B similar to the example 129 except that the wiring patterns at the bending portion were formed into patterns curved in the width direction and whose line width at the curved portion was 1.5 times larger than that of the rest thereof, namely, other than the curved portion, the curved pattern being a part of a circle whose radius R is 10 mm and the shortest distance X from the largest curve of the pattern to wiring patterns at the non-bending portion being equal to R/2.

Example 154

There was manufactured a flex-rigid printed wiring board 300B similar to the example 129 except that the wiring patterns at the bending portion were formed into patterns curved in the width direction and whose line width at the curved portion was 2.0 times larger than that of the rest thereof, namely, other than the curved portion, the curved pattern being a part of a circle whose radius R is 5 mm and the shortest distance X from the largest curve of the pattern to wiring patterns at the non-bending portion being equal to R/2.

Example 155

There was manufactured a flex-rigid printed wiring board 300B similar to the example 129 except that the wiring patterns at the bending portion were formed into patterns curved in the width direction and whose line width at the curved portion was 2.0 times larger than that of the rest thereof, namely, other than the curved portion, the curved pattern being a part of a circle whose radius R is 8 mm and the shortest distance X from the largest curve of the pattern to wiring patterns at the non-bending portion being equal to R/2.

Example 156

There was manufactured a flex-rigid printed wiring board 300B similar to the example 129 except that the wiring patterns at the bending portion were formed into patterns curved in the width direction and whose line width at the curved portion was 2.0 times larger than that of the rest thereof, namely, other than the curved portion, the curved pattern being a part of a circle whose radius R is 10 mm and the shortest distance X from the largest curve of the pattern to wiring patterns at the non-bending portion being equal to R/2.

Reference Example 28

There was manufactured a flex-rigid printed wiring board 300B similar to the example 129 except that the wiring patterns at the bending portion were formed into patterns curved in the width direction and whose line width at the curved portion was 2.5 times larger than that of the rest thereof, namely, other than the curved portion, the curved pattern being a part of a circle whose radius R is 5 mm and the shortest distance X from the largest curve of the pattern to wiring patterns at the non-bending portion being equal to R/2.

Example 29

There was manufactured a flex-rigid printed wiring board 300B similar to the example 129 except that the wiring patterns at the bending portion were formed into patterns curved in the width direction and whose line width at the curved portion was 2.5 times larger than that of the rest thereof, namely, other than the curved portion, the curved pattern being a part of a circle whose radius R is 8 mm and the shortest distance X from the largest curve of the pattern to wiring patterns at the non-bending portion being equal to R/2.

Reference Example 30

There was manufactured a flex-rigid printed wiring board 300B similar to the example 129 except that the wiring patterns at the bending portion were formed into patterns curved in the width direction and whose line width at the curved portion was 2.5 times larger than that of the rest thereof, namely, other than the curved portion, the curved pattern being a part of a circle whose radius R is 10 mm and the shortest distance X from the largest curve of the pattern to wiring patterns at the non-bending portion being equal to R/2.

Reference Example 31

There was manufactured a flex-rigid printed wiring board 300B similar to the example 129 except that the wiring patterns at the bending portion were formed into patterns curved in the width direction and equal in line width to the initial wiring patterns, the curved pattern being a part of a circle whose radius R is 1.5 mm and the shortest distance X from the largest curve of the pattern to wiring patterns at the non-bending portion being equal to R/2.

Reference Example 32

There was manufactured a flex-rigid printed wiring board 300B similar to the example 129 except that the wiring patterns at the bending portion were formed into patterns curved in the width direction and equal in line width to the initial wiring patterns, the curved pattern being a part of a circle whose radius R is 12 mm and the shortest distance X from the largest curve of the pattern to wiring patterns at the non-bending portion being equal to R/2.

Reference Example 33

There was manufactured a flex-rigid printed wiring board 300B similar to the example 129 except that the wiring patterns at the bending portion were formed into patterns curved in the width direction and equal in line width to the initial patterns, the curved pattern being a part of a circle whose radius R is 1.5 mm and the shortest distance X from the largest curve of the pattern to wiring patterns at the non-bending portion being equal to R/4.

Reference Example 34

There was manufactured a flex-rigid printed wiring board 300B similar to the example 129 except that the wiring pat-
terns at the bending portion were formed into patterns curved in the width direction and equal in line width to the initial patterns, the curved pattern being a part of a circle whose radius R is 12 mm and the shortest distance X from the largest curve of the pattern to wiring patterns at the non-bending portion being equal to R/4.

Example 157

There was manufactured a flex-rigid printed wiring board 300B similar to the example 129 except that as a starting material for a flexible substrate, there was used a 50 µm-thick double-sided copper-clad laminate formed by hot-pressing of an 18 µm-thick copper foil 12 on either side of an insulative base material 11 formed by drying a 20 µm-thick glass cloth (whose glass fibers had a mean thickness of 4.0 µm) impregnated with epoxy resin to cure the epoxy resin.

Example 158

There was manufactured a flex-rigid printed wiring board 300B similar to the example 132 except that as a starting material for a flexible substrate, there was used a 50 µm-thick double-sided copper-clad laminate formed by hot-pressing of an 18 µm-thick copper foil 12 on either side of an insulative base material 11 formed by drying a 30 µm-thick glass cloth (whose glass fibers had a mean thickness of 4.0 µm) impregnated with epoxy resin to cure the epoxy resin.

Example 159

There was manufactured a flex-rigid printed wiring board 300B similar to the example 135 except that as a starting material for a flexible substrate, there was used a 100 µm-thick double-sided copper-clad laminate formed by hot-pressing of an 18 µm-thick copper foil 12 on either side of an insulative base material 11 formed by drying a 60 µm-thick glass cloth (whose glass fibers had a mean thickness of 4.0 µm) impregnated with epoxy resin to cure the epoxy resin.

Example 160

There was manufactured a flex-rigid printed wiring board 300B similar to the example 139 except that as a starting material for a flexible substrate, there was used a 50 µm-thick double-sided copper-clad laminate formed by hot-pressing of an 18 µm-thick copper foil 12 on either side of an insulative base material 11 formed by drying a 20 µm-thick glass cloth (whose glass fibers had a mean thickness of 5.0 µm) impregnated with epoxy resin to cure the epoxy resin.

Example 161

There was manufactured a flex-rigid printed wiring board 300B similar to the example 142 except that as a starting material for a flexible substrate, there was used a 50 µm-thick double-sided copper-clad laminate formed by hot-pressing of an 18 µm-thick copper foil 12 on one side of an insulative base material 11 formed by drying a 30 µm-thick glass cloth (whose glass fibers had a mean thickness of 5.0 µm) impregnated with epoxy resin to cure the epoxy resin.

Example 162

There was manufactured a flex-rigid printed wiring board 300B similar to the example 145 except that as a starting material for a flexible substrate, there was used a 100 µm- thick double-sided copper-clad laminate formed by hot-pressing of an 18 μm-thick copper foil 12 on either side of an insulative base material 11 formed by drying a 60 μm-thick glass cloth (whose glass fibers had a mean thickness of 5.0 μm) impregnated with epoxy resin to cure the epoxy resin.

Example 163

There was manufactured a flex-rigid printed wiring board 300B similar to the example 129 except that as a starting material for a flexible substrate, there was used a 50 μm-thick double-sided copper-clad laminate formed by hot-pressing of an 18 μm-thick copper foil 12 on either side of an insulative base material 11 formed by drying a 20 μm-thick glass cloth (whose glass fibers had a mean thickness of 1.5 μm) impregnated with epoxy resin to cure the epoxy resin.

Example 164

There was manufactured a flex-rigid printed wiring board 300B similar to the example 132 except that as a starting material for a flexible substrate, there was used a 50 μm-thick double-sided copper-clad laminate formed by hot-pressing of an 18 μm-thick copper foil 12 on either side of an insulative base material 11 formed by drying a 30 μm-thick glass cloth (whose glass fibers had a mean thickness of 1.5 μm) impregnated with epoxy resin to cure the epoxy resin.

Example 165

There was manufactured a flex-rigid printed wiring board 300B similar to the example 135 except that as a starting material for a flexible substrate, there was used a 100 μm-thick double-sided copper-clad laminate formed by hot-pressing of an 18 μm-thick copper foil 12 on either side of an insulative base material 11 formed by drying a 60 μm-thick glass cloth (whose glass fibers had a mean thickness of 1.5 μm) impregnated with epoxy resin to cure the epoxy resin.

Example 166

There was manufactured a flex-rigid printed wiring board 300B similar to the example 139 except that as a starting material for a flexible substrate, there was used a 50 μm-thick double-sided copper-clad laminate formed by hot-pressing of an 18 μm-thick copper foil 12 on either side of an insulative base material 11 formed by drying a 20 μm-thick glass cloth (whose glass fibers had a mean thickness of 7.0 μm) impregnated with epoxy resin to cure the epoxy resin.

Example 167

There was manufactured a flex-rigid printed wiring board 300B similar to the example 145 except that as a starting material for a flexible substrate, there was used a 50 μm-thick double-sided copper-clad laminate formed by hot-pressing of an 18 μm-thick copper foil 12 on either side of an insulative base material 11 formed by drying a 30 μm-thick glass cloth (whose glass fibers had a mean thickness of 7.0 μm) impregnated with epoxy resin to cure the epoxy resin.

Example 168

There was manufactured a flex-rigid printed wiring board 300B similar to the example 108 except that as a starting material for a flexible substrate, there was used a 100 μm-thick double-sided copper-clad laminate formed by hot-pressing of an 18 μm-thick copper foil 12 on either side of an insulative base material 11 formed by drying a 60 μm-thick glass cloth (whose glass fibers had a mean thickness of 7.0 μm) impregnated with epoxy resin to cure the epoxy resin.

Reference Example 35

There was manufactured a flex-rigid printed wiring board 300B similar to the example 129 except that as a starting material for a flexible substrate, there was used a 50 μm-thick double-sided copper-clad laminate formed by hot-pressing of an 18 μm-thick copper foil 12 on either side of an insulative base material 11 formed by drying a 15 μm-thick glass cloth (whose glass fibers had a mean thickness of 4.0 μm) impregnated with epoxy resin to cure the epoxy resin.

Reference Example 36

There was manufactured a flex-rigid printed wiring board 300B similar to the example 132 except that as a starting material for a flexible substrate, there was used a 150 μm-thick double-sided copper-clad laminate formed by hot-pressing of an 18 μm-thick copper foil 12 on either side of an insulative base material 11 formed by drying a 100 μm-thick glass cloth (whose glass fibers had a mean thickness of 4.0 μm) impregnated with epoxy resin to cure the epoxy resin.

Reference Example 37

There was manufactured a flex-rigid printed wiring board 300B similar to the example 135 except that as a starting material for a flexible substrate, there was used a 50 μm-thick double-sided copper-clad laminate formed by hot-pressing of an 18 μm-thick copper foil 12 on either side of an insulative base material 11 formed by drying a 15 μm-thick glass cloth (whose glass fibers had a mean thickness of 7.0 μm) impregnated with epoxy resin to cure the epoxy resin.

Reference Example 38

There was manufactured a flex-rigid printed wiring board 300B similar to the example 139 except that as a starting material for a flexible substrate, there was used a 150 μm-thick double-sided copper-clad laminate formed by hot-pressing of an 18 μm-thick copper foil 12 on either side of an insulative base material 11 formed by drying a 100 μm-thick glass cloth (whose glass fibers had a mean thickness of 7.0 μm) impregnated with epoxy resin to cure the epoxy resin.

The examples 1 to 44, reference examples 1 to 6 and comparative example 1 in which the flexible and rigid substrates are electrically connected to each other via the conductor lumps, and the examples 45 to 88, reference examples 7 to 12 and comparative example 2 in which the flexible and rigid substrates are electrically connected to each other via the conductor lumps, were subjected to (1) a continuity test and (2) reliability evaluation test, which will be described below.

Further, the examples 89 to 128, reference examples 13 to 26 and comparative examples 3 and 4 in which the flexible and rigid substrates are electrically connected to each other via the conductor lumps, and the examples 129 to 168 and reference examples 26 to 38 in which the flexible and rigid substrates are electrically connected to each other via the conductor lumps, were subjected to (1) a continuity test, (2) reliability evaluation test and (3) measurement of radius of curvature (mm) at the bending portion in each of the examples, which will be described below.

(1) Continuity Test

The flexible substrate was bent three times repeatedly, and the wiring patterns of the conductor circuit on the flexible substrate were checked to see whether they kept the electrical continuity. The results of this continuity test are shown in Tables 1 to 6 and Tables 7 to 12.

Note that in these Tables, "○" (good) indicates that the electrical continuity was found after three times of bending and "X" (poor) indicates that no electrical continuity was found after three times of bending.

(2) Reliability (Bending Resistance) Evaluation Test

For evaluation of the reliability, MIT test was adopted which is in compliance with the Japanese Industrial Standard (JIS) C 5016. In this test, the flexible substrate was bent repeatedly and the number of times of bending until the wiring patterns of the conductor circuit on the flexible substrate were broken. The results of this reliability evaluation test are shown in Tables 1 to 6 and Tables 7 to 12.

Note that in the Tables, the small double circle "⊚" (very good) indicates that 50 or more times of bending was counted before the wiring patterns were broken, small circle "○" (good) indicates that 30 or more times of bending was counted before the wiring patterns were broken, small triangle "Δ" (average) indicates that 29 or less times of bending was counted before the wiring patterns were broken, and crisscross "X" (poor) indicates 15 or less times of bending was counted before the wiring patterns were broken.

TABLE 1

| Example | Sectional shape of opening | Area of opening (μm²) | Total area of all openings/Area of pattern other than openings | Radius of curvature (mm) | Continuity test result | Reliability test result |
|---|---|---|---|---|---|---|
| Working 1 | Rectangular | 10000 | 10/10 | 0.25 | ○ | ○ |
| Working 2 | | 40000 | 9/10 | | | |
| Working 3 | | 90000 | 11/10 | | | |
| Working 4 | | | 1/9 | | | |
| Working 5 | | | 2/8 | | | |
| Working 6 | | | 8/2 | | | |
| Working 7 | | | 9/1 | | | |
| Working 8 | Circular | 7850 | 10/10 | | | |
| Working 9 | | 49087 | 9/10 | | | |
| Working 10 | | 125600 | 11/10 | | | ⊚ |
| Working 11 | | | 1/9 | | | ○ |
| Working 12 | | | 2/8 | | | |
| Working 13 | | | 8/2 | | | |
| Working 14 | | | 9/1 | | | |
| Working 15 | Rectangular | 10025 | 10/10 | | | |
| Working 16 | with rounded | 40090 | 9/10 | | | |
| Working 17 | corners | 90123 | 11/10 | | | |
| Working 18 | | | 1/9 | | | |
| Working 19 | | | 2/8 | | | |
| Working 20 | | | 8/2 | | | |
| Working 21 | | | 9/1 | | | |
| Working 22 | Circular, | 49087 | 10/10 | | | |
| Working 23 | staggered | | 1/9 | | | |
| Working 24 | | | 9/1 | | | |
| Working 25 | Combination | 49087 | 10/10 | | | ⊚ |
| Working 26 | of different | 10000 | 1/9 | | | ○ |
| Working 27 | circles | | 9/1 | | | |
| Working 28 | Solid pattern | — | — | | | Δ |
| Comparative 1 | No dummy pattern | — | — | 0.05 | X | X |

TABLE 2

| Example | Sectional shape of pattern | Bottom angle (deg.) | Line width (μm) | Distance between lines (μm) | Radius of curvature (mm) | Continuity test result | Reliability test result |
|---|---|---|---|---|---|---|---|
| Working 29 | Rectangular | 90 | 150 | 30 | 0.10 | ○ | Δ |
| Working 30 | | | 200 | 50 | 0.20 | | ⊚ |
| Working 31 | | | 250 | 60 | 0.15 | | ○ |
| Working 32 | Trapezoidal | 75 | 150 | 30 | 0.20 | | ⊚ |
| Working 33 | | 60 | 200 | 50 | | | ○ |
| Working 34 | | 45 | 250 | 60 | | | |
| Reference 1 | Rectangular | 90 | 140 | 20 | 0.10 | | X |
| Reference 2 | Trapezoidal | 75 | | | | | Δ |

TABLE 3

| Example | Sectional shape of pattern | Glass cloth thickness/Fiber thickness (μm) | Base material thickness (μm) | Radius of curvature (mm) | Continuity test result | Reliability test result |
|---|---|---|---|---|---|---|
| Working 35 | Rectangular | 20/1.5 | 50 | 0.10 | ○ | ○ |
| Working 36 | | 20/3.0 | | | | |
| Working 37 | | 20/4.0 | | | | ◎ |
| Working 38 | | 30/5.0 | 60 | | | |
| Working 39 | | 60/5/0 | 100 | | | ○ |
| Working 40 | Trapezoidal | 20/1.5 | 50 | | | |
| Working 41 | (bottom angle | 20/3.0 | | | | |
| Working 42 | of 70 deg.) | 20/4.0 | | | | ◎ |
| Working 43 | | 30/5.0 | 60 | | | |
| Working 44 | | 50/5.0 | 100 | | | ○ |
| Reference 3 | Rectangular | 15/4.0 | 50 | | | |
| Reference 4 | | 100/7.0 | 150 | 0.20 | X | X |
| Reference 5 | Trapezoidal | 15/4.0 | 50 | 0.10 | ○ | ○ |
| Reference 6 | (bottom angle of 70 deg.) | 100/7.0 | 150 | 0.20 | X | X |

TABLE 4

| Example | Sectional shape of opening | Area of opening (μm²) | Total area of all openings/Area of pattern other than openings | Radius of curvature (mm) | Continuity test result | Reliability test result |
|---|---|---|---|---|---|---|
| Working 45 | Rectangular | 10000 | 10/10 | 0.25 | ○ | ○ |
| Working 46 | | 40000 | 9/10 | | | |
| Working 47 | | 90000 | 11/10 | | | |
| Working 48 | | | 1/9 | | | |
| Working 49 | | | 2/8 | | | |
| Working 50 | | | 8/2 | | | |
| Working 51 | | | 9/1 | | | |
| Working 52 | Circular | 7850 | 10/10 | | | |
| Working 53 | | 49087 | 9/10 | | | |
| Working 54 | | 125600 | 11/10 | | | ◎ |
| Working 55 | | | 1/9 | | | ○ |
| Working 56 | | | 2/8 | | | |
| Working 57 | | | 8/2 | | | |
| Working 58 | | | 9/1 | | | |
| Working 59 | Rectangular | 10025 | 10/10 | | | |
| Working 60 | with rounded | 40090 | 9/10 | | | |
| Working 61 | corners | 90123 | 11/10 | | | |
| Working 62 | | | 1/9 | | | |
| Working 63 | | | 2/8 | | | |
| Working 64 | | | 8/2 | | | |
| Working 65 | | | 9/1 | | | |
| Working 66 | Circular, | 49087 | 10/10 | | | |
| Working 67 | staggered | | 1/9 | | | |
| Working 68 | | | 9/1 | | | |
| Working 69 | Combination | 49087 | 10/10 | | | ◎ |
| Working 70 | of different | 10000 | 1/9 | | | ○ |
| Working 71 | circles | | 9/1 | | | |
| Working 72 | Solid pattern | — | — | | | Δ |
| Comparative 2 | No dummy pattern | — | — | 0.05 | X | X |

TABLE 5

| Example | Sectional shape of pattern | Bottom angle (deg.) | Line width (μm) | Distance between lines (μm) | Radius of curvature (mm) | Continuity test result | Reliability test result |
|---|---|---|---|---|---|---|---|
| Working 73 | Rectangular | 90 | 150 | 30 | 0.10 | ○ | Δ |
| Working 74 | | | 200 | 50 | 0.20 | | ◎ |
| Working 75 | | | 250 | 60 | 0.15 | | ○ |
| Working 76 | Trapezoidal | 70 | 150 | 30 | | | ◎ |
| Working 77 | | 60 | 200 | 50 | 0.20 | | ○ |
| Working 78 | | 45 | 250 | 60 | | | |
| Reference 7 | Rectangular | 90 | 140 | 20 | 0.10 | | X |
| Reference 8 | Trapezoidal | 70 | | | | | Δ |

TABLE 6

| Example | Sectional shape of pattern | Glass cloth thickness/Fiber thickness (μm) | Base material thickness (μm) | Radius of curvature (mm) | Continuity test result | Reliability test result |
| --- | --- | --- | --- | --- | --- | --- |
| Working 79 | Rectangular | 20/1.5 | 50 | 0/10 | ○ | ○ |
| Working 80 | | 20/3.0 | | | | |
| Working 81 | | 20/4.0 | | | | ◎ |
| Working 82 | | 30/5.0 | 60 | | | |
| Working 83 | | 60/5.0 | 100 | | | ○ |
| Working 84 | Trapezoidal | 20/1.5 | 50 | | | |
| Working 85 | (bottom angle | 20/3.0 | | | | |
| Working 86 | of 70 deg.) | 20/4.0 | | | | ◎ |
| Working 87 | | 30/5.0 | 60 | | | |
| Working 88 | | 50/5.0 | 100 | | | ○ |
| Reference 9 | Rectangular | 15/4.0 | 50 | | | |
| Reference 10 | | 100/7.0 | 150 | 0.20 | X | X |
| Reference 11 | Trapezoidal | 15/4.0 | 50 | 0.10 | ○ | ○ |
| Reference 12 | (bottom angle of 70 deg.) | 100/7.0 | 150 | 0.20 | X | X |

TABLE 7

| Example | Line width | Extended to: | Extended pattern width/Line width (d) | Wiring density at bending portion (mm) | Radius of bending (radius of curvature) (mm) | Continuity test result | Reliability test result |
| --- | --- | --- | --- | --- | --- | --- | --- |
| Working 89 | Wide | One side | 1.50 | ○ | 0.050 | ○ | ○ |
| Working 90 | | | 1.05 | | | | Δ |
| Working 91 | | | 2.00 | | | | ◎ |
| Working 92 | | Both sides | 1.50 | Δ | | | |
| Working 93 | | | 1.05 | ○ | | | ○ |
| Working 94 | | | 2.00 | Δ | | | ◎ |
| Working 95 | | One side/both sides | 1.50 | ○ | | | |
| Working 96 | | | 1.05 | | | | ○ |
| Working 97 | | | 2.00 | | | | ◎ |
| Reference 13 | | Both sides | 2.50 | X | 0.53 | | |
| Reference 14 | | | 3.00 | | 0.050 | | |
| Comparative 3 | | Not extended | 1.00 | ○ | 0.060 | | X |
| Comparative 4 | | Reduced | 0.50 | | 0.067 | | |

TABLE 8

| Example | Shape of pattern line | Radius of curvature of curved pattern (mm) | Swelling of curved pattern X (mm) | Curved pattern width/Wiring width | Radius of bending (radius of curvature) (mm) | Continuity test result | Reliability test result |
| --- | --- | --- | --- | --- | --- | --- | --- |
| Working 98 | Curved | 2 | R | 1.0 | 0.050 | ○ | ○ |
| Working 99 | | | R/2 | | | | Δ |
| Working 100 | | | R/3 | | | | |
| Working 101 | | 5 | R | | | | ◎ |
| Working 102 | | | R/2 | | | | |
| Working 103 | | | R/3 | | | | ○ |
| Working 104 | | 8 | R | | | | ◎ |
| Working 105 | | | R/2 | | | | |
| Working 106 | | | R/3 | | | | |
| Working 107 | | 10 | R | | | | |
| Working 108 | | | R/2 | | | | |
| Working 109 | | | R/3 | | | | |
| Working 110 | | 2 | R/2 | 1.5 | | | ○ |
| Working 111 | | 5 | | | | | ◎ |
| Working 112 | | 8 | | | | | |
| Working 113 | | 10 | | | | | |
| Working 114 | | 5 | | 2.0 | | | |
| Working 115 | | 8 | | | | | |
| Working 116 | | 10 | | | | | |
| Reference 15 | | 5 | | 2.5 | 0.053 | | ○ |
| Reference 16 | | 8 | | | 0.052 | | |
| Reference 17 | | 10 | | | 0.053 | | |

TABLE 8-continued

| Example | Shape of pattern line | Radius of curvature of curved pattern (mm) | Swelling of curved pattern X (mm) | Curved pattern width/Wiring width | Radius of bending (radius of curvature) (mm) | Continuity test result | Reliability test result |
|---|---|---|---|---|---|---|---|
| Reference 18 | | 1.5 | | 1.0 | | | Δ |
| Reference 19 | | 12 | | | 0.052 | | ○ |
| Reference 20 | | 1.5 | R/4 | | 0.053 | | |
| Reference 21 | | 12 | | | | | |

TABLE 9

| Example | Glass cloth thickness/Fiber thickness (μm) | Base material thickness (μm) | Radius of bending (radius of curvature) (mm) | Continuity test result | Reliability test result |
|---|---|---|---|---|---|
| Working 117 | 20/4 | 50 | 0.050 | ○ | ⊙ |
| Working 118 | 30/4 | | | | |
| Working 119 | 60/4 | 100 | | | ○ |
| Working 120 | 20/5 | 50 | | | ⊙ |
| Working 121 | 30/5 | | | | |
| Working 122 | 60/5 | 100 | | | ○ |
| Working 123 | 20/1.5 | 50 | | | |
| Working 124 | 30/1.5 | | | | |
| Working 125 | 60/1.5 | 100 | | | |
| Working 126 | 20/7 | 50 | | | |
| Working 127 | 30/7 | | | | |
| Working 128 | 60/7 | 100 | | | |
| Reference 22 | 15/4 | 50 | 0.052 | | Δ |
| Reference 23 | 100/4 | 150 | 0.051 | | Δ |
| Reference 24 | 15/7 | 50 | 0.052 | | ○ |
| Reference 25 | 100/7 | 150 | | | Δ |

TABLE 10

| Example | Line width | Extended to: | Extended pattern width/Line width | Wiring density at bending portion (d) | Radius of bending (radius of curvature) (mm) | Continuity test result | Reliability test result |
|---|---|---|---|---|---|---|---|
| Working 129 | Wide | One side | 1.50 | ○ | 0.050 | ○ | ○ |
| Working 130 | | | 1.05 | | | | Δ |
| Working 131 | | | 2.00 | | | | ⊙ |
| Working 132 | | Both sides | 1.50 | Δ | | | ○ |
| Working 133 | | | 1.05 | ○ | | | ○ |
| Working 134 | | | 2.00 | Δ | | | ⊙ |
| Working 135 | | One side/both sides | 1.50 | ○ | | | |
| Working 136 | | | 1.05 | | | | ○ |
| Working 137 | | | 2.00 | | | | ⊙ |
| Reference 26 | | Both sides | 2.50 | X | 0.053 | | |
| Reference 27 | | | 3.00 | | 0.055 | | |

TABLE 11

| Example | Shape of pattern line | Radius of curvature of curved pattern (mm) | Swelling of curved pattern X (mm) | Curved pattern wide/Wiring width | Radius of bending (radius of curvature) (mm) | Continuity test result | Reliability test result |
|---|---|---|---|---|---|---|---|
| Working 138 | Curved | 2 | R | 1.0 | 0.050 | ○ | ○ |
| Working 139 | | | R/2 | | | | Δ |
| Working 140 | | | R/3 | | | | |
| Working 141 | | 5 | R | | | | ⊙ |
| Working 142 | | | R/2 | | | | |
| Working 143 | | | R/3 | | | | ○ |
| Working 144 | | 8 | R | | | | ⊙ |
| Working 145 | | | R/2 | | | | |
| Working 146 | | | R/3 | | | | |

TABLE 11-continued

| Example | Shape of pattern line | Radius of curvature of curved pattern (mm) | Swelling of curved pattern X (mm) | Curved pattern wide/Wiring width | Radius of bending (radius of curvature) (mm) | Continuity test result | Reliability test result |
|---|---|---|---|---|---|---|---|
| Working 147 | | 10 | R | | | | |
| Working 148 | | | R/2 | | | | |
| Working 149 | | | R/3 | | | | |
| Working 150 | | 2 | R/2 | 1.5 | | | ○ |
| Working 151 | | 5 | | | | | ◉ |
| Working 152 | | 8 | | | | | |
| Working 153 | | 10 | | | | | |
| Working 154 | | 5 | | 2.0 | | | |
| Working 155 | | 8 | | | | | |
| Working 156 | | 10 | | | | | |
| Reference 28 | | 5 | | 2.5 | 0.052 | | ○ |
| Reference 29 | | 8 | | | | | |
| Reference 30 | | 10 | | | | | |
| Reference 31 | | 1.5 | | 1.0 | 0.053 | | Δ |
| Reference 32 | | 12 | | | 0.052 | | ○ |
| Reference 33 | | 1.5 | R/4 | | 0.053 | | |
| Reference 34 | | 12 | | | 0.054 | | |

TABLE 12

| Example | Glass cloth thickness/fiber thickness (μm) | Base material thickness (μm) | Radius of bending (radius of curvature) (mm) | Continuity test result | Reliability test result |
|---|---|---|---|---|---|
| Working 157 | 20/4 | 50 | 0.050 | ○ | ◉ |
| Working 158 | 30/4 | | | | |
| Working 159 | 60/4 | 100 | | | ○ |
| Working 160 | 20/5 | 50 | | | ◉ |
| Working 161 | 30/5 | | | | |
| Working 162 | 60/5 | 100 | | | ○ |
| Working 163 | 20/1.5 | 50 | | | |
| Working 164 | 30/1.5 | | | | |
| Working 165 | 60/1.5 | 100 | | | |
| Working 166 | 20/7 | 50 | | | |
| Working 167 | 30/7 | | | | |
| Working 168 | 60/7 | 100 | | | |
| Reference 35 | 15/4 | 50 | 0.052 | | |
| Reference 36 | 100/4 | 150 | 0.051 | | Δ |
| Reference 37 | 15/7 | 50 | | | ○ |
| Reference 38 | 100/7 | 150 | 0.052 | | Δ |

It is proved by the above test results that of the flex-rigid printed wiring boards as the examples 1 to 28 (or 45 to 72) having the conductor circuit formed one side of the flexible substrate and the lattice-shaped dummy pattern formed on the other side in vicinity of the bending portion, the dummy pattern of which the ratio between the sum of the areas of the openings formed therein and the area of the rest thereof is within a range of 1/9 to 9/1 is excellent in electrical connection and bendability (bending resistance), more specifically, the dummy pattern of which the ratio between the sum of the areas of the openings formed therein and the area of the rest thereof is 11/10, and dummy pattern formed from a plurality of combinations of large and small circles and of which the ratio between the sum of the areas of the openings formed therein and the area of the rest thereof is 10/10, are excellent.

Also, as proved by the results of the tests made on the examples 29 to 34 (or 73 to 78) and reference examples 1 and 2 (or 7 and 8), the linear dummy patterns of which the line width is within a range of 150 to 250 μm and pitch is more than 30 μm is excellent in electrical connection and bendability (bending resistance), and more specifically, the dummy pattern of which the line width is more than 200 μm and pitch is less than 100 μm is more excellent and the dummy pattern of which the line wide is 200 μm and pitch is 50 μm most excellent.

It was also proved that a linear dummy pattern whose section is trapezoidal in shape and in which the bottom angles are more than 45 deg. is excellent in electrical connection and bendability (bending resistance), and more specifically, the dummy pattern of which the bottom angle is 75 deg. is most excellent.

Further, as will be understood from the results of the tests made on the examples 35 to 44 (or 79 to 88) and reference examples 3 to 6 (or 9 to 12), the dummy pattern formed on the flexible substrate of which the insulative base material is less than 100 μm in thickness and glass cloth is less than 30 μm in thickness is excellent in electrically connection and bendability (bending resistance), and more specifically, the dummy pattern formed on the flexible substrate of which the insulative base material is 50 μm thick and glass cloth is 20 μm thick is most excellent.

Also, in the flex-rigid printed wiring boards as the examples 1 to 88 and as the reference examples 1 to 12, the bending of the flexible substrate at the bending portion is 0.1 to 0.25 mm (in radius of curvature). The comparative example 1 has no dummy pattern formed therein (the radius of curvature is 0.05 mm). Thus, of the above examples and reference examples, the flexible substrate can be bent rather more largely than that in the comparative example 1.

Further, as will be known from the results of the tests made on the examples 89 to 97 (or 129 to 137) and reference examples 13 and 14 (or 26 and 27), the flex-rigid printed wiring board in which the extended patterns of the conductor circuit on the flexible substrate are wider at the bending portion or curved in the width direction showed more excellent results of the continuity and reliability tests, and are more difficult to be broken and more excellent in bendability (bending resistance).

Also, it will also be known from the test results that since the radius of curvature is within a range of 0.050 to 0.055 mm, the degree of bending is large and constant.

Also, it was proved that a width of the extended patterns, within a range of a double of that of the wiring patterns at the non-bending portion, will have no influence on the wiring density and a width exceeding the double will reduce the wiring density since it assures no clearance between the extended patterns.

On the contrary, in the comparative example 3 in which the line width is not increased and the comparative example 4 in which the line width is increased, the radius of curvature is relatively large, such as 0.060 to 0.062 mm and the results of the continuity tests are good, but it was proved that the reliability (bending resistance) is low.

Also, the results of the tests made on the examples 98 to 116 (or 138 to 156) and reference examples 15 to 21 (or 28 to 34) revealed that with a larger degree of bending of the curved patterns (radius of curvature) and larger swelling of the curved patterns, the wiring patterns have a higher bending resistance so that they are not so easily broken.

Also, it will also be known from the test results that since the radius of curvature is within a range of 0.050 to 0.053 mm, the degree of bending is large and constant.

Further, the results of the tests made on the examples 117 to 128 (or 157 to 168) and reference examples 22 to 25 (or 35 to 38) show that with a smaller thickness of the glass cloth and smaller thickness of the base material, the wiring patterns have a higher bending resistance so that they are not so easily broken.

Also, it will also be known from the test results that since the radius of curvature is within a range of 0.050 to 0.052 mm, the degree of bending is large and constant.

INDUSTRIAL APPLICABILITY

As having been described in the foregoing, the flex-rigid printed wiring board according to the present invention can advantageously be used in portable electronic devices such as folding-type mobile phone.

Figure 2A:
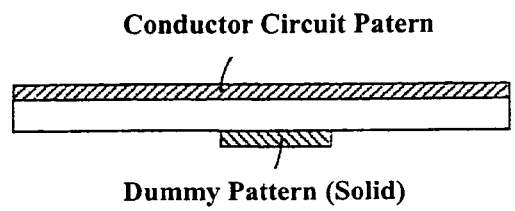
FIG. 2(a) schematically illustrates the disposition of the dummy pattern.
Figure 2B:
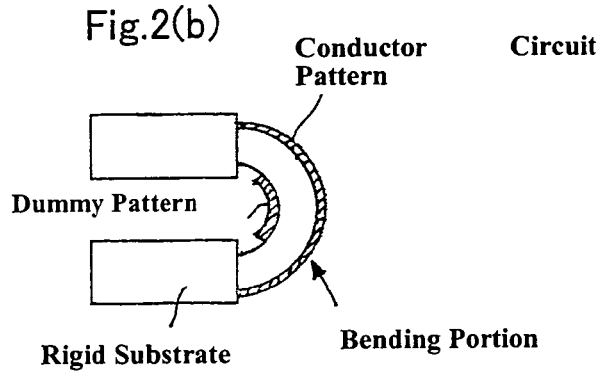
FIG. 2(b) schematically illustrates the flexible substrate being bent.

FIG. 1 to 22
FIG. 1
A Rigid substrate
B Flex-rigid printed wiring board
C Conductor-circuit pattern
D Rigid substrate
E Flexible substrate
F Bending portion
FIG. 2(a)
A Conductor-circuit pattern
B Dummy pattern (solid)
FIG. 2(b)
A Conductor-circuit pattern
B Dummy pattern
C Rigid substrate
D Bending portion
FIG. 4
A Rigid substrate
B Linear dummy pattern
C Rigid substrate
D Conductor-circuit pattern
E Flexible substrate
F Bending portion
FIG. 5(a)
A Conductor-circuit pattern
B Linear dummy pattern (rectangular in sectional shape)
FIG. 5(b)
A Conductor-circuit pattern
B Dummy pattern
C Rigid substrate
D Bending portion
FIG. 5(c)
A Conductor-circuit pattern
B Linear dummy pattern (trapezoidal in sectional shape)
FIG. 5(d)
A Conductor-circuit pattern
B Dummy pattern
C Rigid substrate
D Bending portion
FIG. 5(e)
A Pattern whose sectional shape is trapezoidal
B Bottom angle
FIG. 6
A Rigid substrate
B Flex-rigid printed wiring board
C Conductor-circuit pattern
D Rigid substrate
E Flexible substrate
F Curved/extended pattern
G Bending portion
FIG. 7
A Curved/extended pattern
B Rigid substrate
C Bending portion
FIG. 8
A Curved/extended pattern
B Curved/extending pattern
C Rigid substrate
D Bending portion
FIG. 21(a)
A Rigid substrate
B Flexible substrate
C Rigid substrate
D Electrical circuit
E Flexible substrate

The invention claimed is:
1. A flex-rigid printed wiring board comprising:
a plurality of rigid substrates each comprising an insulative base material and a conductor circuit provided on the insulative base material;
a flexible substrate configured to be bent and comprising an insulative base material, a conductor circuit provided on the insulative base material of the flexible substrate and a cover lay covering the conductor circuit of the flexible substrate; and
a conductor lump formed through the flexible substrate and the rigid substrates, the conductor lump being configured to provide electrical connection and connecting the flexible substrate to the rigid substrates such that the rigid and flexible substrates are lap-joined at interlayer connection portions of the rigid and flexible substrates via the conductor lump, wherein the insulative base material of the flexible substrate comprises a bendable base material comprising a glass cloth impregnated with a resin, the conductor circuit of the flexible substrate is formed on one side of the flexible substrate and connected to the conductor lump, the flexible substrate has a conductor pattern on the other side of the flexible substrate, the conductor pattern of the flexible substrate is not electrically connected to the conductor circuits of the rigid and flexible substrates, the conductor circuit of the flexible substrate has a plurality of wiring patterns formed at the bending portion, and each of the wiring patterns has a swelling portion or a curved portion formed with respect to a direction of a line width of the wiring patterns.

2. The flex-rigid printed wiring board according to claim 1, wherein the conductor pattern is a lattice-shaped pattern having at least one line of a plurality of openings formed therein.

3. The flex-rigid printed wiring board according to claim 2, wherein the ratio between the sum of the areas of the openings in the lattice-shaped pattern and the area of the rest of the lattice-shaped pattern is within a range of 1:9 to 9:1.

4. The flex-rigid printed wiring board according to claim 1, wherein the conductor pattern of the flexible substrate extends in a direction intersecting the wiring patterns of the conductor circuit on the flexible substrate.

5. The flex-rigid printed wiring board according to claim 4, wherein the conductor pattern extending in the direction is formed from at least three linear patterns disposed near the bending portion and of which the line width is 150 μm or more.

6. The flex-rigid printed wiring board according to claim 4 or 5, wherein the distance between the adjacent ones of the linear patterns defining the conductor pattern is 30 μm or more, and the thickness of the linear patterns are equal to, or larger than, the thickness of the conductor circuit of the flexible substrate.

7. The flex-rigid printed wiring board according to claim 4, wherein the conductor pattern has a trapezoidal sectional shape.

8. The flex-rigid printed wiring board according to claim 7, wherein the conductor pattern is formed from at least three linear patterns disposed near the bending portion and of which the line width is 150 μm or more.

9. The flex-rigid printed wiring board according to claim 8, wherein the distance between the adjacent ones of the linear patterns defining the conductor pattern is 30 μm or more, and the thickness of the linear patterns are equal to, or larger than, the thickness of the conductor circuit of the flexible substrate.

10. The flex-rigid printed wiring board according to any one of claims 7 to 9, wherein the conductor pattern has a trapezoidal sectional shape of which the bottom angles are within a range of 45 to 90 deg.

11. The flex-rigid printed wiring board according to claim 1, wherein the bendable base material is a sheet-like base material of less than 100 μm in thickness.

12. The flex-rigid printed wiring board according to claim 1, wherein the glass cloth of the bendable base material is 30 μm or less in thickness and comprises glass fibers having thicknesses in a range between 1.5 to 7.0 μm thick.

13. The flex-rigid printed wiring board according to claim 1, wherein the cover lay comprises one of a flexible adhesive-coated copper foil, a flexible solder resist layer and a prepreg comprising a glass cloth impregnated with epoxy resin to form a B stage.

14. The flex-rigid printed wiring board according to claim 1, wherein the side of the flexible substrate having the conductor pattern is an inner side when the flexible substrate is bent.

15. A flex-rigid printed wiring board comprising:
a plurality of rigid substrates;
a flexible substrate configured to be bent and having an insulative base material, a conductor circuit provided on the insulative base material and a cover lay covering the conductor circuit; and
a conductor lump formed through the flexible substrate and the rigid substrates, the conductor lump being configured to provide electrical connection and connecting the flexible substrate to the rigid substrates such that the rigid and flexible substrates are lap-joined at interlayer connection portions of the rigid and flexible substrates via the conductor lump,
wherein the insulative base material of the flexible substrate comprises a glass cloth impregnated with a resin, the conductor circuit has a plurality of wiring patterns formed on a bending portion of the flexible substrate, and each of the wiring patterns formed at the bending portion has a swelling portion formed with respect to a direction of a line width of the wiring patterns.

16. The flex-rigid printed wiring board according to claim 15, wherein the maximum width of the wiring patterns formed at the bending portion is larger than, and smaller than a double of, the maximum width of the wiring patterns formed at the non-bending portion.

17. The flex-rigid printed wiring board according to claim 15, wherein the wiring patterns at the bending portion are swollen to one side or both sides thereof in the direction of the line width.

18. The flex-rigid printed wiring board according to claim 15, wherein the glass cloth of the bendable base material is 30 μm or less in thickness and comprises glass fibers having thicknesses in a range between 1.5 to 7.0 μm thick.

19. A flex-rigid printed wiring board comprising:
a plurality of rigid substrates;
a flexible substrate configured to be bent and having an insulative base material, a conductor circuit provided on the insulative base material and a cover lay covering the conductor circuit; and
a conductor lump formed through the flexible substrate and the rigid substrates, the conductor lump being configured to provide electrical connection and connecting the flexible substrate to the rigid substrates such that the rigid and flexible substrates are lap-joined at interlayer connection portions of the rigid and flexible substrates via the conductor lump,
wherein the insulative base material of the flexible substrate comprises a glass cloth impregnated with a resin, the conductor circuit has a plurality of wiring patterns formed on a bending portion of the flexible substrate, and the wiring patterns have curved portions formed with respect to a direction of a line width of the wiring patterns.

20. The flex-rigid printed wiring board according to claim 19, wherein the line width of the wiring patterns formed at the bending portion is larger than, and smaller than a double of, the line width of the wiring patterns formed at the non-bending portion.

21. The flex-rigid printed wiring board according to claim 19 or 20, wherein the wiring patterns formed at the bending portion depicts a part of a circle whose radius R is 2 to 10 mm, and the shortest distance X from the largest curved portion of the patterns to the wiring patterns formed at the non-bending portion is $R/3 \leqq X \leqq R$.

22. The flex-rigid printed wiring board according to claim 19, wherein the bendable base material is a sheet-like base material of 100 μm or less in thickness.

23. The flex-rigid printed wiring board according to claim 19, wherein the cover lay comprises one of a flexible adhesive-coated copper foil, a flexible solder resist layer and a prepreg comprising a glass cloth impregnated with epoxy resin to form a B stage.

24. A manufacturing method for a flex-rigid printed wiring board, comprising:
providing a plurality of rigid substrates each comprising an insulative base material and a conductor circuit provided on the insulative base material;
providing a flexible substrate configured to be bent and comprising an insulative base material, a conductor circuit provided on one side of the insulative base material of the flexible substrate, a cover lay covering the conductor circuit of the flexible substrate, and a conductor pattern provided on the opposite side of the insulative base material of the flexible substrate, the insulative base material of the flexible substrate comprising a glass cloth impregnated with a resin, the conductor circuit of the flexible substrate having a plurality of wiring patterns formed on a bending portion of the flexible substrate, each of the wiring patterns having a swelling portion or a curved portion formed with respect to a direction of a line width of the wiring patterns, the conductor pattern of the flexible substrate being not electrically connected to the conductor circuits of the rigid and flexible substrates; and
forming a conductor lump through the flexible substrate and the rigid substrates to connect the flexible substrate to the rigid substrates such that the rigid and flexible substrates are lap-joined at interlayer connection portions of the rigid and flexible substrates via the conductor lump, the flexible substrate has a bending portion configured to be bent and the conductor lump provides electrical connection.

25. A manufacturing method for a flex-rigid printed wiring board, comprising:
providing a plurality of rigid substrates;
providing a bendably flexible substrate having an insulative base material, a conductor circuit provided on the insulative base material and a cover lay covering the conductor circuit, the insulative base material of the flexible substrate comprising a glass cloth impregnated with a resin, the conductor circuit having a plurality of wiring patterns formed on a bending portion of the flexible substrate, each of the wiring patterns having a swelling portion formed with respect to a direction of a line width of the wiring patterns; and
forming a conductor lump through the flexible substrate and the rigid substrates, the conductor lump to connect the flexible substrate to the rigid substrates such that the rigid and flexible substrates are lap-joined at interlayer connection portions of the rigid and flexible substrates via the conductor lump, the flexible substrate is configured to be bent at the bending portion and the conductor lump provides electrical connection.

26. A manufacturing method for a flex-rigid printed wiring board, comprising:
providing a plurality of rigid substrates;
providing a bendably flexible substrate having an insulative base material, a conductor circuit provided on the insulative base material and a cover lay covering the conductor circuit, the insulative base material of the flexible substrate comprising a glass cloth impregnated with a resin, the conductor circuit having a plurality of wiring patterns formed on a bending portion of the flexible substrate, each of the wiring patterns having a curved portion formed with respect to a direction of a line width of the wiring patterns; and
forming a conductor lump through the flexible substrate and the rigid substrates to connect the flexible substrate to the rigid substrates such that the rigid and flexible substrates are lap joined at interlayer connection portions of the rigid and flexible substrates via the conductor lump, the flexible substrate is configured to be bent at the bending portion and the conductor lump provides electrical connection.

* * * * *